US008195436B2

(12) United States Patent
Tolone et al.

(10) Patent No.: US 8,195,436 B2
(45) Date of Patent: *Jun. 5, 2012

(54) MULTI-INFRASTRUCTURE MODELING SYSTEM

(75) Inventors: William J Tolone, Concord, NC (US); Bei-tseng Chu, Charlotte, NC (US)

(73) Assignee: Intepoint, LLC, Cornelius, NC (US)

( * ) Notice: Subject to any disclaimer, the term of this patent is extended or adjusted under 35 U.S.C. 154(b) by 92 days.

This patent is subject to a terminal disclaimer.

(21) Appl. No.: 12/685,095

(22) Filed: Jan. 11, 2010

(65) Prior Publication Data

US 2010/0162156 A1 Jun. 24, 2010

Related U.S. Application Data

(63) Continuation of application No. 11/423,359, filed on Jun. 9, 2006, now Pat. No. 7,657,406.

(60) Provisional application No. 60/688,776, filed on Jun. 9, 2005.

(51) Int. Cl.
G06F 17/50 (2006.01)

(52) U.S. Cl. .................. 703/2; 703/22; 703/24; 706/45; 706/52; 707/104; 704/240

(58) Field of Classification Search .................. 703/2, 17, 703/22, 24; 704/240; 706/45, 52; 707/104
See application file for complete search history.

(56) References Cited

U.S. PATENT DOCUMENTS

| 6,427,132 B1 | 7/2002 | Bowman-Amuah |
| 6,611,867 B1 | 8/2003 | Bowman-Amuah |
| 7,657,406 B2 * | 2/2010 | Tolone et al. ..................... 703/2 |
| 7,921,068 B2 | 4/2011 | Guyon et al. |
| 2006/0167689 A1 | 7/2006 | Maren |
| 2007/0021955 A1 | 1/2007 | Tolone et al. |
| 2007/0198586 A1 | 8/2007 | Hardy et al. |
| 2007/0200851 A1 | 8/2007 | Said et al. |

OTHER PUBLICATIONS

Information Disclosure Statement (IDS) Letter Regarding Common Patent Application(s) dated Feb. 19, 2010.
Information Disclosure Statement (IDS) Letter Regarding Common Patent Application(s), dated Jul. 27, 2011.
NPL_Tolone, W., Xiang, W-N., Johnson, E., Applying Cougaar to Integrated Critical Infrastructure Modeling and Simulation, Proceedings of the 2004 Open Cougaar Conference, Jul. 20, 2004, 8 pages.
NPL_Flowerden, R., Green, M., Areal interpolation and types of data, Spatial Analysis and GIS, Fotheringham and Rogerson, 1994, Chapter 7, pp. 121-145, 13 pages.

(Continued)

Primary Examiner — Thai Phan
(74) Attorney, Agent, or Firm — Tillman Wright, PLLC; James D. Wright; Chad D. Tillman

(57) ABSTRACT

A system for simulating interdependencies between multiple critical physical infrastructure models, including a first infrastructure data model that models a first critical physical infrastructure, a second infrastructure data model that models a second critical physical infrastructure, wherein the second critical physical infrastructure is a different critical physical infrastructure from the first critical physical infrastructure, a simulation engine including a visualization application and adapted to automatically produce a change in the second infrastructure data model in response to a change in the first infrastructure data model, and a user interface permitting a user to interact with the simulation engine.

22 Claims, 26 Drawing Sheets

OTHER PUBLICATIONS

NPL__Tolone, W., Wilson, D., Raja, A., Xiang, W-N., Hao, H., Phelps, S., Johnson, E., Critical Infrastructure Integration Modeling and Simulation, Intelligence and Security Informatics, Lecture Notes in Computer Science, 2004, vol. 3073/2004, pp. 214-225, 6 pages.

NPL__Gronlund, A., Xiang, W-N., Sox, J., GIS, Expert System Technologies Improve Forest Fire Management Techniques, GIS World, Feb. 1994, vol. 7, No. 2, pp. 32-34, 5 pages.

NPL__Rinaldi, S., Peerenboom, J., Kelly, T., Identifying, Understanding, and Analyzing Critical Infrastructure Interdependencies, IEEE Control Systems Magazine, Dec. 2001, pp. 11-25, 15 pages.

NPL__Xiang, W-N, Knowledge-based decision support by CRITIC, Environment and Planning B: Planning and Design, 1997, vol. 24, pp. 69-79, 11 pages.

NPL__Burrough, P.A., Methods of Spatial Analysis in GIS, International Journal of Geographical Information Systems, 1990, vol. 4, Iss. 3, pp. 221-223, 3 pages.

NPL__Getis, A., Spatial dependence and heterogeneity and proximal databases, Spatial Analysis and GIS, Fotheringham and Rogerson, 1994, Chapter 6, pp. 105-119, 8 pages.

$NPL_{13}$ Anselin, L., Getis, A., Spatial statistical analysis and geographic information systems, The Annals of Regional Science, 1992, vol. 26, pp. 19-33, 15 pages.

NPL__Openshaw, S., Two exploratory space-time-attribute pattern analysers relevant to GIS, Spatial Analysis and GIS, Fotheringham and Rogerson, 1994, Chapter 5, pp. 83-103, 11 pages.

\* cited by examiner

MULTI-INFRASTRUCTURE MODELING SYSTEM

CROSS-REFERENCE TO RELATED APPLICATION

This application is a U.S. continuation patent application of, and claims priority under 35 U.S.C. §120 to, U.S. nonprovisional patent application Ser. No. 11/423,359, filed Jun. 9, 2006, which nonprovisional patent application published Jan. 25, 2007 as U.S. patent application publication no. 2007/0021955, which patent application and publication are incorporated by reference herein, and which patent application is a U.S. nonprovisional patent application of U.S. provisional patent application No. 60/688,776 filed Jun. 9, 2005, which is also incorporated by reference herein.

COPYRIGHT STATEMENT

All of the material in this patent document, including that of the figures, is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to infrastructure modeling and simulation, and, in particular, to the modeling and simulation of interdependencies between or among a plurality of infrastructures that may be of different types.

2. Background

As is well known, civilization as we know it today is built or reliant upon a wide variety of infrastructures. The infrastructures of which we are most widely aware are civilization's physical infrastructures, such as electrical power grids, gas distribution networks, transportation networks (including roadways, rail networks, waterways, aviation, and the like), and information and telecommunication systems. Other physical infrastructures may include agricultural and food-related infrastructures, water distribution and recovery networks and infrastructures, public health and emergency services infrastructures, government institutions and infrastructures, defense industrial base infrastructures, banking and finance (including economic) networks and infrastructures, chemical industry and hazardous materials systems and infrastructures, national monuments and icons, and the like. Some of these are often referred to as "critical" infrastructures because they are viewed as being so vital to a particular geopolitical unit that the incapacity or destruction of such systems and assets would have a debilitating impact on control or defense, economic security, public health or safety, or any combination of those matters.

FIG. 1 is a graphical illustration of some of the most critical physical infrastructures known today. As evident therefrom, these infrastructures relate to each other in a variety of ways, some of which are shown therein. For example, petroleum provides fuel and lubricants for vehicles used in the transportation industry, which in turn is used to ship materials in the natural gas industry. Natural gas is used in the electric power industry, whose electricity in turn supports the telecom industry. Telecom provides SCADA and communications for water plants, and water is used in production, cooling and emissions reduction in the petroleum industry. A wide variety of additional interdependencies, some of which are illustrated in FIG. 1, are likewise known.

However, today's civilization depends not just on physical systems or assets such as the infrastructures shown in FIG. 1, but on at least two other broad categories of infrastructures as well. For example, another underlying foundation of today's civilization is the way people or groups of people behave in response to various stimuli, phenomena sometimes referred to as "population behavior." Population behavior models are useful for studying and simulating emergent patterns of situational human interactions and geospatial movements, including such phenomena as traffic patterns, crowd movement, disease transmission, area ingress and egress, and the like. As with physical infrastructure models, such models may incorporate geospatial relationships, but are focused on behavioral patterns and phenomena rather than on the physical (non-human) relationships between different elements of one or more physical phenomena.

Still another basic framework of today's civilization includes the various social networks that exist and connect every segment of civilization, which may collectively be referred to as "intangible relationships and influences" or "social networks." Models of this type are useful for studying and simulating both formal and informal organizations of people. Formal organizations may include government organizations, political organizations, business organizations, religious organizations, and other non-state organizations. Information organizations may include clans, families, people connected by common belief systems, friendships and acquaintances, and the like.

As used herein, then, the term "infrastructure" may refer to any fundamental framework or underlying foundation pertaining to any physical, relational or behavioral aspect of a civilization, where "behavioral infrastructures" are defined as infrastructures involving the way people or groups of people behave in response to various stimuli, "relational infrastructures" are defined as infrastructures created by human interactions in any of the various social networks that exist in and connect various segments of the population of a civilization, and "physical infrastructures" are defined as infrastructures involving physical assets or systems. Furthermore, although sometimes used interchangeably with the term "infrastructure," the term "network," as used herein, generally refers collectively to the various connections between or among elements of a given infrastructure, rather than the infrastructure as a whole. In physical infrastructures, such networks often have a physical relevance, but in many infrastructures, and particularly behavioral and relational infrastructures, networks may have no direct physical relevance.

In order to understand how a given infrastructure works, researchers, planners, government bodies and other parties with varying interests in the infrastructure typically devote considerable effort to studying various aspects of the infrastructure. More particularly, the operation of each of a great many infrastructures has been simulated, using tools of varying degrees of sophistication, to make it possible to study the effect of various stimuli (both internal and external) on the operation of the respective infrastructure. Given the wide variation between different types of infrastructures, these efforts have collectively involved large numbers of people of extremely disparate technological backgrounds or interests using a wide variety of techniques. However, as computer technology has become increasingly sophisticated, complex software models have been developed to make it possible to analyze huge amounts of data representing the various elements of each infrastructure and their interrelationships.

Unfortunately, such software models have generally been created to focus only on a single infrastructure at a time. Those few software models that are capable of simulating more than one infrastructure at a time have been limited in capability to the simulation of infrastructures of only a single type. Thus, a software-based simulation approach is needed that is capable of handling, on a generic basis, a plurality of models representing infrastructures of different fundamental types or categories.

Furthermore, even those software-based simulation approaches that are capable, at least to some degree, of modeling the interrelationships between or among multiple infrastructures have had success only in certain areas. More particularly, these approaches have been deficient in modeling the interrelationships between or among critical infrastructures, as that term is defined hereinabove. Perhaps even more than some other types of infrastructures, critical infrastructures typically involve multi-dimensional, highly complex collections of technologies, processes, and people, and as such, are vulnerable to potentially catastrophic failures (intentional or unintentional) on many levels. Because of their importance and fundamental relationship with the day-to-day operation of a civilization and its various geopolitical units, it is often particularly useful to study these critical infrastructures and their interrelationships with each other. Unfortunately, given the breadth and depth of these infrastructures, one can readily observe characteristics that make the problem of protecting a nation's critical infrastructures, in general, intractable. Key among these characteristics is the inherent complexity of these infrastructures, each defining a unique field of research with numerous open problems regarding organization, operation, and evolution. Magnifying these challenges and the dangers that arise are numerous inherent interdependencies that exist among critical infrastructures, interdependencies that are commonly very strong, time-sensitive, and essential. The result is a brittle "system of systems" that could lead to catastrophic occurrences as a failure (intentional or unintentional) cascades and escalates across infrastructures.

Despite its inherent difficulties, the problem of understanding the behavior of critical infrastructures and their interdependence has been an integral part of well-established disciplines, such as urban and regional planning, civil and environmental engineering, operations research, landscape architecture, and emergency management. This has been discussed, for example, by Kaiser et al. in Urban Land Use Planning, 4th Edn., published by University of Illinois Press (Urbana, Ill. 1995), which is incorporated herein by reference. More recently, as a key area of inquiry, it is receiving increasing attention from the emerging field of geographic information science and technology ("GI S&T"), including in Sinton, D. F.: "Reflections on 25 years of GIS," GIS World Vol. 5. No. 2 (1992) ("Sinton") and in 1-8 UCGIS: University Consortium for Geographic Information Science (2003), each of which is incorporated herein by reference. Researchers in the GI S&T community have primarily used three different approaches in studying the behavior and spatial interdependence of critical infrastructures. In a first approach, sometimes referred to as spatial data analysis ("SDA"), researchers have examined the interdependence of critical infrastructures with tools from spatial statistics and econometrics. This has been described, for example, in Cressie, N.: "Statistics for Spatial Data," published by John Wiley (Chichester, 1991) and Haining, R.: "Spatial data analysis in the social and environmental sciences," published by Cambridge University Press (Cambridge, UK, 1990), each of which is incorporated herein by reference. In a second approach, geographic correlations among critical infrastructure components are depicted using traditional map overlay methods for spatial data aggregation in GIS environments. This has been described, for example, in Burrough, P. A.: "Methods of spatial analysis in GIS," published in International Journal of Geographical Information Systems, Vol. 4. No. 3 (1990), 221-223; Goodchild, M. F. and Kemp, K. K.: NCGIA core curriculum (University of California at Santa Barbara, Calif., 1990); and Greene, R. W.: "Confronting Catastrophe: a GIS Handbook" (ESRI Press, Redlands Calif., 2002), each of which is incorporated herein by reference. In a third approach, rule-based inference engines, usually fueled by human expert's knowledge, are used in the delineation and manipulation of interdependence. This has been described, for example, by Gronlund, A. G. et al.: "GIS, expert systems technologies improve forest fire management techniques," published in GIS World, Vol. 7. No. 2 (1994), pages 32-36, and Xiang, W.-N.: "Knowledge-based decision support by CRITIC," published in Environment and Planning B: Planning and Design, Vol. 24. No. 1 (1997), pages 69-79, each of which is incorporated herein by reference. Unfortunately, these approaches, while informative, do not in isolation adequately address the problem regarding the impact of critical infrastructure interdependencies.

Consequently, many respected GI S&T researchers have advocated a multi-dimensional approach to the study of behavior and spatial interdependence of critical infrastructures. This approach is described, for example, in Getis, A.: "Spatial dependence and heterogeneity and proximal databases," in Spatial Analysis and GIS (Eds.: FotheringHam, S. and Rogerson, P.) (Taylor & Francis, London, 1994), pages 105-120 ("Getis"), which is incorporated herein by reference, and Sinton. Instead of "divide-and-conquer," they suggested a strategy that combines strengths of the three different approaches described above and investigates the matter of interdependence from all three vantage points. However, despite some genuine efforts, such as those described in Anselin, L. and Getis, A.: "Spatial statistical analysis and geographic information systems," published in Annals of Regional Science, Vol. 26 (1992), pages 19-33; Flowerdew, Green: "A real interpolation and types of data," in Spatial Analysis and GIS (Eds.: FotheringHam, S. and Rogerson, P.) (Taylor & Francis, London, 1994), pages 121-145; Getis; and Openshaw: "Two exploratory space-time-attribute pattern analysers relevant to GIS," in Spatial Analysis and GIS (Eds.: FotheringHam, S. and Rogerson, P.) (Taylor & Francis, London, 1994), pages 82-104, each of which is incorporated herein by reference, progress along this route has yet to meet the advocates' expectations. The status quo is exemplified by some more recent publications in which little if any multidimensional GI S&T-based results were reported, including Mitchell, A.: "The ESRI Guide to GIS Analysis" (ESRI Press, Redlands, Calif., 1999) and Zeiler, M.: "Modeling Our World: the ESRI Guide to Geodatabase Design" (ESRI Press, Redlands, Calif., 1999), each of which is incorporated herein by reference.

There are also several feature-rich GI S&T visualization tools (e.g. ESRI ArcGIS) for overlaying critical infrastructure components onto maps and satellite imagery. These tools often support single infrastructure modeling and simulation—e.g., analyses that can determine the impact of a failed power line on electrical power distribution. However, to date, such models are relatively static and do not support interactions across infrastructure layers.

A more sophisticated approach may be offered by modeling and simulating critical infrastructure interdependencies. Although generally not yet attempted by any of the disciplines described above, this approach has received some attention within the modeling and simulation community. For example, Rinaldi, S. M. et al.: "Identifying, understanding, and analyzing critical infrastructure interdependencies," published in IEEE Control Systems Magazine (December 2001), pages 11-25 ("Rinaldi et al."), which is incorporated herein by reference, suggest a taxonomy for identifying, understanding, and analyzing critical infrastructure interdependencies based upon interdependency type. Rinaldi et al. also contend that intelligent agent-based techniques may be appropriate for modeling such interdependencies. The application of intelligent agent-based techniques to modeling and simulation problems is well-understood for many problem domains, as discussed, for example, in Weiss, G. ed.: Multiagent Systems (MIT Press, 1999) ("Weiss"), which is incorporated herein by reference. Unfortunately, there are no known applications of this approach to critical infrastructure integration.

The problem of understanding the behavior of critical infrastructures and their interdependence remains a difficult, open problem. The limitations of single-dimensional approaches are by no means trivial. Multi-dimensional GI S&T approaches, while theoretically promising, have produced few results. Furthermore, while modeling and simulation can lead to a better understanding of the behavior of critical infrastructures, no prior art solution is comparable to that of the present invention.

In view of all of the foregoing, a need exists for a software-based simulation approach that is capable of handling, on a generic basis, a plurality of models representing infrastructures of different fundamental types. Moreover, a particular need exists for a software-based simulation approach that is capable of handling a plurality of models representing different critical infrastructures. Finally, a need exists for a "software agent"-based approach to modeling and/or simulating one or more critical infrastructures with intra-dependencies and/or interdependencies.

SUMMARY OF THE PRESENT INVENTION

The present invention helps to address the crucial and daunting task of infrastructure protection by providing innovative infrastructure modeling approaches in order to help identify and understand interdependencies, vulnerabilities and the like. One particular application of these approaches is in explicitly modeling and exposing the impacts that failures in one infrastructure may have on connected and related infrastructures. The methodology for multiple infrastructure integration, modeling and simulation is described herein.

In order to provide a synergistic "system of systems" view of designated geographic regions and their supporting critical infrastructures, a solution is required to the current open problem of enabling cross infrastructure simulations. A system of systems problem is, in large part, a multi-level, multi-dimensional integration problem, but issues regarding the integration of data and control within and across domains and systems are complex. Solutions that simply interconnect systems rarely provide benefits that equal the sum of their individual benefits, let alone the potential for synergistic benefits. To achieve the desired synergy, missing functionality must be identified and missing data must be articulated. Scalability and flexibility through meta-functionality and meta-data are keys to this effort since synergy within such solutions is a moving target.

These issues are highlighted in FIG. 2, which is a metaphorical graphical illustration of the codependency of critical infrastructures. As shown in FIG. 2, infrastructure domains relate to each other like the spokes of a wheel, where each spoke represents a domain, and the axle of the wheel is the heart of a system of systems. Each spoke captures domain knowledge and functionality. The axle of the wheel captures domain knowledge and functionality as well, but as it applies across domains. The axle of the wheel also controls the interactions between the heart of the system and each domain, as well as interactions across domains. Each level of data, each dimension of control may evolve over time. New spokes may be added while others are removed. In the end, it is the right combination of spokes with the axle (knowledge and control) that brings broadsweeping function to the wheel (and synergy to a system of systems).

Given this description, we see the problem of enabling cross-infrastructure simulations is partially a problem of a proper integration of individual critical infrastructure behavior models. We can approach this problem, in part, along two dimensions: the level of integration and the methodology of integration.

Linthicum, D. S.: Enterprise Application Integration (Addison-Wesley, N.Y., 2000), which is incorporated herein by reference, describes integration, particularly enterprise application integration, in terms of four levels: data level, application interface level, method (i.e., business process) level, and the user interface level. Data level integration is a bottom-up approach that creates "integration awareness" at the data level by extending data models to include integration data. For example, infrastructure models are extended to include explicit infrastructure interdependency data. Application level integration creates "integration awareness" at the application level, which in our case refers to the infrastructure models. At this level, behavioral analysis constructs for each infrastructure are adapted to recognize and interact with other infrastructures. Method level integration develops "integration awareness" external to the infrastructure models—that is, infrastructure models remain unaware of one another. This cross-infrastructure awareness is encapsulated and managed at a level above the infrastructures. The final level of integration creates "integration awareness" at the user interface level. This level of integration, through techniques such as "screen scraping," is often used to integrate legacy systems.

The methodology dimension of integration refers to the method by which integration occurs at a given level. Integration methodologies may be partitioned into two categories: peer-to-peer integration and brokered integration. Peer-to-peer integration is most common and effective for data and application level integration. These methodologies essentially support fire-and-forget or request-response remote procedure calls among applications. Brokered integration is most common and effective for method level integration. Different approaches to brokered integration include agent-based integration and workflow-based integration. Each of these approaches depends upon metaknowledge to enable the integration. Agent-based integration utilizes contextual metaknowledge represented in the form of facts and rules while workflow-based integration utilizes procedural knowledge represented in the form of process models. (Because user interface level integration is simply a technique for opening up legacy systems, this level may participate equally within both methodology categories.)

The present invention comprises a generic approach to the simultaneous simulation of multiple infrastructures and their interrelationships or interdependencies. The infrastructures being simulated may be of the same or different types (i.e., they may be all physical, all relational, all behavioral, or any combination thereof). Although a particular focus of the present invention is to provide an approach for simulating multiple critical infrastructures and their interdependencies, the approach remains the same regardless of the type of infrastructures being modeled. This is achieved using a software agent approach, a technique which has been applied in some simulation contexts but never with regard to the simulation of any critical infrastructure and never with regard to the simultaneous simulation of multiple infrastructures of any type.

Broadly defined, the present invention according to one aspect is a software-based system for simulating interdependencies between a plurality of infrastructure models of different infrastructure categories, including: a first infrastructure data model that models a first infrastructure, the first infrastructure being of a first infrastructure category that is selected from the group consisting of behavioral infrastructures, relational infrastructures, and physical infrastructures; a second infrastructure data model that models a second infrastructure of a second infrastructure category, the second infrastructure being of a second infrastructure category that is also selected from the group consisting of behavioral infrastructures, relational infrastructures, and physical infrastructures, wherein the second infrastructure data model is from an infrastructure category that is different from the infrastructure category of the first infrastructure data model; a simulation engine adapted to automatically produce a change in the second infrastructure data model in response to a change in the first infrastructure data model; and a user interface permitting a user to interact with the simulation engine.

In a feature of this aspect, the change in the first infrastructure data model represents an event occurring in the first infrastructure, and the change in the second infrastructure data model represents the simulated effect of the event in the first infrastructure on the second infrastructure.

In another feature of this aspect, the system further includes a first application program interface enabling the simulation engine to interface with the first infrastructure data model, and a second application program interface enabling the simulation engine to interface with the second infrastructure data model.

In yet another feature of this aspect, the simulation engine includes a visualization application. In a related feature, at least a portion of the data of the first infrastructure data model has a geospatial relationship and at least a portion of the data of the second infrastructure data model has a geospatial relationship, and the simulation engine incorporates the geospatial relationship of the data of the first infrastructure data model and the geospatial relationship of the data of the second infrastructure data model in producing the change in the second infrastructure data model. In another related feature, the visualization application provides a visual representation connecting the geospatial relationship of the first infrastructure data model and the geospatial relationship of the data of the second infrastructure data model. In yet another related feature, the simulation engine includes a society of software agents.

In still another feature of this aspect, the simulation engine utilizes inter-infrastructure meta-knowledge contained in a database. In a related feature, the user interface includes an editor for editing the inter-infrastructure meta-knowledge.

In still another feature of this aspect, the user interface includes controls for causing the simulation engine to execute a pre-defined configuration. In a related feature, the user interface further includes an editor for establishing the pre-defined configuration.

In still another feature of this aspect, the first infrastructure data model models a physical infrastructure that involves physical assets or systems, and wherein the second infrastructure data model models a behavioral infrastructure that involves the way people or groups of people behave in response to various stimuli. In a related feature, the physical infrastructure is a critical physical infrastructure.

In still another feature of this aspect, the first infrastructure data model models a physical infrastructure that involves physical assets or systems, and wherein the second infrastructure data model models a relational infrastructure that involves human interactions in a social network that exists and connects a plurality of segments of a population. In a related feature, the physical infrastructure is a critical physical infrastructure.

In still another feature of this aspect, the first infrastructure data model models a relational infrastructure that involves human interactions in a social network that exists and connects a plurality of segments of a population, and wherein the second infrastructure data model models a behavioral infrastructure that involves the way people or groups of people behave in response to various stimuli.

Broadly defined, the present invention according to another aspect is a software-based system for simulating interdependencies between multiple critical physical infrastructure models, including: a first infrastructure data model that models a first critical physical infrastructure; a second infrastructure data model that models a second critical physical infrastructure, wherein the second critical physical infrastructure is a different critical physical infrastructure from the first critical physical infrastructure; a simulation engine adapted to automatically produce a change in the second infrastructure data model in response to a change in the first infrastructure data model; and a user interface permitting a user to interact with the simulation engine.

In a feature of this aspect, the change in the first infrastructure data model represents an event occurring in the first infrastructure, and wherein the change in the second infrastructure data model represents the simulated effect of the event in the first infrastructure on the second infrastructure. In a related feature, the system further includes a third infrastructure data model that models a third critical physical infrastructure, wherein the third critical physical infrastructure is a different critical physical infrastructure from the first and second critical physical infrastructures.

In another feature of this aspect, the system further includes a first application program interface enabling the simulation engine to interface with the first infrastructure data model, and a second application program interface enabling the simulation engine to interface with the second infrastructure data model.

In another feature of this aspect, the simulation engine includes a visualization application. In a related feature, at least a portion of the data of the first infrastructure data model has a geospatial relationship and at least a portion of the data of the second infrastructure data model has a geospatial relationship. In another related feature, the simulation engine incorporates the geospatial relationship of the data of the first infrastructure data model and the geospatial relationship of the data of the second infrastructure data model in producing the change in the second infrastructure data model. In yet another related feature, the visualization application provides a visual representation connecting the geospatial relationship of the first infrastructure data model and the geospatial relationship of the data of the second infrastructure data model. In still another related feature, the simulation engine includes a society of software agents.

In another feature of this aspect, the simulation engine utilizes inter-infrastructure meta-knowledge contained in a database. In a related feature, the user interface includes an editor for editing the inter-infrastructure meta-knowledge.

In another feature of this aspect, the user interface includes controls for causing the simulation engine to execute a pre-defined configuration. In a related feature, the user interface further includes an editor for establishing the pre-defined configuration.

In another feature of this aspect, the simulation engine automatically further produces a change in the third infrastructure data model in response to the change in the first infrastructure data model.

In another feature of this aspect, the simulation engine automatically produces the change in the second infrastructure data model in response to the change in the first infrastructure data model and further in response to a change in the third infrastructure data model.

Broadly defined, the present invention according to yet another aspect is a software-agent based critical infrastructure modeling and simulation system including: an infrastructure data model that models a critical physical infrastructure; a simulation engine including a society of software agents and adapted to automatically produce, in response to a first change in the infrastructure data model, a second change in the infrastructure data model; and a user interface permitting a user to interact with the simulation engine.

In a feature of this aspect, the first change in the infrastructure data model represents an event occurring in one portion of the critical physical infrastructure, and the second change in the infrastructure data model represents the simulated effect of the event on other portions of the critical physical infrastructure.

In another feature of this aspect, the system further includes an application program interface enabling the simulation engine to interface with the infrastructure data model.

In yet another feature of this aspect, the simulation engine further includes a visualization application. In a related feature, at least a portion of the data of the infrastructure data model has a geospatial relationship. In another related feature, the simulation engine incorporates the geospatial relationship of the data of the infrastructure data model in producing the second change. In yet another related feature, the visualization application provides a visual representation connecting the first and second changes to the geospatial relationship of the data of the infrastructure data model.

In still another feature of this aspect, the society of software agents utilizes inter-infrastructure meta-knowledge contained in a database. In a related feature, the user interface includes an editor for editing the inter-infrastructure meta-knowledge.

In still another feature of this aspect, the user interface includes controls for causing the simulation engine to execute a pre-defined configuration. In a related feature, the user interface further includes an editor for establishing the pre-defined configuration. In another related feature, each software agent in the society of software agents is an autonomous software program or program component that is situated within, is aware of, and acts upon its environment in pursuit of its own objectives so as to affect its future environment.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
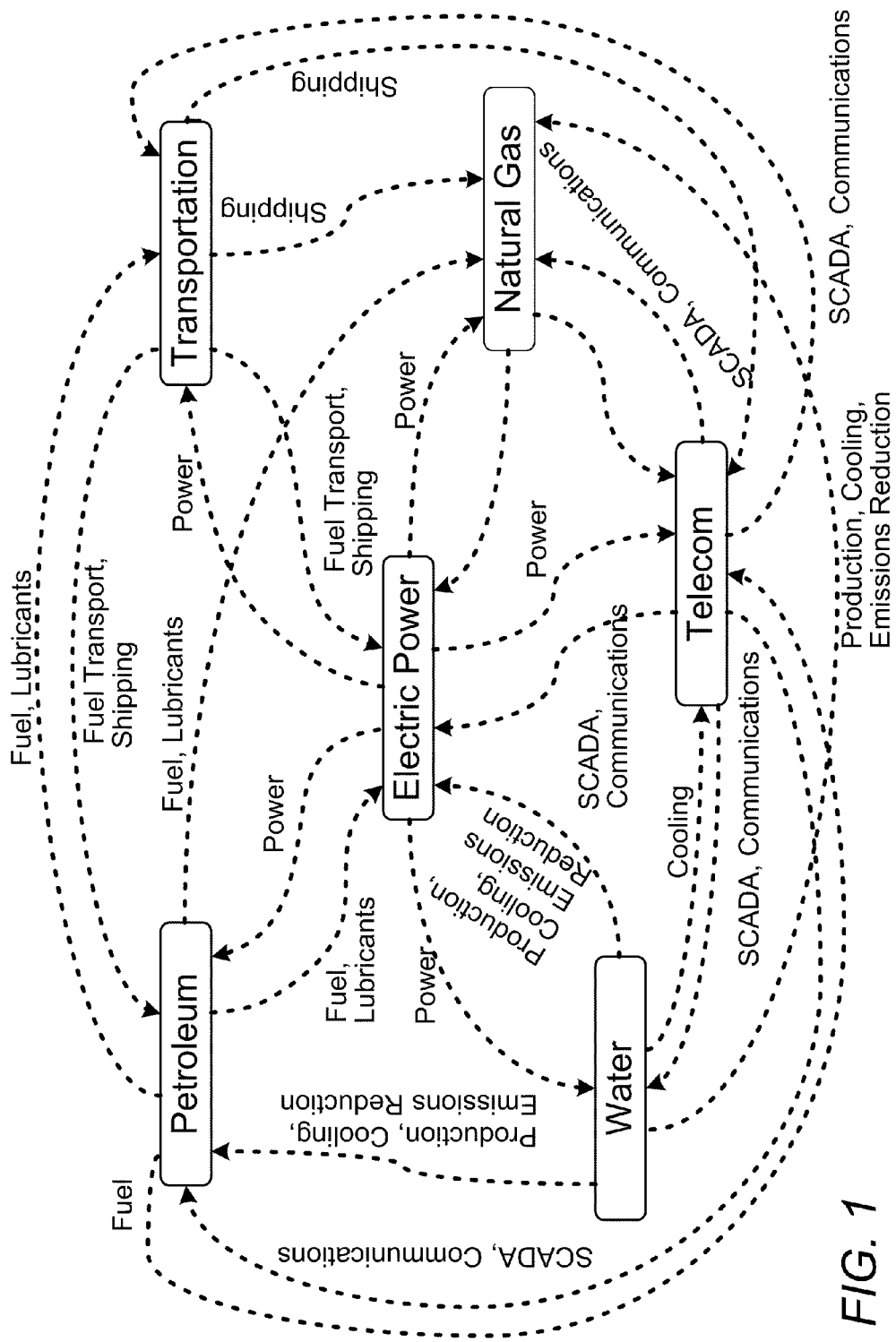
FIG. 1 is a graphical illustration of some of the most important critical infrastructures known today.
Figure 2:
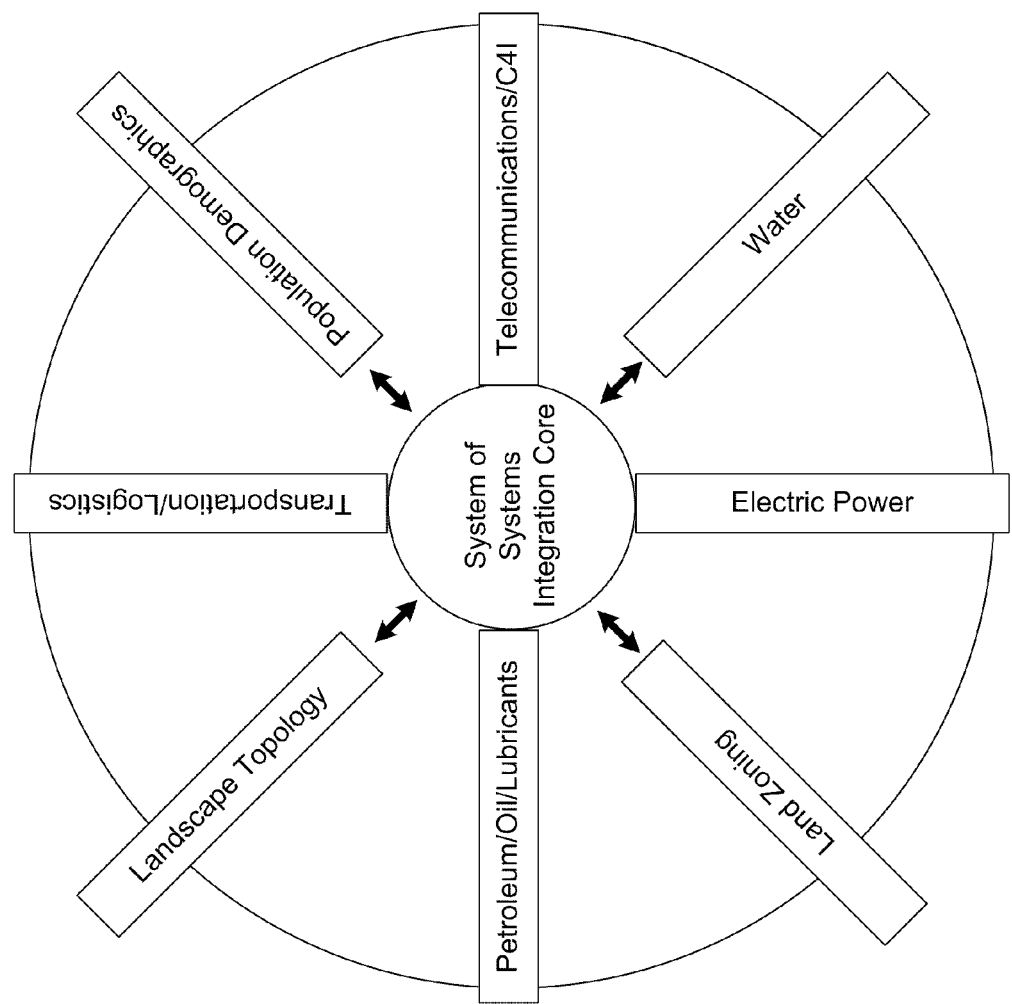
FIG. 2 is a metaphorical graphical illustration of the codependency of critical infrastructures.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Introduction to Software Agents

The present invention provides an approach to integrating critical infrastructures for the purpose of cross-infrastructure modeling and simulation by utilizing an intelligent software agent-based, brokered methodology designed for method level integration. As used herein, the term "software agent" refers to an autonomous software program, or program component, that is situated within, is aware of, and acts upon its environment in pursuit of its own objectives so as to affect its future environment. This definition is an adaptation of Weiss and Franklin, S. and Graesser, A.: "Is it an agent, or just a program?: a taxonomy for autonomous agents," published in 3rd International Workshop on Agent Theories, Architectures, and Languages (Springer-Verlag, 1996), which is incorporated herein by reference.

Software agents can be further categorized, according to Weiss, by their degree of autonomy and intelligence, and the type of environment within which they may be situated. As used herein, "autonomy" refers to a software agent's ability to sense and act upon its environment without intervention (e.g., human intervention). Thus, the more autonomous an agent, the less need for intervention. As used herein, "intelligence" refers to an agent's ability to be reactive, proactive, and social (i.e., its ability to converse with other agents). As used herein, "agent environments" are characterized based on issues of accessibility, determinism, dynamism, continuity, and their episodic nature (i.e., whether agents must consider past and future actions when reasoning about current actions). These environment characteristics shape an agent's required capabilities. (Another characteristic frequently discussed is agent mobility—the ability of an agent to migrate among machines. We view agent mobility as an architectural characteristic derived from agent environment characteristics such as accessibility.)

The solution of the present invention utilizes intelligent software agents to support critical infrastructure integration modeling and simulation and is motivated primarily by three factors. First, given the types of critical infrastructure models for which integration would be desirable, is was clear that neither data nor application level integration would provide the appropriate level of extensibility and scalability that is required by the modeling and simulation environment of the present invention. Data and application level integration could be accomplished for specific infrastructure models that are well-scoped and fully populated. However, it is desirable to have the ability to perform simulations across multiple, potentially sparse infrastructure models. As such, method level integration, and therefore brokered integration, is the most promising approach.

Second, it was concluded that the meta-knowledge necessary to support cross-infrastructure simulations contains characteristics that are more contextual than procedural in nature. Consequently, the system of the present invention captures meta-knowledge using a rule-based, declarative approach rather than using a procedural representation such as hierarchical state transition diagrams or Petri nets. This conclusion is further supported by the contention that agent-based systems are a promising approach to modeling complex adaptive systems, as set forth, for example, by Rinaldi et al., in that such systems are often highly contextual.

Third, it was concluded that there is a strong requirement for multiple types of simulations. These simulation types may be organized along several different dimensions of analyses, including predictive and prescriptive analyses, discovery-based analyses, and probabilistic analyses. Predictive ("what if") and prescriptive ("goal-driven") analyses, which are complementary and are often used simultaneously, are used during simulations to determine the consequences of vulnerability exploitation or if there are vulnerabilities that might lead to an undesirable outcome. This is discussed, for example, by Chu, B. et al.: "Towards intelligent integrated planning-execution," published in International Journal of Advanced Manufacturing Systems, Vol. 1 No. 1 (1997), pages 77-83; Pearl, J.: Probabilistic Reasoning in Intelligent Systems: networks of plausible Inference (Morgan Kaufmann, San Mateo, Calif., 1988); Peng, Y. et al.: "An agent-based approach to manufacturing integration: the CIIMPLEX experience," published in Applied Artificial Intelligence, An International Journal, Vol. 13, No. 1-2 (1999), pages 39-64; and Russell, S. J. and Wefald, E. H.: Do the Right Thing: Studies in Limited Rationality (MIT Press, Cambridge, Mass., 1991), each of which is incorporated herein by reference. Discovery-based analyses examine infrastructure models and the supporting meta-knowledge to discover new knowledge (e.g., uncover unidentified infrastructure interdependencies) and to identify data set inconsistencies. This is described, for example, by Moukas, A. and Maes, P.: "Amalthaea: an evolving multi-agent information filtering and discovery systems for the WWW," Autonomous agents and multi-agent systems, Vol. 1 (1998), pages 59-88 and Sycara, K.: "Distributed intelligent agents," published in IEEE Expert, Vol. 11, No. 6 (1996), pages 36-46, each of which is incorporated by reference. Probabilistic analyses introduce variability into simulations in order to provide better approximations of infrastructure behavior. This is described, for example, by Bar-Shalom, Y.: Multitarget Multisensor Tracking: Advanced Applications (Artech House, 1990) and Rao A. S. and Georgeff, M. P.: "Modeling rational agents within a BDI-architecture," published in Proceedings of the Second International Conference on Principles of Knowledge Representation and Reasoning (J. Allen, R. Fikes, and E. Sandewall, editors) (Morgan Kaufmann, 1991), pages 473-484, each of which is incorporated by reference. Significantly, each of the three analyses types has been shown to be supported effectively by agent-based solutions. Moreover, the nature of these analyses also suggests an agent design that embodies a strong notion of intelligence as previously described.

Thus, in order to address the difficult problem of critical infrastructure integration modeling and simulation, the system of the present invention utilizes an intelligent agent-based system that provides a brokered methodology for method level integration. This system will afford a better understanding of critical infrastructure vulnerabilities, particularly those due to cross-infrastructure dependencies, as a means to provide better protection to a nation's critical infrastructures.

Simulations of interactions among infrastructure components (i.e., transportation, power distribution, telecommunications, and petroleum and gas distribution behavioral models) are achieved by developing agents to represent the infrastructure components. These agents interact using a distributed, blackboard architecture, as described by Engelmore, R. and Morgan, T. (Eds.).: Blackboard systems (Addison-Wesley Publishing Company, 1988), which is incorporated herein by reference. A key assumption of this architecture is that certain complex problems, such as the simulation of cross-infrastructure interactions, is best solved by the collaboration of a set of knowledge sources, much like the manner in which a team of human experts collaborate to solve complex problems.

For such an approach to be successful, a strong control mechanism, the computer equivalent of a good moderator, is critical to ensure the success of this process. It is believed that a distributed, blackboard architecture holds the best promise for cross-infrastructure simulations for at least two reasons. First, the modeling and simulation of each component infrastructure is a complex problem that requires many person-years of investment. The only viable option is to utilize existing models, analogous to experts in subject fields. Second, the blackboard architecture provides a framework for building a complex system of systems based on a set of large components. An important critical success factor is to develop an effective control and coordination mechanism for independently developed component models.

Thus, the present invention's solution for cross critical infrastructure modeling and simulation allows end users to execute simulations seamlessly within the context of a visualization environment, such as a GIS environment. Users initiate simulations by selecting and disabling infrastructure features and then viewing the impacts of those actions through the contextual visualization support.

Overview of System

Figure 3:
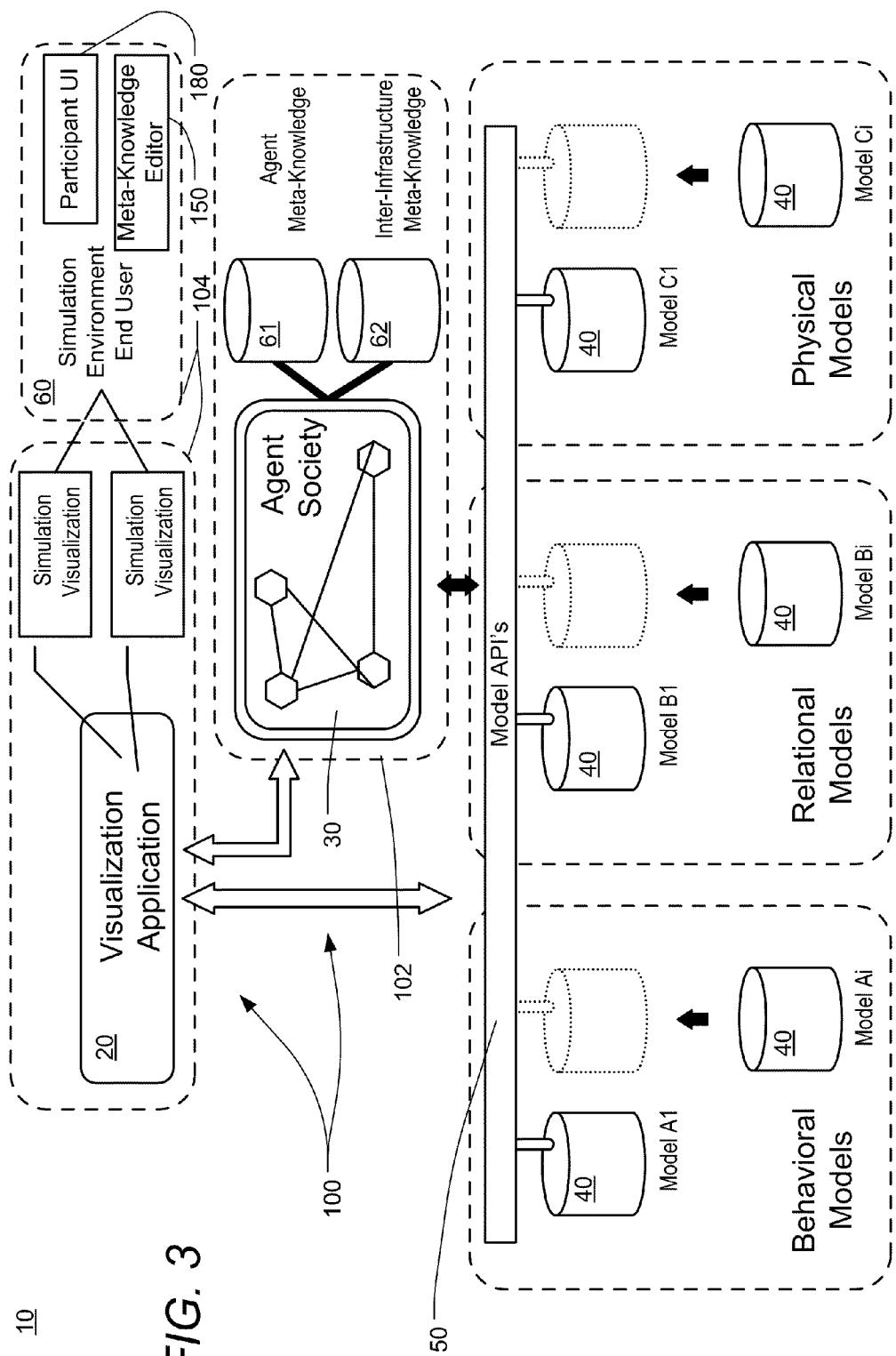
FIG. 3 is a block diagram of a generalized software-based infrastructure simulation system in accordance with the preferred embodiments of the present invention.

FIG. 3 is a block diagram of a generalized software-based infrastructure simulation system 10 in accordance with the preferred embodiments of the present invention. The system 10 includes a visualization application 20, an agent society 30, a plurality of infrastructure data models 40 connected to the visualization application 20 and agent society 30 by a collection of infrastructure model application program interfaces ("APIs") 50, and a simulation environment 60 that facilitates use by end users. The visualization application 20 may be any suitable application, such as a conventional commercial GIS application, for presenting modeling and simulation information to the user in a visual environment. The agent society 30 makes use of agent meta-knowledge 61 and inter-infrastructure meta-knowledge 62. The infrastructure models 40 may include one or more infrastructure models 40 of each of the three different types of infrastructures in any desired combination. In FIG. 3, models A1 . . . Ai 40 are models of unspecified behavioral infrastructures, models B1 . . . Bi 40 are models of unspecified relational infrastructure models, and models C1 . . . Ci 40 are models of unspecified physical infrastructure models.

Figure 4:
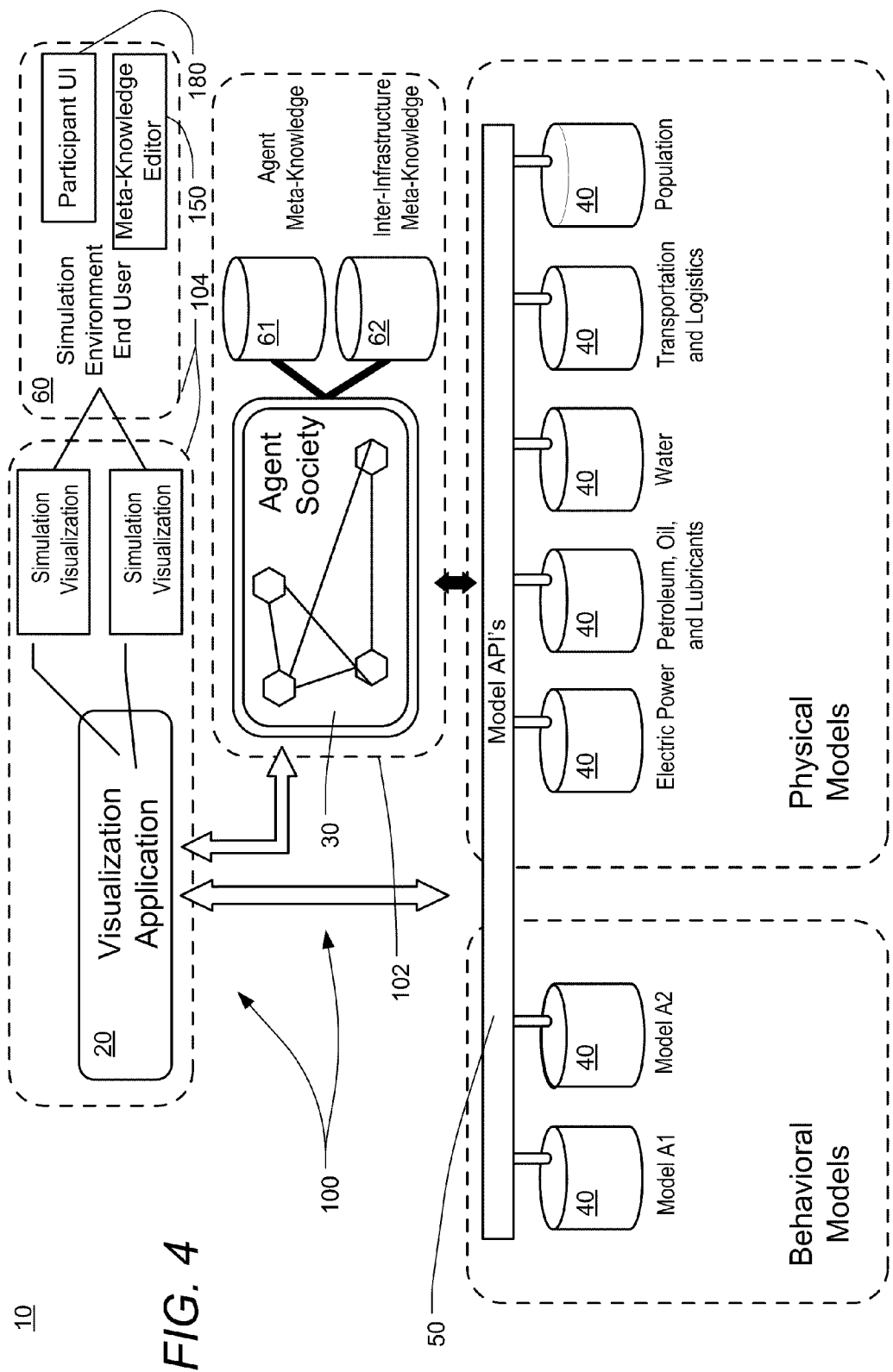
FIG. 4 is a block diagram of a first exemplary implementation of the generalized system of FIG. 3.

FIG. 4 is a block diagram of a first exemplary implementation of the generalized system 10 of FIG. 3. In this exemplary implementation, the system 10 includes two behavioral-type infrastructure models 40 and five physical-type infrastructure models 40. The behavioral-type infrastructure models 40 are unspecified but are labeled "Model A1" and "Model A2." The physical-type infrastructure models 40 are labeled "Electric Power," "Petrolem, Oil, and Lubricants," "Water," "Transportation and Logistics" and "Population." In this implementation, no relational-type infrastructure models 40 are included.

Figure 5:
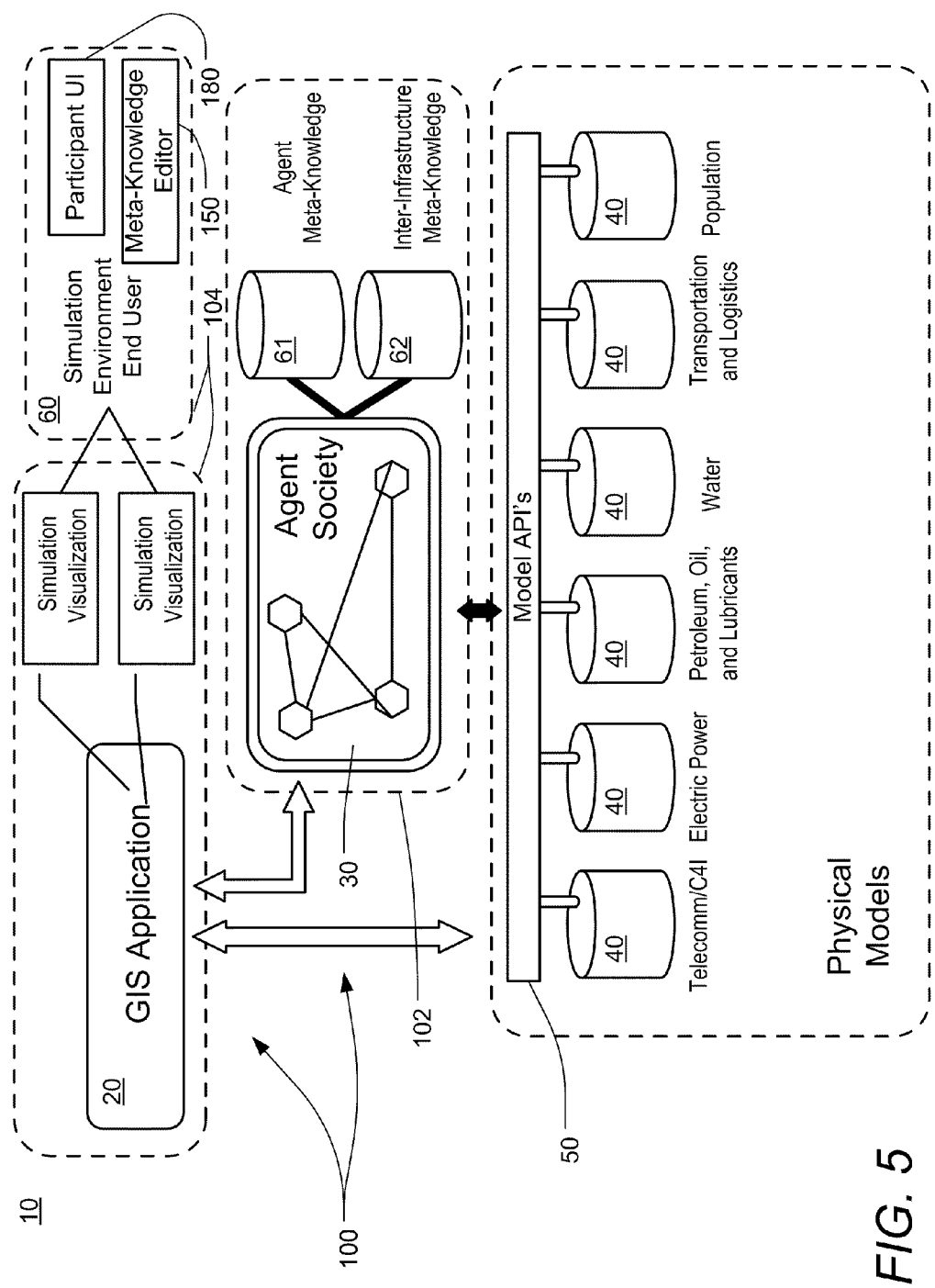
FIG. 5 is a block diagram of a second exemplary implementation of the generalized system of FIG. 3.

FIG. 5 is a block diagram of a second exemplary implementation of the generalized system 10 of FIG. 3. In this exemplary implementation, the system 10 includes six physical-type infrastructure models 40. The physical-type infrastructure models 40 are labeled "Telecomm/C4I," "Electric Power," "Petroleum, Oil, and Lubricants," "Water," "Transportation and Logistics" and "Population." In this implementation, no behavioral-type infrastructure models 40 and no relational-type infrastructure models 40 are included, and the visualization application 20 is a conventional commercial GIS application. Together, FIGS. 3, 4 and 5 illustrate by example the various permutations of models or simulations that may be implemented using the system 10 of the present invention.

Figure 6:
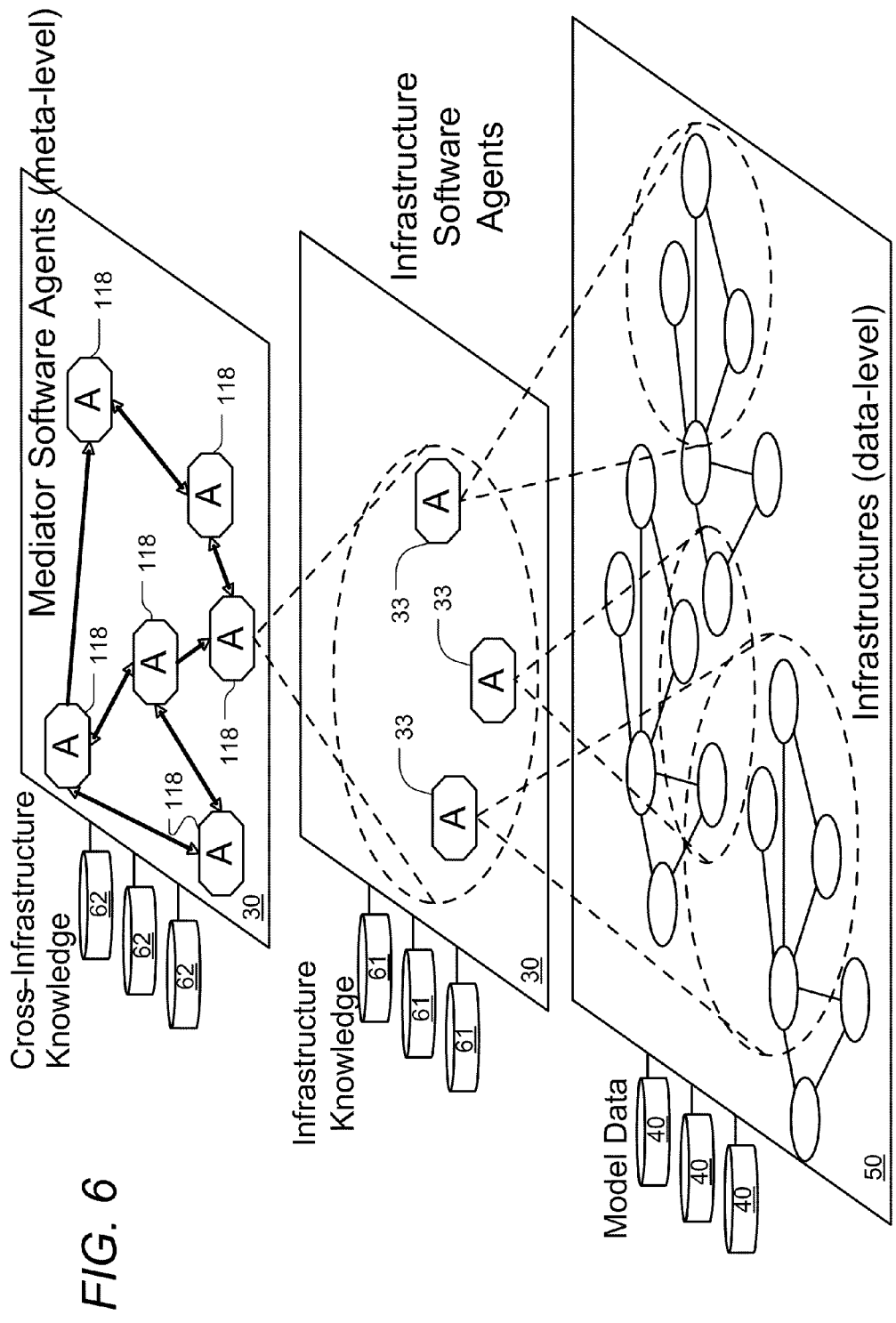
FIG. 6 is a block diagram of the agent society and the collection of infrastructure model API's of FIG. 3.

FIG. 6 is a block diagram of the conceptual architectural hierarchy of the agent society 30 and the collection of infrastructure model API's 50 and FIG. 5. Individual infrastructure proxy agents 33 handle the communication between the higher-level mediator agents and the actual ArcMap modeled infrastructure, where intra-infrastructure effects are simulated. Individual mediator agents 118 in the top layer communicate with infrastructure proxy agents 33 to achieve the inter-infrastructure simulation. Collectively, in order to support cross-infrastructure simulations, a community of intelligent software agents, interacting via a distributed, blackboard architecture, registers interest in the critical infrastructure models of concern. These agents then collectively sense changes within infrastructures, reason about the changes using meta-knowledge that includes cross-infrastructure dependency data, communicate within the community of agents, and based upon the outcome of the collective reasoning, potentially effect change back to and across the infrastructures of concern.

Currently, two types of change may be produced by the agents. First, agents, having sensed an infrastructure state change (e.g., a transmission line has failed due to contact with a tree branch), may reason about the impacts of this event upon all infrastructures based upon the metaknowledge available and effect changes in state within and across infrastructures. Second, agents, having sensed change, may reason about the impacts of this event upon infrastructures by leveraging specialized functionality (e.g., GIS supported network analyses) and produce changes within infrastructures.

Three important characteristics of our architecture are its flexibility, scalability, and extensibility. Our architecture is flexible in that it allows the 'plug and play' of different models of the same infrastructure for a given region. Our architecture is scalable in that multiple models of the same infrastructure type (e.g., models of adjacent transportation systems) may simultaneously participate in a single simulation. Our architecture is extensible in that new infrastructure model types may be easily incorporated into the simulation environment.

Although the system 10 of the present invention incorporates the visualization application 20, the agent society 30, the infrastructure models 40, the infrastructure model API's 50, and the user's simulation environment 60, the most important areas of new development required for a proposed commercial embodiment of the present invention are the visualization application 20 and the agent society 30. The combination of these two elements 20, 30 is often generally referred to hereinafter as the "simulation engine" 100. As described elsewhere herein, the other elements of the system 10 may be satisfied by, or based upon, readily available commercial products, but the simulation engine 100 is believed to be wholly or partially novel.

Figure 7:
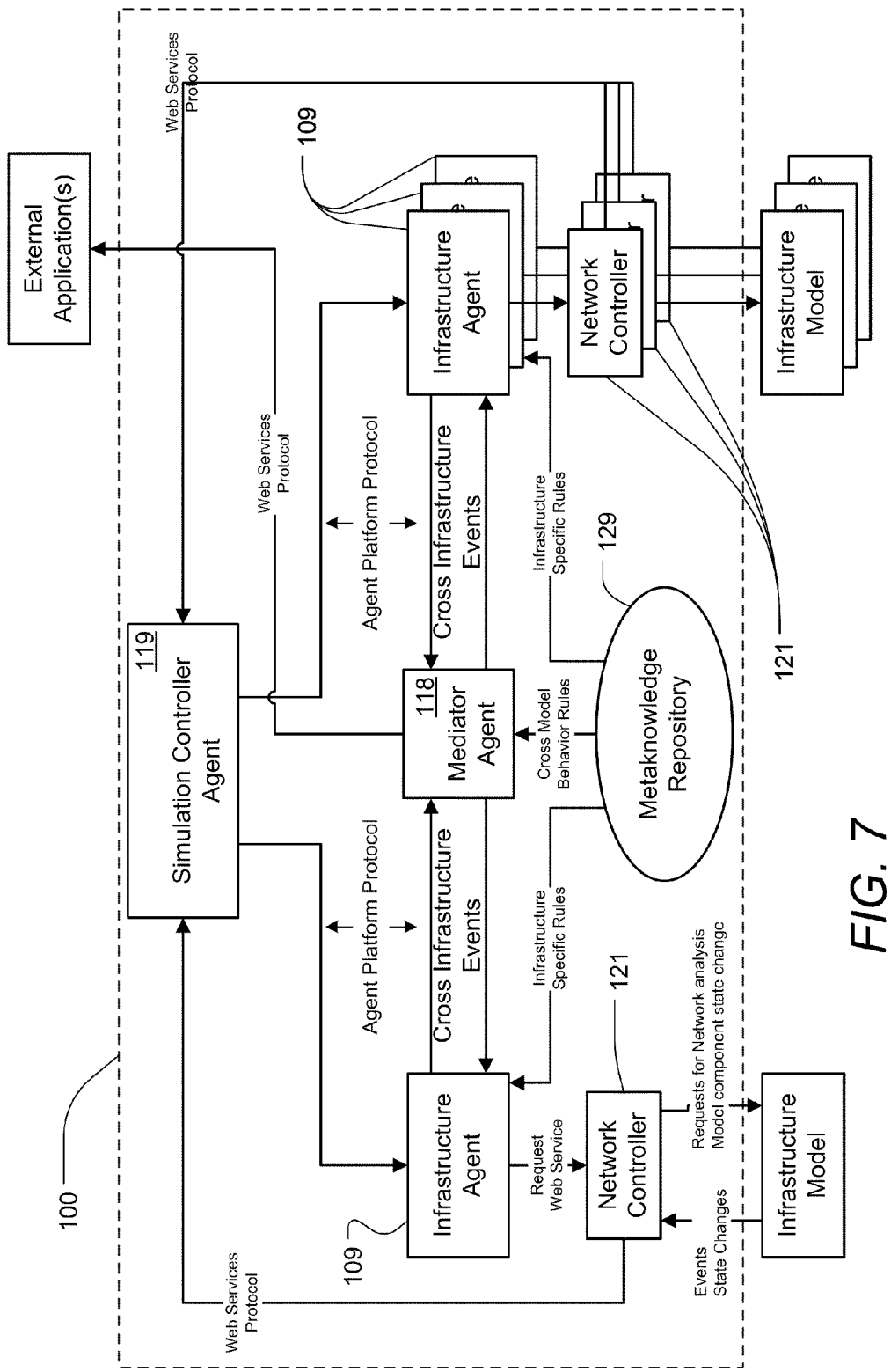
FIG. 7 is a block diagram illustrating a simplified, generalized, logical system view of the simulation engine.

FIG. 7 is a block diagram illustrating a simplified, generalized, logical system view of the simulation engine 100. The agent society 30 includes a simulation controller agent 119, a mediator agent 118, and a plurality of infrastructure agents 33. The Simulation Controller Agent ("SCA") 119 is the manager of the simulation space. More than one simulation is capable of being run with simulation engine 100 at any given time. Each simulation that is running and each participant involved in an instance of a simulation belong to a session. The SCA 119 manages participants 104 that wish to start a simulation or join in an existing one. The SCA 119 also manages the temporal aspect of a simulation, progressing the simulation timeline as the simulation runs.

The mediator agent 118 provides the logic for cross infrastructure effects that need to be propagated to Infrastructure agents 33. Infrastructure Agents 33 represent infrastructure domain knowledge (e.g., power and telecommunications) and provide infrastructure specific behavior in the system. Containing knowledge and rules for handling specific instances of infrastructures, they model intra-infrastructure effects. The simulation engine 100 of the present invention preferably takes a rule-based approach to providing complex behavior as opposed to declarative programming models. This allows maximum flexibility and adaptability to ever changing requirements for simulations.

The network controller 121 is a subsystem component that manages the network representation of the infrastructures 40 modeled in a simulation. Leveraging pre-existing network models 40 for various infrastructures, the network controller 121 manages the state of the underlying network model 40.

The agent society 30 may be developed on an existing, commonly-available platform to minimize unnecessary development effort. One agent platform suitable for use in the preferred embodiments of the present invention is the open source Cougaar architecture, information for which is available at http://www.cougaar.org. The Cougaar architecture provides a framework for building a complex system of systems based on a set of large components. An important critical success factor is to develop an effective control and coordination mechanism for independently developed component models. Cougaar has proven to be effective for the U.S. Department of Defense in addressing complex military logistic planning systems. Building the simulation engine 100 on such an architecture reduces the overall technical risk and increases the chance of success. Regardless of the agent platform chosen, the preferred embodiment of the simulation engine 100 should not extend the agent platform in non-standard ways.

The visualization application 20 and the simulation environment 60 may likewise utilize commonly-available tools to minimize unnecessary development effort. One set of software tools suitable for use in the preferred embodiments of the present invention is the ArcGIS suite and other technology available from ESRI of Redlands, Calif., and information for which is available at http://www.esri.com. ESRI is the market leader in GIS technology for the federal government. Agencies from nearly every cabinet department in the executive branch, as well as many independent agencies and legislative entities, are using ESRI technology in such diverse applications as land management, transportation, military operations, and governmental reform. Given the breath of domain coverage, ESRI is a suitable choice for modeling infrastructures.

The simulation engine 100 is highly dependent on the software tools selected (for example, in the proposed commercial embodiment, the ArcGIS suite), which preferably provide the UI basis for all simulation I/O, including the ability to simulate (feature selection, attribute modification, etc.), view (data-bound symbology reflection, such as color, extrusions, etc.) and analyze (post simulation analysis, such as attribute inspection, solvers, etc.). In particular, ArcGIS also provides the mechanism for all GIS simulation model/data access, geometric networks to determine network flow, network connectivity relationship of network features, and network analyst solvers to find disconnected features, find the path of most optimal network traversal, to perform proximity searches by feature type, and to find the closest feature searches by feature type. However, other commonly-available, customized, or newly-developed software tools may alternatively be used.

The particular GIS software tool used, and in particular the use of the ArcGIS platform or desktop suite for GIS tools and visualization, may place certain restrictions, limitations or constraints on the system of the present invention. For example, in the proposed commercial embodiment, the simulation engine 100 relies upon the ESRI ArcGIS desktop suite for GIS tools and visualization, in which case the simulation engine's deployment options may, for instance, be particularly limited if the system is migrated, for example, to a thin client interface. In its commercial implementation, however, it is expected that the simulation engine product will closely follow the ESRI deployment rollout, and it is expected that both of the listed limitations will be resolved within the next couple of years.

The simulation engine 100 is preferably architected such that the simulation controller 102 and the simulation participants 104 (described below) execute in separate processes. In order for the system to function some form of message passing must be employed. Inter-process communication is a concept that may or may not be supported by the GIS software tool, and in particular is not supported by ESRI's ArcObjects application development framework 124. A challenge in the development of the simulation engine 100 was to create a mechanism whereby messages could be exchanged between the simulation participant 104 executing as an extension to the ArcMap or other visualization application 20 and the simulation controller 102. The final solution preferably employs a combination of web services and .NET or alternative remoting. The ArcObjects framework 124, for example, currently supports the use of .NET 128 for the creation of ArcMap extensions.

The passing of a message from a simulation participant 104 to the simulation controller 102 is straight forward. The simulation controller 102 exposes a web service 127, and the simulation participant 104 invokes upon it. The .NET platform 128 makes this very easy. The reverse, passing a message from the simulation controller 102 to the simulation participant 104 (i.e. ArcMap extension) is a more complicated process. First, an ASP .NET web service exposes the methods needed by the simulation controller 102. A remotely accessible object is created in the aspwp.exe process, and a remotely accessible object is created in the simulation participant 104. The simulation participant 104 passes the aspwp.exe object a reference to the participant's remote object, and the web service delegates to the aspwp.exe object, which in turn delegates to the participant's object. The execution of the participant object's methods occurs on a thread that was allocated to accept the remote invocations. If the simulation environment 60, such as the ArcObjects framework 124, is not reentrant, this issue may be dealt with by marshalling the method executions onto the main ArcMap or equivalent thread.

Knowledge sources (i.e., the models) 40 may or may not be co-located. It is much more feasible that knowledge sources 40 will be geographically spread out among the entities that specialize in a particular infrastructure. However, this results in some variation or departure from the Model-View-Controller approach (described below), which is a well known software framework that has been adopted as the distributed architecture in many software systems, and upon which the simulation engine 100 is preferably also based. Geographic dispersal of the models 40 means that the simulation engine 100 only acts as the controller in the architecture. The simulation engine 100 can change the model and can receive notifications of changes of the model, but the simulation engine 100 preferably does not house the model 40 itself, nor does it have a view. Instead, the simulation engine 100 of the present invention relies on the external system(s) that it interacts with to be the model and the view.

The model and simulation environment must be able to utilize externally defined data models 40 that may be different than any other externally defined models 40. Therefore these disparate models 40 should be able to be represented in the simulation space in a consistent representation. A meta-knowledge approach is taken to provide a framework to allow dynamic events while identifying key interactions between model layers, reduce analyst time and cost during planning phases, identify gaps by leveraging existing knowledge of critical infrastructure interrelationships, support infrastructure component simulation behavior capture and simulation, allow configurable events (number, sequencing, timing & location) to interpreted by the solution, support changes to the infrastructure models 40, identify control and data integration issues across the infrastructure layers and allow analyst input during the execution of the simulations.

Preferably, the simulation controller agent 119 is capable of communicating with the various network controllers via the internet. In addition, external applications may require internet communication with the agent society 30, preferably via the mediator agent 118. Thus, a web services protocol 125 may be necessary to facilitate such internet communications. With XML (http://www.w3.org/XML/) becoming the prolific standard data sharing across the internet, XML Web Services (http://www.w3.org/2002/ws/) enables rich integration of distributed applications. One web services protocol suitable for use in the preferred embodiments of the present invention is the Simple Object Access Protocol ("SOAP"), utilized as the Web Services protocol 125 based on its standing in the industry as the most widely used and therefore the de-facto standard.

Detailed Design of the Major Subsystems

As stated previously, the agent society 30 and the visualization application 20 together correspond generally to the two major subsystems of the tool itself. In the following section, the agent society 30 and the meta-knowledge data 61, 62 will be referred to as the simulation controller or simulation controller subsystem 102, while the combination of the visualization application 20 and the simulation environment end user 60 will be referred to as the participant or participant subsystem 104. An overview of these two primary subsystems 102, 104 is presented next, and each of these subsystems is subsequently described in greater detail.

The main function of a participant 104 is to provide the facilities whereby a user can make his/her data available to a simulation and interact with the simulation. Said in another way, a participant 104 provides a user with the ability to participate in a simulation. For any given simulation there can be one or more participants 104. It is the job of the simulation controller 102 to provide the services (session management, time management, knowledge management, etc.) that allow a simulation to proceed with one or more participants 104.

It is envisioned the simulation engine 100 will be able to make use of data from a variety of sources. In this context, data refers to the attributes of the infrastructure entity being modeled, including specific instance-level data with rules and parameters that define the infrastructure's behavior, as well as the visualization of that behavior. For each type of data source a participant 104 may be built to adapt that data source to the simulation engine 100, but the participant 104 is preferably based on the particular GIS software tool used in the visualization application 20, and in particular, the commercial embodiment preferably facilitates ESRI-type participants 104. This arises from that fact that the so many potential customers and other users have chosen ESRI's ArcGIS as its geographic information system. Thus, the description and implementation of the participant 104 will show a strong ESRI bias. As development of the system 10 of the present invention transitions from a proof of concept to a fully functioning system, further refinement may be made with regard to the degree to which abstraction from a particular data source is or is not warranted.

The visualization application 20, such as ESRI's ArcGIS system, preferably consists of a rich set of general purpose applications that provide its users with the ability to create, view, analyze, and maintain geographic data. In the ESRI system, all of these applications are built upon a common application development framework called ArcObjects 124. ESRI uses the framework internally as the foundation upon which its applications are built. ESRI also makes the ArcObjects framework 124 available to its customers so that the customers can develop software that makes use of ArcGIS data. Additionally, the ESRI application suite (ArcMap, ArcScene, and ArcGlobe) has been designed to be extended (customized) by software developers. Taking advantage of the ArcObjects framework 124, software developers can create "extensions" that plug into the ArcGIS applications. This is a preferred path for commercial implementation of the participant 104. Doing so would allow the application development framework, such as ArcObjects 124, to be more fully leveraged, and allows end users to take advantage of both the simulation engine 100 and the capabilities of the ESRI or other visualization applications 20. In the ESRI system, the primary application that the participant 104 makes use of is ArcMap, though equivalent commercially-available or custom-developed applications may be used in alternative embodiments or implementations.

As stated previously, the participant 104 allows a user to make his/her data available to a simulation. In the commercial implementation described herein, the mechanism whereby the user chooses the data that will be used in the simulation is an ArcMap document. Because the proposed commercial implementation of the present invention utilizes ArcMap in its visualization application 20, much of the description that follows will be based on ArcMap and its related ESRI applications. However, it will be clear that other visualization applications may be substituted for the ArcMap and related applications without departing from the scope of the present invention, provided that any appropriate modifications are made to accommodate such alternative visualization applications 20. A complete explanation of ArcMap or any other specific visualization applications 20 will not be necessary for those of ordinary skill in the art and is beyond the scope of the present invention. However, in summary, ArcMap, in particular, allows a user to create a document that displays data from one or more databases. ArcMap also provides a rich set of features that allow the user to customize how the data is displayed. Once a document that incorporates the desired data sources has been created and saved it can be used again and again to run simulations against the data that it references. Whenever the ArcMap application is launched, the participant 104 is preferably automatically loaded. The participant 104 presents a GUI 180, preferably in a frame within the ArcMap or other visualization application 20 window, that will allow the user to run a simulation against the data that is referenced by the ArcMap or other document. Thus, the authoring of an ArcMap document, or the equivalent thereof, is generally a prerequisite for using the simulation engine 100.

Simulations

As used herein, "running a simulation" means allowing a user to alter the state of one or more components (for example, components of certain physical infrastructures may include substations, pumps, cell towers, and the like) of an infrastructure model 40, determine the effect that those changes have upon other components within the same infrastructure model 40 (intra-infrastructure effects) and upon components in other infrastructure models 40 (inter-infrastructure effects), and present those effects to the user. This cycle is repeated as many times as the user desires.

The act or process of running a simulation may be further explained as follows. First, the relationships between components in the same infrastructure are preferably modeled in the ESRI or other data source or model 40 by linking all of the infrastructure's components into a single network, such as by creating an ESRI geometric network. In the proposed commercial implementation, this task is a prerequisite for the simulation engine 100 and may be accomplished by using a commercially available geospatial analysis toolkit such as ESRI's ArcCatalog application. The resulting network topology establishes what is connected to what. These networks or infrastructures, which may be physical, relational or behavioral in nature, may be further distinguished by whether or not they have "directed flow". In a directed flow network, some commodity flows in one direction or the other through the network's edges and into or out of its junctions. The effect of disabling a network element is that its downstream elements no longer receive the commodity (at least not through the disabled element). For example, if the cable that connects a transformer to a substation is disabled, then the transformer will become disabled since it no longer receives electricity. Additionally, any components that are downstream of the transformer will become disabled since they too no longer receive electricity. In a network that does not have directed flow; the effect of disabling a network element does not "cascade" to the elements that are connected to it. For example, if a road element representing a portion of a road between two intersections is disabled, the intersections and the other road elements connected to them are still usable. It should be noted, however, that the ability to navigate between two given points in the road network may be affected.

Second, the relationships between components in different infrastructures are modeled by the simulation engine 100 through the use of "rules". Rules are input provided by a user (or perhaps a subject matter expert) to the simulation engine 100. Information about some of the various types of inter-infrastructure relationships that the simulation engine 100 may support, as well as an explanation of exemplary rule semantics that may be used to express those relationships, are provided in the more detailed explanation of the simulation controller 102 herein. Also, it will be noted that the use of rules to express inter-infrastructure behavior is central to the capabilities of the simulation engine 100 and is one of the most fertile areas for additional development.

Third, in the proposed commercial implementation, the only component state that the simulation engine 100 currently allows the user to modify is the "enabled" property. This is a property that is preferably guaranteed to exist for any ESRI or other geometric network or infrastructure feature class (i.e. component type). In a simplified embodiment, this is a Boolean attribute, wherein if the value of a component's enabled property is set to true then it is considered to be 100% functional, and if the value of a component's enabled property is set to false then it is considered to be 0% functional. Thus, as used hereinbelow, "enabling" an infrastructure component shall be understood to mean setting its enabled property to true, and "disabling" an infrastructure component shall be understood to mean setting its enabled property to false. However, it will be apparent that in an alternative embodiment, not further described here, the "enabled" attribute may instead take the form of a numerical percentage of from 0% enabled to 100% enabled.

It is the job of the participant 104 to manage user interaction, data access, and intra-infrastructure effects. It is the job of the simulation controller 102 to manage inter-infrastructure effects. In terms of the Model/View/Controller (MVC) framework (a software industry standard for the separation of responsibilities within a software system), the participant subsystem 104 is responsible for the Model and the View roles, and shares responsibility of the Controller role with the simulation controller subsystem 102. In the proposed commercial embodiment, the simulation controller 102 preferably executes in a Java Virtual Machine 130, and the participant 104 runs as a plug-in inside the ArcMap application. As described in greater detail hereinbelow, these two processes exchange messages in order to accomplish the work of running a simulation.

Using an appropriately authored document (such as, in the proposed commercial implementation, an ArcMap-based .mxd file), the visualization application 20 produces a two dimensional, map like visualization of the infrastructures modeled by the user's data. Using the information in the map document the participant 104 is able to locate the user's data sources. The participant 104 manages access to this data for its own internal, intra-infrastructure operations as well as for the simulation controller's inter-infrastructure operations. Whenever changes are made to the model the participant 104 informs its own internal, intra-infrastructure effects controller and also informs the simulation controller 102. In other words, the participant controller 116 manages the model.

The participant 104 preferably makes use of the visualization application's map display to obtain user input and to present simulation results. By clicking upon the map's visual representations of the individual infrastructure components the user is able to indicate to the participant 104 which components he/she wants to operate upon (i.e. which components to disable). The participant 104 modifies the visual representation of infrastructure components (i.e. causes disabled components to be highlighted) to indicate to the user the simulated effects of his/her operations. In other words, the participant 104 manages the view role.

When the user disables an infrastructure component, the participant's internal, inter-infrastructure effects controller or infrastructure agent 109 will begin to determine the inter-infrastructure effects. Simultaneously, the simulation controller 102 will begin to determine the intra-infrastructure effects. The model changes resulting from those effects will trigger another round of effects. This iterative process continues until the model settles into a steady state. In other words, the participant 104 and the simulation controller 102 cooperate to control the progress of a simulation. In the following sections, each subsystem 102, 104 is described in greater detail.

The simulation controller 102 is the core of the simulation engine 100 and is thus responsible for: managing the lifecycle of a simulation session, controlling the simulation time clock, and implementing the cross-infrastructure behaviors. The simulation controller 102 is implemented as a set of software agents implemented and hosted in the selected agent platform. The simulation controller 102 is primarily responsible for the "Controller" role in an MVC-type architecture.

Figure 8:
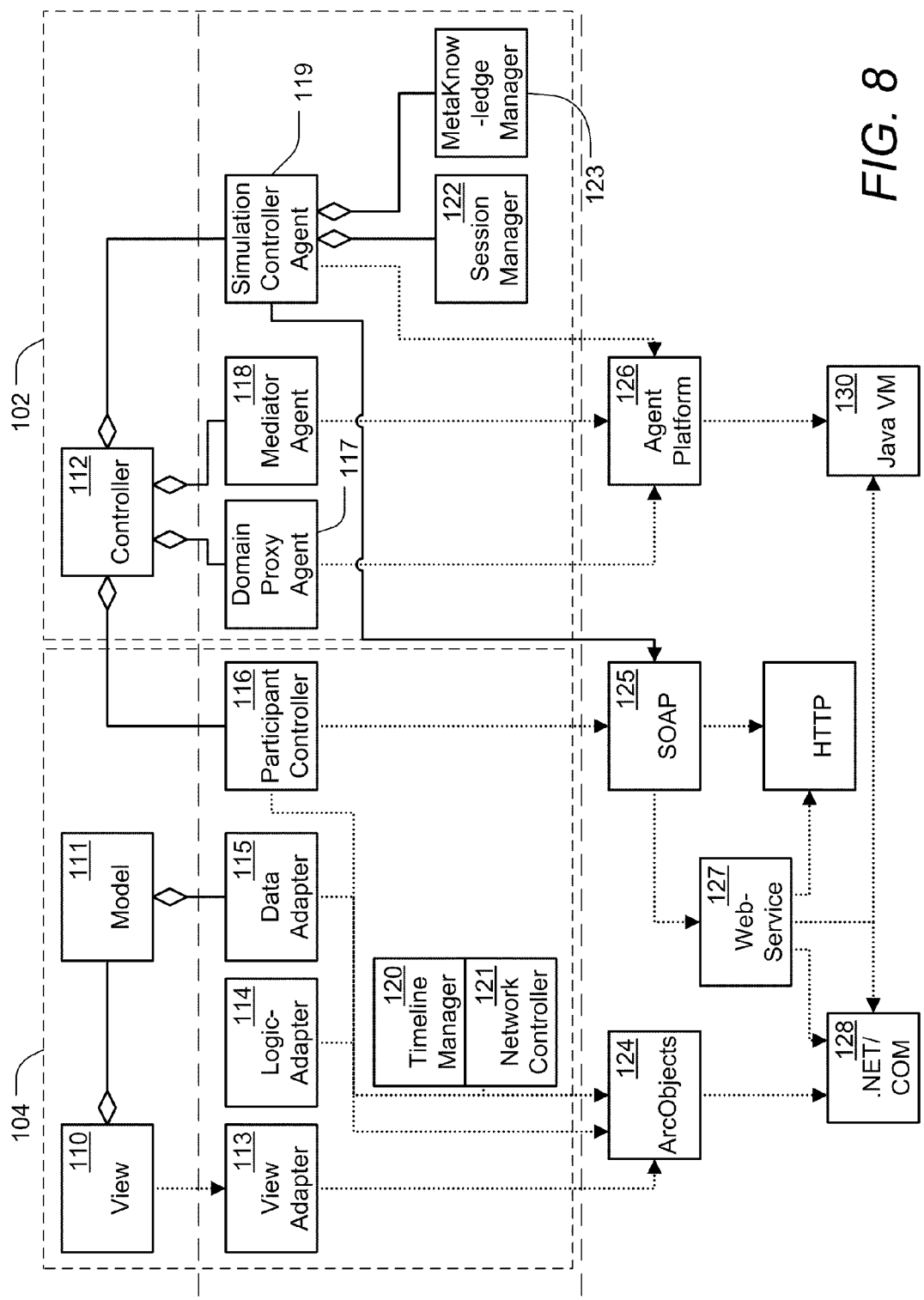
FIG. 8 is a more detailed block diagram of the MVC architecture of the simulation engine, in accordance with the preferred embodiments of the present invention, illustrating the relationship of the architecture to the various software layers.
Figure 9:
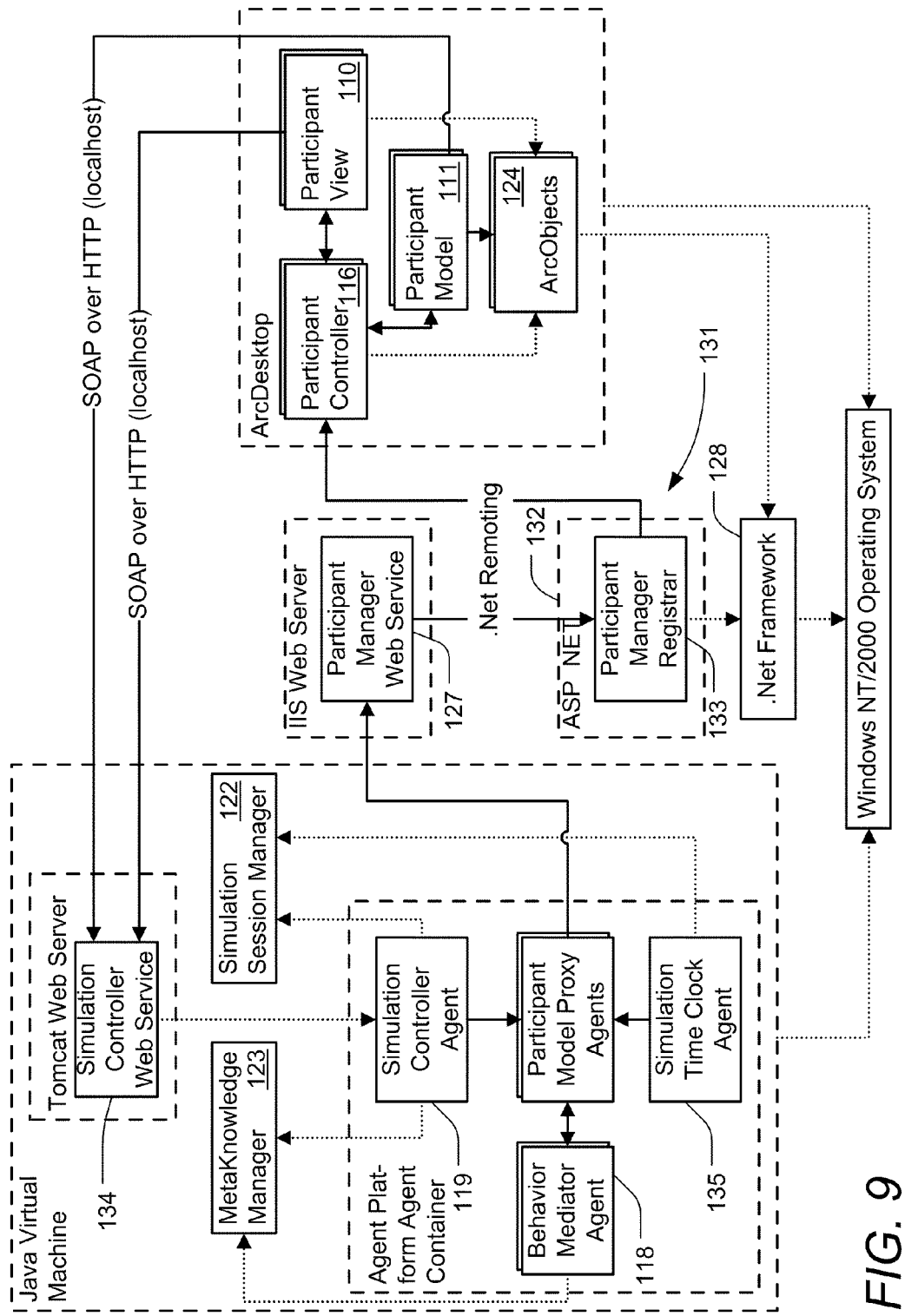
FIG. 9 is a still more detailed block diagram of some of the primary components of the simulation engine, illustrating their physical implementation.

FIG. 8 is a more detailed block diagram of the MVC architecture of the simulation engine 100, in accordance with the preferred embodiments of the present invention, illustrating the relationship of the architecture to the various software layers, while FIG. 9 is a still more detailed block diagram of some of the primary components of the simulation engine 100, illustrating their physical implementation. Details of the primary subsystems of the simulation engine 100 will next be described with reference to FIGS. 8 and 9.

Simulation Controller Subsystem

The simulation controller web service 134 binds the simulation controller 102 as a standard HTTP Web Service thus exposing a discrete set of externally accessible service methods which are designed to be utilized by simulation participants 104. In the proposed commercial embodiment, the simulation controller web service 134 may be implemented as an agent in the selected agent platform and is actually just a façade which delegates incoming service method calls to the simulation controller's various internal components (including other agents) which actually perform the work. The simulation controller's internal components to which the simulation controller web service 134 delegates its service methods calls include the simulation session (lifecycle) manager 122, the simulation (time) clock agent 135, the metaknowledge (registrar) manager 123, and domain proxy agents 117, all of which will be explained in greater detail in the following sections.

The simulation clock agent 135 is an internal component of the simulation controller 102. In order to understand the role of the simulation clock agent 135 it is necessary to understand the fundamentals and philosophy of time management in the simulation engine 100. The actual real-world time when a simulation session is executed is called "wallclock time" while the virtual time of the system (collection of infrastructures) being modeled by the simulation is referred to as "simulation time". Whereas wallclock time advances in a truly analog fashion, simulation time advances digitally in discrete simulation time clock units called "ticks". Each simulation session has a "simulation time units" setting which can be a multiple of seconds (1, 5, 10, 60 etc.) or evenly divisible fractions of a second (0.01, 0.1, 0.2, 0.5, etc.) The simulation clock agent 135 is the component of the simulation controller 102 that maintains simulation time for a simulation session and advances the simulation time in clock tick units. For example, if the simulation time units setting is 0.1, then it takes ten ticks of the simulation clock for simulation time to advance just one second and the maximum granularity of the timestamp of any event which happens during the that simulation session is 1/10th of a second.

Figure 10:
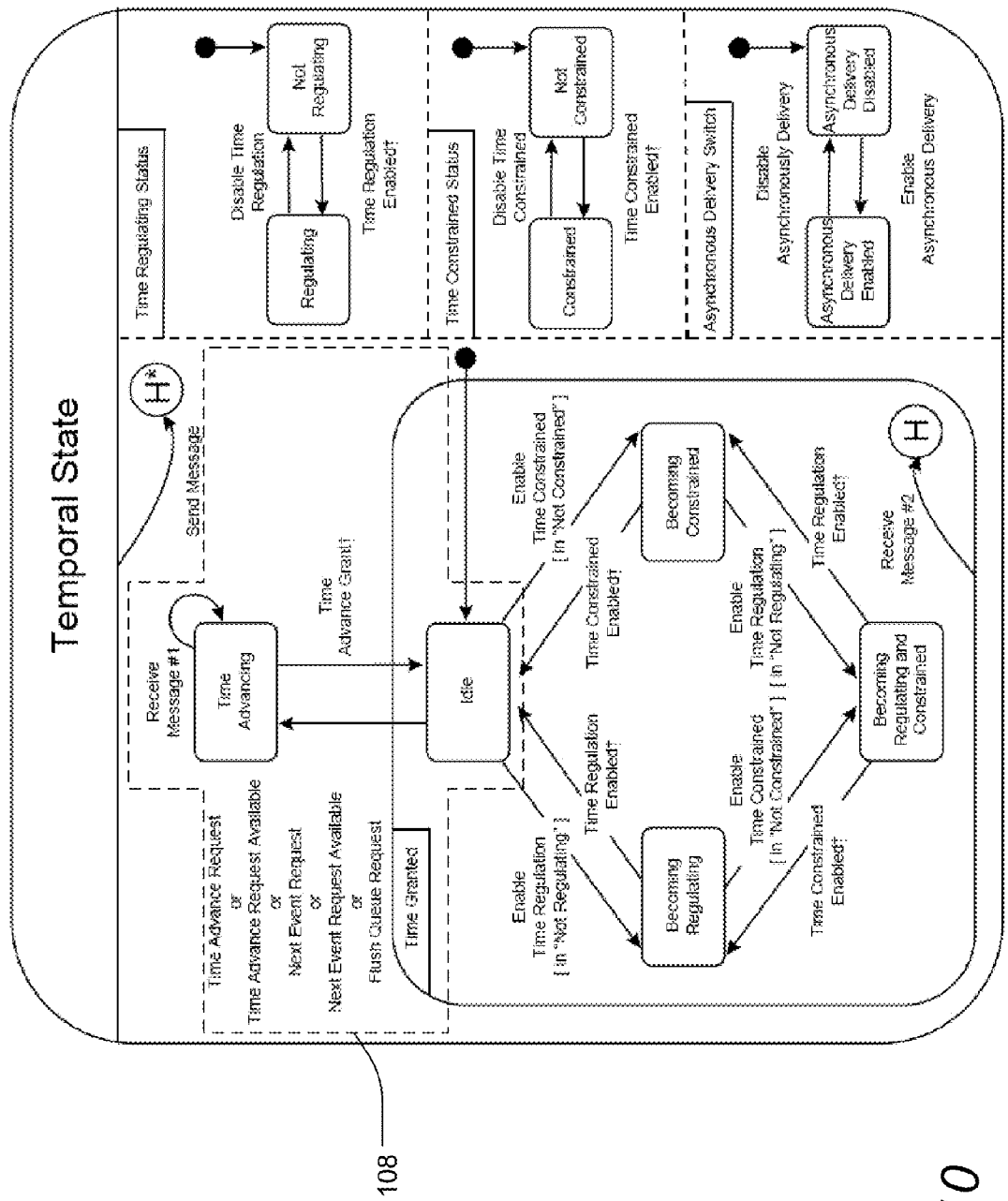
FIG. 10 is a block diagram of portions of the HLA specification showing the time management service methods provided by the simulation session manager.

As used herein, the term "lifecycle" refers to the creation, dynamic control, modification, and deletion of a simulation session in the simulation engine 100. The simulation session manager 122 is the component in the simulation controller 102 which controls this lifecycle. At least some of the service methods of the simulation session manager 122 are preferably designed to correspond to a selected subset of functionality from the Runtime Infrastructure (RTI) portion (currently available at https://www.dmso.mil/public/transition/hla/rti) of the High Level Architecture ("HLA") (https://www.dmso.mil/public/transition/hla/) standard simulation specification that has been adopted, adapted, endorsed and provided by the Defense Modeling and Simulation Office (DMSO) (https://www.dmso.mil/). In particular, the service methods of the simulation session manager 122 are preferably designed to correspond to the HLA Time Management service specification (currently available at http://www.sisostds.org/stds-dev/hla/). FIG. 10 is a block diagram of portions of the HLA specification 106 showing the time management service methods 108 provided by the simulation session manager 122. Service methods preferably include coverage for time advance requests, next event requests, time advance grants, query federate time and query minimum next event time, which are currently addressed by sections 8.8, 8.10, 8.13. 8.17 and 8.18 of the HLA.

The simulation session manager 122 preferably offers specific service methods such as those next described. These service methods are actually called indirectly via the simulation controller 102, which then delegates the appropriate calls to simulation session manager 122.

| | |
|---|---|
| createSession | Creates a new simulation session and adds it to the set of active simulation sessions. The session is created with the following parameters: a unique name; an initial time for the simulation clock; and "simulation time units" as described hereinabove. Each simulation session created by this method shall be independent of all other simulation sessions, and there should be no inter-communication within the simulation controller 102 between simulation sessions. |
| joinSession | Requests the caller participant's participation in existing active simulation session (previously created by a "createSession" call). The session is joined with the following parameters: a "domainName" which uniquely identifies the joining participant 104; and the unique name provided when session was created using the preceding createSession call. All participants 104 should join the simulation session, including the participant 104 which created the session. A result of the joinSession call is a "participantHandle" which is required as a parameter to many other service method calls to both the simulation controller 102 and to the participant controller 116. The participantHandle is a uniquely generated string of letters and numbers, that act as a security key which identifies a specific participant's participation in a specific active simulation session. |
| resignFromSession | Used to request cessation of session participation for a session participant 104. Before resigning, all pending time-stamp-ordered messages for the participant 104 are flushed from the message queue. The single parameter to this call is the participantHandle, which after this call shall be invalidated. |
| destroySession | Removes a simulation session from the simulation controller's set of active simulation sessions. All session activity should stop and all participants 104 should resign before a call to this method succeeds. The single parameter to this call is the name used to create the simulation. |
| isIdle | Indicates if any of the following conditions is true: 1) a software agent in the simulation controller 102 is currently executing for the session, 2) there are any messages pending for any session participant 104, and/or 3) any participant 104 indicates that it is not idle. The single parameter required for this service method call is the participantHandle. |
| timeSetRequest | Informs the simulation session manager 122 that the calling participant 104 has finished processing any work it has for the current tick of the simulation time clock and thus the participant 104 is idle. The parameters to this service method are the participantHandle and the specific time to which the time clock should be advanced (a special time value of infinity indicates a request to advance the time clock to the next tick instead of an absolute time value). Before the simulation session manager 122 can advance the simulation time clock all participants 104 which have joined the simulation session should indicate that they are currently idle by calling timeSetRequest. If all participants 104 are idle then the simulation time clock is advanced to the earliest time requested of all of the participant's calls to the timeSetRequest service method. The earliest time which can ever be requested is the next clock tick. |
| getSimulationTimeUnits | Returns the number of seconds which the simulation time clock is advanced for each simulation clock tick. The single parameter to this call is the participantHandle. |
| getSessionInitialTime | Returns the initial simulation time set when the simulation session was created. The single parameter to this call is the participantHandle. |
| getSimulationTime | Returns the current simulation time of from the simulation time clock. The single parameter to this call is the participantHandle. |
| setExecutionRate | Changes the rate at which the simulation time clock advances relative to wallclock time. The parameters to this call are the participantHandle and the new execution rate. There is no discontinuity in the value of execution time; it flows smoothly from the current rate to the new rate. Unless changed by a call to this service method the execution rate for a simulation is 1.0 which indicates that the simulation-time will advance at the same rate as wallclock time. An execution rate of 2.0 will make the simulation time advance twice as fast as wallclock time, whereas an execution rate of 0.5 will make the simulation time advance half as fast as wallclock time. |
| getExecutionRate | Returns the current rate at which simulation time advances. The single parameter to this call is the participantHandle. |

The flexibility of the simulation controller 102 is achieved by using rigorously defined configuration information which is referred to as "meta-knowledge". The meta-knowledge is composed of a set of discrete units which are called meta-knowledge entries. Meta-knowledge entries can be easily expressed in XML, which makes them human-understandable as well as machine-understandable. When the simulation controller 102 is started, the meta-knowledge manager component 123, which maintains a runtime meta-knowledge registry 129 of all of the meta-knowledge used by the simulation controller 102, reads in the initial set of meta-knowledge from an XML file, and adds the meta-knowledge entries contained therein to the runtime meta-knowledge registry 129. Whenever this file is altered, the meta-knowledge manager 123 re-reads this file, adding any new entries to the runtime meta-knowledge registry 129 and updating any changed entries.

Although the kind of meta-knowledge which the simulation controller 102 can interpret is not limited, in order for the meta-knowledge to be intelligently understood by the simulation controller's software agents, each meta-knowledge entry must adhere to a specific data structure and basic format as well as to a set of predefined and required attributes. By requiring a minimum set of attributes, the meta-knowledge manager 123 may be easily queried for the meta-knowledge entries which meet certain criteria. The set of predefined attributes preferably include "entryType," "className," "domainName," and "networkName." Each meta-knowledge entry is required to have an entryType and a className attribute and, and may optionally have a domainName and/or a networkName. The entryType (e.g., classNaming, networkLatency, serviceProvider, serviceSubscriber, networkFlow) indicates the kind of meta-knowledge that the entry specifies and is determine by the author of the logic which will utilize the meta-knowledge, while the remaining predefined "name" attributes have a naming hierarchy which allows the names to indicate, with varying degrees of specificity (qualification), the intended system entities to which a specific meta-knowledge entry should be applied. This naming approach allows the simulation engine 100 to work in a broad context or a specific context. The meaning of the names and their formats are described below.

In the simulation engine 100 of the present invention, a "className" refers to the name of a category of similar entities all of which have the same properties (attributes) albeit different values. A className name has the following structure:

[[catalog-part|]namespace-part|]local-part

When only the required <local-part> portion is specified, the operation or data applies to any instance of a class with a name of <local-part>, regardless of the namespace or catalog. When the optional <namespace-part> portion is specified in addition to the <local-part>, then the operation or data applies to any instance of a class with a name of <local-part>, defined in the namespace specified by <namespace-part>, regardless of the catalog. Further, if the optional <catalog-part> portion is specified in addition to the <namespace-part> and the <local-part>, the operation or data applies to instances of classes in the catalog specified by <catalog-part>, in the namespace <namespace-part>, and that have a name of <local-part>. An illustrative mapping of ESRI class names to the parts of the className are as follows:

| | |
|---|---|
| catalog-part | Windows operating system file path to the Geodatabase |
| namespace-part | ESRI Feature Dataset within a Geodatabase |
| local-part | ESRI Feature Class within a Geodatabase |

A Windows OS example of a fully-qualified (most specificity) className for a feature class in ESRI or other applications is:

C:\Simulator\Data\Mecklenburg\EP.mdb|EP_Network| Substations where C:\Simulator\Data\Mecklenburg\EP.mdb is the <catalog-part> part, EP_Network is the namespace-part and Substations is the <local-part>.

In the simulation engine 100 of the present invention, a "networkName" refers to the name of a group of interrelated entities which collectively accomplish a finite set of goals. A networkName name has the following structure:

[[catalog-part|]namespace-part|]local-part

When only the required <local-part> portion is specified, the operation or data applies to any instance of a network with a name of <local-part>, regardless of the namespace or catalog. When the optional <namespace-part> portion is specified in addition to the <local-part>, then the operation or data applies to any instance of a network with a name of <local-part>, defined in the namespace specified by <namespace-part>, regardless of the catalog. Further, if the optional <catalog-part> portion is specified in addition to the <namespace-part> and the <local-part>, the operation or data applies to instances of networks in the catalog specified by <catalog-part>, in the namespace <namespace-part>, and that have a name of <local-part>. An illustrative mapping of ESRI entities names to the networkName parts are as follows:

| | |
|---|---|
| catalog-part | Windows operating system file path to the Geodatabase |
| namespace-part | ESIR Feature Dataset within a Geodatabase |
| local-part | ESRI Geometric Network within a Geodatabase |

A Windows OS example of a fully-qualified (most specificity) networkName for a geometric network in ESRI or other applications is:

C:\Simulator\Data\Mecklenburg\EP.mdb|EP_Network| EP_Network_Net where C:\Simulator\Data\Mecklenburg\EP.mdb is the catalog-part, EP_Network is the namespace-part and EP_Network_Net is the local-part.

In the simulation engine 100 of the present invention, a "domainName" refers to the web service access URL of a participant 104 which interacts with the simulation controller 102. The domainName conforms to the W3C Web Service standard format for a qualified name and has the following structure:

[{namespace-part}]local-part

When only the required <local-part> portion is specified, the operation or data applies to any instance of a web service domain with a name of <local-part>, regardless of the namespace. When the optional <namespace-part> portion is specified in addition to the <local-part>, then the operation or data applies to any instance of a web service domain with a name of <local-part>, defined in the namespace specified by <namespace-part>.

An illustrative mapping of Microsoft 11S Web Service participant name to the domainName parts are as follows:

| | |
|---|---|
| namespace-part | The IIS-hosted Participant Manager Web Service URL |
| local-part | The name of the participant 104 managed by the participant manager 131 |

An example of a fully-qualified (most specificity) networkName for a geometric network in ESRI or other applications is:

{http://localhost/SimulatorWebSvc/ParticipantMgr.asmx}Mecklenburg where http://localhost/SimulatorWebSvc/ParticipantMgr.asmx is the base URL of the Microsoft IIS web service 127 and Mecklenburg is the name of the participant controller 116. It will be noted, however, that although { } characters are used to delimit the namespace-part from the local-part, a domainName can be easily converted into a W3C standard URL format, such as:

http://localhost/SimulatorWebSvc/PartMgrSvc.asmx/Mecklenburg

The service methods of the meta-knowledge manager 123 are described below:

| | |
|---|---|
| addEntry | Adds or updates a meta-knowledge entry to the runtime meta-knowledge registry 129. The entry is added with the following parameters: participantHandle; entry Type; networkName; className; and specificsXML. |
| removeEntries | Removes all meta-knowledge entries which match a specified criteria from the runtime meta-knowledge registry 129. The parameters used to remove entries preferably include participantHandle, entryType, networkName, className, and specificsXML. |
| findEntries | Returns all meta-knowledge entries from the runtime meta-knowledge registry 129 which match a specified criteria. The parameters used to find the entries preferably include participantHandle; entryType; networkName; className; and specificsXML. |

Mediator Agents

The simulation engine 100 models inter-infrastructure relationships (for example, electrical transformers to gas pumps) through the use of rule categories and associated behaviors (logic modules). When the state of an infrastructure component changes, each rule category is examined to determine whether or not the rule category contains a rule for the affected component's class. In other words, each type of relationship is examined to determine whether or not the component's class participates in that type of relationship. If the component's class does, in fact, participate in the relationship, then the associated behavior will be executed. The behavior uses the rule to determine what components are related to the affected component. The behavior then modifies those related components appropriately. In other words, the behavior generates the interinfrastructure effect.

Mediator agents 118 are responsible for receiving property change events, examining rule categories, and executing relationship behavior. All of the property change events that the simulation controller 102 receives from the simulation participants 104 will ultimately be routed to a mediator agent 118 for processing. Mediator agents 118 allow the load of processing property change events to be distributed across multiple threads, processes, and CPUs. Mediator agents 118 host the interinfrastructure behaviors in the form of plug-ins. As used herein, the term "plug-in" describes an independent, logic module that is contained by an agent. All mediator agents 118 contain a complete set of inter-infrastructure relationship behavior plug-ins. Thus, any mediator agent 118 can completely handle the processing of any property change event.

When a mediator agent 118 receives a property change event it will pass the event in turn to each of the behavior plug-ins that it is hosting. Each behavior will have an opportunity to examine the property change; this reflects the reality that a given component class can participate in multiple relationships. Behavior modules make use of the services of the simulation controller's meta-knowledge manager 123 to search the rules knowledge base. Behavior modules make use of the services of simulation participant's participant controller 116 to perform spatial queries, run network solvers, and change the state of any affected components. Preferably, the simulation engine 100 supports at least three categories of inter-infrastructure relationship behavior, including provider/subscriber relationships, network flow relationships, and goods producer/consumer relationships. These respective relationships are described next.

The first preferred type of inter-infrastructure relationship, the "provider/subscriber" relationship, is used to model the flow of an infrastructure's "native commodity" (electricity in the case of a power distribution system, water in the case of a water utility system, etc.) to components that are in other infrastructures [components in the same infrastructure (network) receive the commodity via the network's inherent flow]. Said another way: a provider/subscriber relationship is used to model the dependency of components of one class (the subscribers) upon some type of service provided by components of another class (the providers). For example: a provider/subscriber relationship can be established between transformers and buildings wherein transformers provide electricity to buildings. In the absence of data for the physical connection between a subscriber and a provider, the provider/subscriber behavior model establishes a "virtual" connection. The provider/subscriber behavior module makes use of provider rules and subscriber rules. For every provider of a service there will be a provider rule that names the providing component's class, the service provided, and a maximum distance beyond which a given provider cannot provide the service (i.e., the subscribers related to a given provider must all fall within the circle for which the center point is the provider and the radius is that maximum distance). For every subscriber to a service there will be a subscriber rule that names the subscribing component's class, the service subscribed to, and a maximum distance beyond which a given subscriber cannot obtain the service (i.e., the provider related to a given subscriber must fall within the circle for which the center point is the subscriber and the radius is that maximum distance). In order for a subscriber to be related to a provider their separation must not exceed the minimum of the two distance specified in their respective rules. Additionally, if, for a given subscriber, there is more than one provider that meets the separation criteria then that subscriber's provider will be taken to be the one that is closest to it (if there is a tie then an arbitrary choice is made).

When the provider/subscriber behavior module receives a property change event it will take the following steps. First, the module determines what services, if any, are provided by the affected component's class. The module then determines, for each of those services, which component classes are subscribers to the service, and for each of those component classes, which instances are the subscribers to the affected provider. The module then disables those subscribers.

The second type of inter-infrastructure relationship, the "network flow" relationship, is used to model the connection between infrastructure features. For example, data representative of the railway system in a first geographic region, such as a U.S. county, may be joined to data representative of the railway system in a second, adjacent region. With network flow a relationship is established between a "source" component and one or more "sink" components; the infrastructure's native commodity (electricity, water, traffic) flows from the source to the sinks. When the network flow behavior module receives a property change event it will examine the meta-knowledge to determine whether or not the affected component plays the source role in any network flow relationship. If it does, then the corresponding sink components are disabled.

The third type of inter-infrastructure relationship, the "goods producer/consumer" relationship, is used to model the dependency of components of one class (the consumers) upon some type of goods supplier by components of another class (the producers), where the goods must be transported from the producer to the consumer with, optionally, some maximum cost. The transportation of the goods occurs via a transportation network (infrastructure). What constitutes a valid transportation network for the transport any given goods depends upon the nature of the goods. For example, bales of cotton could be transported using a rail network or a road network (to name a couple). For another example, intelligence could also be transported on road or rail networks (in the form of written documents or word of mouth). Additionally, intelligence could be transported on a telecommunications network. As used herein, the term "native transport" denotes the situation where the producer and the consumer are nodes on the same network and that "native" network is used to transport the goods. In the example of the cotton bales, if a baling facility (the producer) and a textile mill (the consumer) are both nodes on a road network, and that native network is used to transport the cotton bales, then native transport will have occurred. Also as used herein, the term "transshipment" denotes the situation where a network other than the producer/consumer's native network will be used to transport the goods. In the example of the cotton bales, if the bales are transported by rail, then transshipment will have occurred. Finally, as used herein, the term "access point" denotes the point on a transshipment network at which a producer or a consumer will gain access to the network. The points along the rail network at which the cotton bales are loaded onto and unloaded from rail cars (most likely rail yards) are the access points for our cotton bails example. Notably, access points do not need to be specified for native transport since they are "built in" by the producer/consumer's hardwired connection to its native network.

The producer/consumer behavior model makes use of producer rules, consumer rules, and access point rules. For every producer of goods there will be a producer rule that names the producing component's class, the goods produced, the network that can be used for transshipment, whether or not native transport is allowed, the maximum shipment cost, and the maximum network access distance. For every consumer of goods there will be a consumer rule with the same attributes as producer rules. For every network that is to be used for transshipment, one or more access point rules must be specified. An access point rule specifies a transshipment network, a network component class that can be used to access the network, and a maximum access distance. Access distances are used to determine how close to an access point a producer/consumer must be to an access point in order to be able to make use of it. The distance between a producer/consumer and an access point must not exceed the lesser of the maximum access distances specified in the producer/consumer rule and the access point rule.

Still using the example of the cotton bales, the producer/consumer behavior model takes the following steps in processing a property change event. First, a component disabled event is received for a baling facility, and it is determined that baling facilities the produce cotton bales, that textile mills consume cotton bales, that baling facilities and textile mills are both on a roadway network and that native transport is allowed. A request is sent to the simulation participant 104 asking it to find the least cost path between the baling facility and the textile mill. The response from the participant 104 indicates that the cost of the least cost path is X. If it is determined that X does not meet the maximum allowable cost criteria, then transshipment will be attempted by first sending a request to the simulation participant 104 asking it to find the rail yard that is closest to the baling facility. This is repeated for the textile mill. It is also determined that the baling facility and the textile mill are both close enough to a rail yard to allow transshipment to occur, and a request is sent to the simulation participant 104 asking it to find the least cost path between the two rail yard access points. The participant's response indicates that the cost of the least cost path is Y. Finally, it may be determined that Y does not meet the maximum allowable cost criteria, in which case that textile mill may be disabled.

New categories of inter-infrastructure relationships can preferably be added easily, including ones more neatly tailored to relational or behavioral infrastructures. The rules meta-knowledge is stored as XML text. The mediator agent 118 can be configured to load additional behavior plug-ins.

Participant Subsystem

The simulation participant subsystem 104 preferably includes a participant manager 131, a participant controller 116, a timeline manager 120, a network controller 121, a recorder-player control (not shown), a data adapter 115, a view adapter 113, an input adapter (not shown), and a logic adapter 114. Each of these components is described in greater detail in the following sections.

The participant manager 131 makes it possible for the simulation controller 102 to send messages to any of the participants 104 that have joined one of the Controller's currently active simulation sessions. The participant manager 131 is preferably made up of an ASP .NET web service 132 and a registrar object 133. The registrar 133 is a singleton that is preferably hosted by the ASP worker process or the equivalent thereof and is exposed for access by external processes via .NET remoting 128. When a participant 104 joins a simulation session one of the pieces of information that it provides to the simulation controller 102 is the URL of its participant manager (this URL is a configurable item for participants 104). The simulation controller 102 will respond by providing the participant 104 with a unique identifier. The participant 104 will subsequently use that unique identifier to register with its participant manager 131. In order to register with its participant manager 131, the participant 104 will preferably perform several steps. First, the participant 104 accesses the web service 132 of its participant manager 131 and obtains the URL of the registrar 133. Then the participant 104 uses the URL of the registrar 133 to acquire a remote reference to the registrar 133, and finally registers with the registrar 133 by passing it the unique identifier obtained from the simulation controller 102 and a remote reference to the participant controller 116.

The participant manager 131 will store the unique identifier and the remote reference. When the simulation controller 102 needs to send a message to a particular participant 104 it will preferably send the message to the web service 127 of the participant's manager 131 and will include with it the participant's unique identifier. The participant manager 131 will use the unique identifier to lookup the remote reference to the participant controller 116 and will then dispatch the message to the participant controller 116.

The participant manager's web service 127 exposes methods exposed by both participants 104 and by the simulation controller 102 (and implemented by the participant's controller 116). Methods used by participants 104 should preferably include: RegistrarUrl, which is used to obtain the URL of the registrar 133, which is a singleton that is instantiated the first time that any participant 104 accesses this method; RegisterParticipant, which is used to register with the participant manager 131; and UnregisterParticipant, which is used to unregister with the participant manager 131. Methods used by the simulation controller 102 (and implemented by the participant's controller 116) should preferably include: findObjects, which is used to find all objects of the given class that match the specified criteria; changeProperty, which is used to change the specified property on objects of the specified class and with the specified IDs; setTime, which is used to set the current simulation time to the specified value; and setExecutionRate, which is used to set the current simulation's rate (2× real time, 0.5× real time, etc, and zero means pause).

The participant controller 116 provides the methods used by the simulation controller 102 to send messages to the participant 104. It exposes the necessary interface for remote access and passes a remote reference to the participant manager 131 at session join time, as described elsewhere herein.

The participant controller 116 also provides a internal registration service. When the participant 104 joins a simulation session it will call upon the participant controller 116 to perform the necessary registrations. First the participant controller 116 registers the participant 104 with the simulation controller 102. This should preferably be accomplished by first informing the simulation controller 102 of the entire set of infrastructure component types contained within the participant's data sources. This information will allow the simulation controller 102 to ascertain whether or not a given inter-infrastructure relationship rule applies to this participant 104. The participant controller 116 may then obtain, from the simulation controller 102, the propagation delay meta-knowledge for all of those same components. This information will be used by the participant's network controller 121 when it generates the intra-infrastructure effects.

Once the participant controller 116 has registered the participant 104 with the simulation controller 102, the participant controller 116 next registers the participant 104. It is the participant controller 116 which exposes the remote interface that is used by the participant manager 131 to route messages from the simulation controller 102. Other subsystems within the participant 104 that are responsible for handling those messages will register with the participant controller 116 to receive events when the messages arrive. Finally, the participant controller 116 registers with the data adapter 115 to receive property change events so that it can notify the simulation controller 102 of changes to the model.

The timeline manager 120 is responsible for the handling the simulation time (as opposed to wallclock time) based sequencing of events within a participant 104. The simulation clock is managed by the simulation controller 102.

The concept of time preferably shows up in two ways within a participant 104. First, the user drives the simulation by disabling one or more infrastructure components in order to observe the effects. The participant 104 provides the user with the ability to schedule the disabling of a component at some future time. Second, the simulation engine 100 may support the notion of a "propagation delay" which creates time-based behavior within a simulation. Whenever it becomes necessary to disable a component, due to either inter-infrastructure or intra-infrastructure effects, the actual disablement of the component will be delayed by an amount of simulation time equal to its propagation delay, if any. This can be used to model the behavior of a component such as, for example, a water pump with a backup generator that can continue to operate for some period of time after its supplier of electricity is disabled. In the first proposed commercial embodiment of the simulation engine 100 of the present invention, propagation delays cannot be qualified by type of service. In other words, the pump's propagation delay will be brought into play regardless of whether it is being disabled because its supply of electricity has been removed or because its upstream supply of water has been removed. However, subsequent embodiments of the simulation engine 100 may provide this feature.

It is the timeline manager 120 that makes this time based behavior possible. The disabling of infrastructure components is an operation that is performed exclusively by the timeline manager 120 and the network controller 121. Any other element of the participant subsystem 104 that determines that an infrastructure component needs to be disabled will ask the timeline manager 120 to perform the operation. The timeline manager 120 keeps track of all the components to be disabled and the time at which the disabling should occur: now or in the future. The timeline manager 120 sends a message to the simulation controller 102 whenever it has completed all of the processing that it needs to perform at the current time. When the simulation controller 102 advances the clock it notifies all participants 104. The timeline manager 120 receives the message and performs whatever processing is required for the new current time.

The network controller 121 is responsible for generating the participant's intra-infrastructure effects. Whenever the simulation time changes, the timeline manager 120 will notify the network controller 121. The network controller 121 will in turn begin to ask the timeline manager 120 to give it the next component that needs to be disabled "now". The network controller 121 will disable the component and will then check to see if the component belongs to a directed flow infrastructure. If it does then the network controller 121 will examine the downstream components that are connected to it. If any of those components no longer have flow then the network controller 121 will give them to the timeline manager 120 which will schedule them for disablement. Note that any of those components that do not have a propagation delay will again come to the network controller 121 as it continues to ask the timeline manager 120 for the objects that need to be disabled "now". As this cycle continues, the network controller 121 will work its way through the infrastructure until there are no more components that have both no flow and zero propagation delay.

The participant view 110 is a recorder-player that functions as the participant's primary user control. It is the control that is used to actually run a simulation. As a simulation runs, a recording of it is created that can be saved to the file system and played back at some later time, hence the name recorder-player.

The participant view or recorder-player 110 allows the user to execute commands that control the execution of a simulation. The user can create a new simulation, run it, pause it, schedule components for disablement, stop the simulation, save the recording of the simulation, and close the simulation. The participant view or recorder-player 110 interacts with the other components of the participant 104 in order to execute the user's commands. The user can also open and play back a simulation that was previously executed and saved.

As a simulation runs, the participant view or recorder-player 110 records all of the model changes that occur during the course of the simulation. In addition to being presented on the map, these changes are preferably presented to the in a simulation timeline based tree list (an example of a tree list is the left and pane of the Windows Explorer (or equivalent) window wherein the user can examine the file system's folder hierarchy). The outer most (left most) nodes in the tree correspond to points on the simulation timeline. These timeline nodes can be expanded to examine the events that occurred at that time of the simulation. Selecting an event caused additional detail concerning it to be displayed in the box immediately below the tree view.

The data adapter 115 is responsible for providing a model access interface for use by the other participant subsystems 104 that allows them to perform model operations such as getting and setting properties using a generic Application Program Interface ("API"). The use of a generic API shields the majority of the participant 104 from the particulars of the model access API 50 used by ArcObject or other visualization application 20, thus making it easier to adapt the participant 104 to other platforms. The data adapter 115 provides property change notification to the rest of the participant's subsystems 104. Interested subsystems can register with the data adapter 115 and will receive property change events whenever the model is modified.

The view adapter 113 is responsible for providing a display interface for use by the other participant subsystems 104 that allows them to perform display operations such as drawing and refreshing using a generic API. The input adapter is responsible for providing an input interface for use by the other participant subsystems 104 that allows them to perform input operations such as selecting infrastructure components using a generic API. The logic adapter 114 is responsible for providing a logical operations interface for use by the other participant subsystems 104 that allows them to perform logical operations such as special queries and network traces using a generic API.

The simulation engine 100 is designed to perform system-of-systems analyses that simulate the cascading and escalating effects of critical infrastructure interdependencies which are triggered by given a specific set of initiating events. The simulation engine 100 performs its analyses using intelligent software agents that use analysis rules which are declared in a knowledge base. The simulation engine 100 can be configured to use virtually any set of physical, relational or behavioral infrastructures in the form of an ESRI geodatabase or the equivalent thereof, as well as any set of analyses rules.

Meta-knowledge management is repository-based subsystem. Based on a common format, new rule types can be introduced into the system. Different types of rules can be handled by creating the appropriate meta-knowledge state classes and plugin behavior that know how to process the corresponding meta-knowledge rules. Plugins may include, for example, service provider subscriber interaction plugins, explicit network flow interaction plugins, future industry interaction plugins, and the like. The plugins query the meta-knowledge registry 129. Via the controller agent, events from the various dataset agents are transmitted to the various plugins. In a preferred embodiment, there are five types of rules: service provider rules, service subscriber rules, propagation delay rules, network flow rules, and network validation rules. Each type of rule is described below.

As described previously, a service provider rule declares a feature type to be a provider (e.g., substation), declares the name of the service being provided (e.g., electricity), and declares the maximum allowable distance to any subscriber that needs the service. A meta-knowledge editor 150, described hereinbelow, allows the user to choose the provider type from any of the datasets included by the configuration's ArcMap or equivalent documents. The name of the service provided and the maximum allowable distance will be left completely up to the user.

As also described previously, a service subscriber rule declares a feature type to be a subscriber (e.g., pump), declares the name of the service being subscribed to (e.g., electricity), and declares the maximum allowable distance to any provider of the service. The meta-knowledge editor 150 allows the user to choose the subscriber type from any of the datasets included by the configuration's ArcMap or equivalent documents. The name of the service provided and the maximum allowable distance will be left completely up to the user.

A propagation delay or network latency rule declares the time required for a disabling event to pass thru a particular feature type. Network latency rules are used to establish the time based behavior of a network. When a given network feature is disabled the effect of that disablement will propagate through the network over some period of time. For instance, in a water utility network pump A may be supplying water to pump B through a series of pipes and valves. If pump A becomes disabled, some amount of time will pass before pump B experiences the effect of that event. This passage of time can be modeled by assigning propagation delays to pipes and valves. The meta-knowledge editor 150 will allow the user to assign a propagation delay to any of the features included by the configuration's ArcMap or equivalent documents.

A network flow rule declares a connection between a single feature (the source) and some other set of features (the sinks). Network flow relationships were described in greater detail hereinabove. Network flow rules are used to establish network connections that are not modeled in the geometric networks of the simulation datasets. For instance, as described elsewhere herein, a particular simulation may make use of a dataset 40 representative of a railroad network from a first region and another from a second region. Since these two networks exist in independent datasets 40 there are no connections between them. However, in the real world, the railroad networks are interconnected. Network flow rules allow those connections to be specified. The meta-knowledge editor 150 allows the user to create connections between any of the features included by the configuration's ArcMap or equivalent documents.

A network validation rule declares a constraint on the interconnection of the features in a network. For a given network feature type a validation rule specifies what feature types may be connected to it. The validation rules may be used by a validate function of the participant UI 180. The meta-knowledge editor 150 allows the user to create validation rules for any of the networks included by the configuration's ArcMap or equivalent documents.

Once the datasets are known the user can begin to specify the properties that control the behavior of the simulation participants 104. For example, the user may need to specify flow behaviors for each participant's networks. The flow behavior can be either cascading or non-cascading. If the flow behavior is cascading, then when a feature in the network is disabled, any downstream (based on the network's flow sources) features which no longer have a source of flow will also be disabled. The effect of disabling a feature thus "cascades" through the network. If the flow behavior is non-cascading, then disabling a network feature does not result in the disablement of any of the other features in the network.

As described in more detail hereinbelow, the meta-knowledge editor 150 will allow the user to specify the behavior of each intra- and inter-infrastructure dependency.

Notably, the simulation engine 100 can be deployed using either a single-tier model, wherein the software components are deployed on a single computer (sometimes referred to as "vertical scaling"), or a multi-tier deployment model, wherein the software components are deployed on multiple computers (sometimes referred to as "horizontal scaling").

Interaction with the Simulation Engine

The simulation engine 100 preferably supports two principal human actors: simulation users and subject matter experts ("SMEs"). The simulation user is the person responsible for conducting critical infrastructure analyses, while the SME is considered to be the person with expert knowledge about a topic. The SME will primarily be responsible for providing the values to the parameters in the rules.

Figure 11:
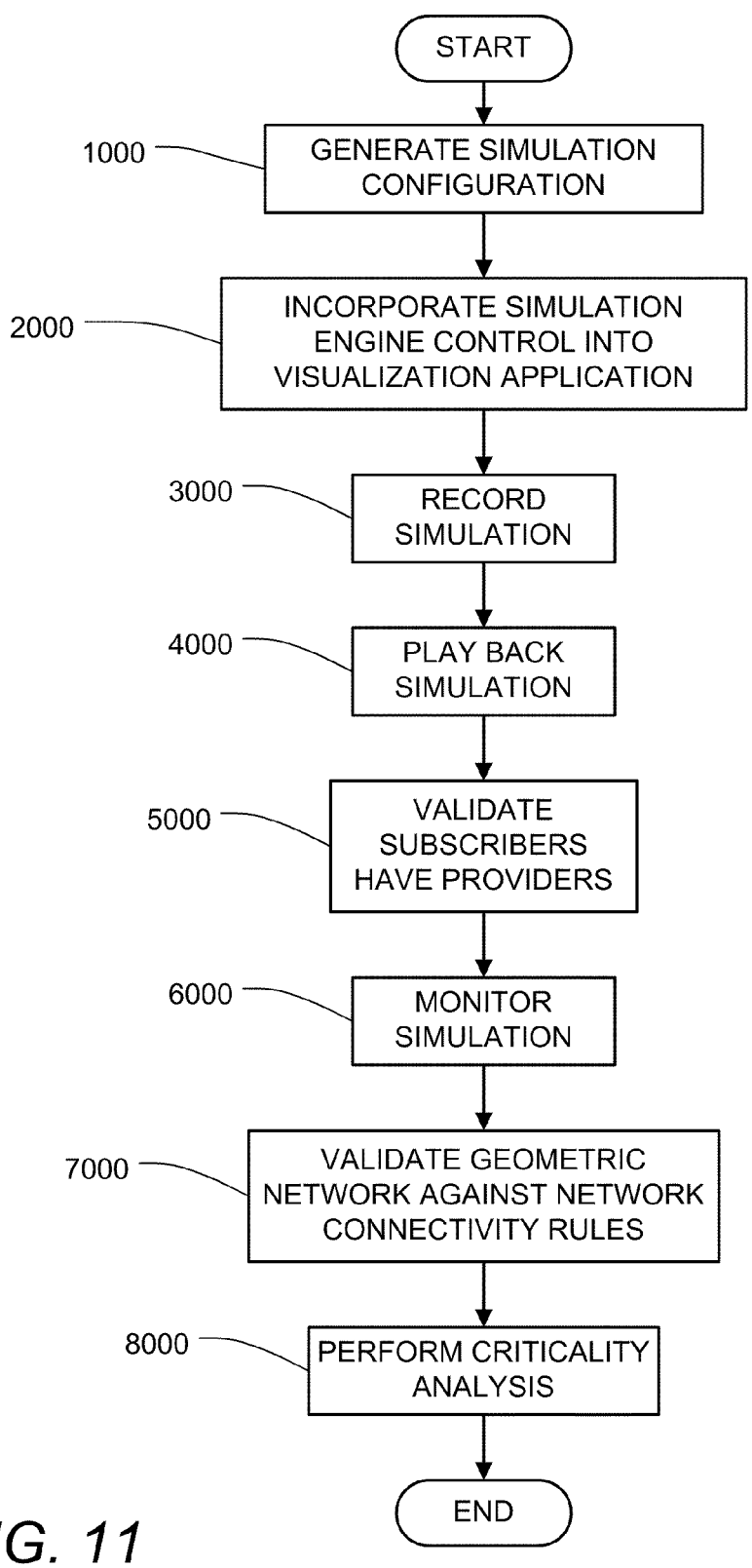
FIG. 11 is a high-level flowchart illustrating the overall operation of the simulation engine.

FIG. 11 is a high-level flowchart illustrating the overall operation of the simulation engine 100. As shown therein, the general process 500 carried out by the simulation engine 100 includes a plurality of sub-processes, including the generation at sub-process 1000 of one or more simulation configurations, incorporating simulation engine control into the visualization application 20 at sub-process 2000, recording a simulation at sub-process 3000, playing back a simulation at sub-process 4000, validating that subscribers have providers at sub-process 5000, monitoring a simulation at sub-process 6000, validating that a geometric network obeys network connectivity rules at sub-process 7000, and performing criticality analysis at sub-process 8000. Generally, the generate simulation configuration sub-process 1000 is carried out jointly by an SME and a simulation user, while the other sub-processes 2000-8000 are carried out primarily or exclusively by a simulation user.

Generating a Simulation Configuration

In order to use the simulation engine 100 it is necessary to configure it properly. The sub-process 1000 of generating one or more simulation configurations primarily includes collecting all of the use cases supported by the simulation engine 100 under a single name. The configuration specifies such things as the datasets that are involved in the simulation, the rules that define the dependencies between infrastructures, and the operational characteristics of the simulation participants 104.

The simulation environment 60 preferably includes a meta-knowledge editor 150 for use by users in establishing one or more configurations. The meta-knowledge editor 150 preferably hides the details of how and where this information is stored, and presents the user with an easy to use, intuitive interface for specifying the details of the simulation that he/she wishes to run. Once the user has completed the configuration of a simulation he/she may assign a name to it and save it. This gives the user the ability to create multiple, independent configurations, where the utility allows the user to select one of the predefined configurations and make it the currently active configuration. Thus, the user is able to run simulations against different datasets for the same or for different models 40 and/or use different rules.

Preferably, the simulation engine 100 of the present invention provides a separate user interface in the form of such a meta-knowledge editor 150.

The first thing we will do is create a new configuration by selecting the "new" function and entering the name of the configuration that is to be created.

After establishing or opening a particular configuration, the meta-knowledge editor 150 preferably displays a series of functions that include "Properties," "Domains," "Service Rules," "Row Rules" and "Latency Rules." However, it will be apparent that the various options and features represented thereby may be reorganized, supplemented or otherwise modified without departing from the scope of the present invention.

When the "Properties" function is selected, a Properties page is preferably displayed, the lower part of the page including a plurality of properties that are each initially populated with a default value. The properties preferably include the simulation logging level, a URL for the simulation controller service 134, and a URL for the participant manager service 127. Details of each are provided below. It may or may not be necessary to alter the default values of the properties in the lower part of the page. For example, if the simulation is to be run entirely on a single computer, it may not be necessary to alter the default values of some or all of these properties. However, the properties may optionally be adjusted or redefined as appropriate and desired by the user.

The first property, the simulation logging level, describes the degree to which debugging messages are enabled during the execution of the simulation engine 100. Preferably, the possible values for the logging level are (from least to most debugging messages): "Error," "Warning," "Info," "Debug," and "MoreDebug." Preferably the UI provides a dropdown menu or other indication of allowable values for the value field for this property. The more debugging messages are enabled the slower speed with which the simulation engine 100 may execute. The debugging level is preferably set higher only when troubleshooting a problem and sufficient debug messages are not displayed through the simulation engine 100 GUI. Until the simulation engine 100 reaches IOC, a suitable default value for this property is:

Debug

The second property is the network location of the simulation controller service 134 of the simulation engine 100. The simulation controller service 134 is the nexus of the simulation execution and contains the intelligent agents that propagate the cross-infrastructure effects. There is only one simulation controller service 134 for a simulation even though there may be multiple ArcMap or other visualization application participants 104, each with a separate map document. The computer/domain specified in this property should have a Microsoft Internet Information Server ("IIS") web server. Preferably, this parameter is changed only if the controller service 134 is located on different computer from the one that the all of the ArcMap or other visualization application participants 104 in the simulation will be running on. In that case, only the computer/domain name portion (localhost) of the default value for this property should preferably be changed. A suitable default value for this property is:

http://localhost:8800/$ Controller/webservice

The third property is the network location of the participant manager service 127 of the simulation engine 100. The participant manager service 127 is the registration point of each participant 104. Each ArcMap map or equivalent document participating in the simulation is considered a participant 104 in the simulation. The computer/domain specified in this property must have an active Microsoft Internet Information Server ("IIS") web server. Each participant 104 in a simulation may have a distinct, dedicated participant manager service 127 or participants 104 may share a participant manager service 127. A suitable default value for this property is:

http://localhost/SimulatorWebServices/ParticipantManagerService.asmx

Other functions that are preferably provided in the meta-knowledge editor 150, such as by dropdown menu or otherwise, include "Save," "Close," "Open,", "Delete" and "Exit." Each of these functions generally has a conventional usage and operation.

Once a configuration has been established, changes to the configuration may be made as desired by the user. For example, a "domain," which as generally used herein refers to a "spatial domain," a GIS term that means a spatial area. Each ArcMap or equivalent document has a single spatial domain that is the envelope of the map. As mentioned earlier, each ArcMap or equivalent document in the simulation configuration will server as a participant 104 in the simulation. To add a domain, the user first adds an ArcMap or equivalent document to the configuration.

In one typical usage of the system 10 of the present invention, a second map document may be added to the first. For example, after adding a map document for a first geographic region (such as a U.S. county), the user may next add another map document for a neighboring region. This may be accomplished in the same manner as when adding the first domain. Preferably, all domains that are included in a particular configuration are shown in a Domains dropdown list. Also, if these two counties or other regions have coincidental borders, it may be desirable to perform cross-spatial domain network flow. This will be further discussed hereinbelow.

Another way to change a configuration involves managing the behavior rules assigned to it. As described previously, rules are how the simulation engine 100 determines its cross-network and cross-domain interdependencies. Next described are examples of various rules that may be added to a particular configuration. For example, as described previously, one type of rule that may be added to a configuration is a service rule. In order to add service rules, a particular domain, such as the county domain described previously, must be selected if it is not already. The user next adds a service name (or type), which is preferably arbitrary, using a dialog box or the like.

Once a service name has been added, service rules may be added. One type of service rule that may be added is a provider rule to indicate a type of feature that provides a service to other features. Preferably, the meta-knowledge editor 150 provides a facility for selecting particular feature classes. Finally, the user may enter a value in a "Service Area" field.

In the operational flow, the next step may be to add a corresponding subscriber. This may be done in similar fashion to adding a provider. As a way of visually validating the service area values, the meta-knowledge editor 150 preferably provides a graphical interface circumscribing the service areas for the user on the map around each feature.

As described previously, another type of rule that may be added to a configuration is a network flow behavior rule. Network flow behavior rules specify explicit feature-to-feature cross-infrastructure connections. The main window of the meta-knowledge editor 150 preferably provides a separate "Flow Rules" function for causing a network flow behavior rules page to be displayed wherein a source (one geographic region) and a sink (a second geographic region) may be specified. Various feature classes may preferably be selected and displayed using a table of contents facility and a graphical interface. For example, in the table of contents for the source domain, a "RailLine" feature class of the "LOC" grouping may be selected so that it is the only feature class being displayed.

Notably, although only one source feature can be selected, flow rules can have multiple sink features. Preferably, multiple features can be selected using a combination of keys familiar to users of the underlying visualization application 20, such as ArcMap. For example, in a table of contents for the sinks domain, a "railroads" feature class may be selected so that it is the only feature class being displayed.

Another type of rule that may be added is a network latency rule. A network latency rule specifies the time lag between the precipitating cause of a disabling effect and the actual application of the disabling effect itself. Network latency rules can be used to simulate reserve or backup supplies or barriers that temporarily inhibit a cascading or escalating disabling effect into or onto a feature. The main window of the meta-knowledge editor 150 preferably provides a separate "Network Latency" function for causing a network latency rules page to be displayed. For example, a "CableNode" feature class may be selected from a "c4i" grouping of a first geographic domain. The user may then enter a time delay value, which may be for example the value 1 hour and 30 minutes.

Once a simulation configuration has been created and customized, it may be saved again by selecting the "save" function described previously. Typically, the next step is to activate the configuration so that it will take effect for subsequent simulations. To activate a configuration, an "activate" function may be provided which, if selected, causes the currently loaded configuration to be used the next time a simulation is started on the computer which is running the simulation. Preferably, changes made to a configuration are not used in any simulation until the changed configuration has been saved and activated.

Finally, once the new configuration is activated, the user may exit the meta-knowledge editor 150 by selecting the "exit" function. The user may then begin a new simulation. As will be apparent to one of ordinary skill in the art, the "exit" function may likewise be used if the user happens to make changes that he does not want to be saved. The meta-knowledge editor 150 may be restarted and the configuration reopened as described earlier.

Adding the Simulation Engine Tool to the Toolbar

The second sub-process 2000 is to incorporate the simulation engine 100 into the visualization application 20. Preferably, this is done by adding the simulation engine 100 as an option on a toolbar 172 for the conventional GIS visualization tool, which in the proposed commercial embodiment is the ESRI ArcGIS desktop environment. In the proposed commercial embodiment, the simulation engine control is an extension to the ESRI ArcGIS desktop environment. When the simulation engine 100 is installed, the control becomes available to users of ArcMap or other visualization application 20 but it is not automatically added to any of the ArcMap or equivalent document toolbars. For any given ArcMap or equivalent document, the user must manually add the simulation engine control to a toolbar.

The preconditions to this sub-process 2000 are that the simulation engine extension has not been previously loaded and saved for the ArcMap or equivalent document currently being accessed, and that the visualization application administrator for the site has not added the simulation engine extension to the global ArcMap or equivalent document template. In addition, it is assumed that ArcGIS Desktop (or equivalent portion of the visualization application 20) and the simulation engine 100 are installed on the host computer system 110.

Figure 12:
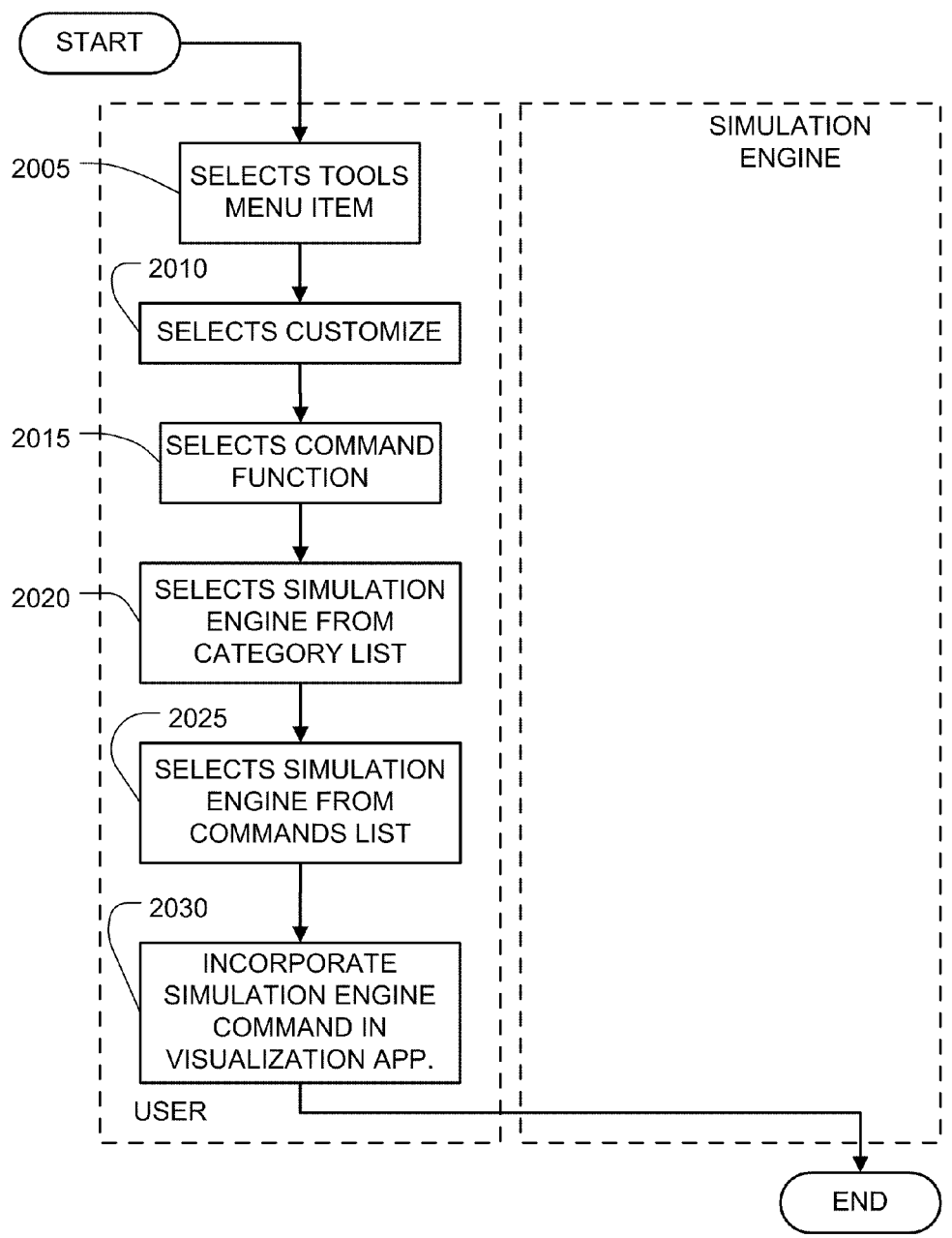
FIG. 12 is a flowchart illustrating the operation of the sub-process of adding the simulation engine tool to a toolbar.

FIG. 12 is a flowchart illustrating the operation of the sub-process 2000 of adding the simulation engine tool to a toolbar. In this and subsequent flowcharts, the steps shown on the left side of the flowchart are generally carried out by a user, while the steps shown on the right side of the flowchart are generally carried out by the simulation engine 100. As shown in FIG. 12, the second sub-process 2000 is normally carried out as follows.

First, the ArcMap or equivalent document is opened. Next, at step 2005, the Tools drop-down menu is selected. Next, at step 2010, the "Customize . . . " menu item is selected. At step 2015, in the Customize window, the Commands tab is selected. At step 2020, the simulation engine 100 is selected from the Categories list. At steps 2025 and 2030, the simulation engine command is dragged from the Commands list and dropped onto one of the ArcMap or equivalent toolbars.

Alternatively, the second sub-process 2000 could be carried out as follows. First the ArcMap or equivalent document is opened. The user could then right click within the blank area of the Main Menu bar or any toolbar and select the Customize item (near the bottom of the list). In the Customize window, the user could select the Commands tab and could select the simulation engine 100 from the Categories list. From the Commands list, the simulation engine command may be dragged and dropped onto one of the ArcMap or equivalent toolbars.

The second sub-process 2000 would generally be carried out once for any ArcMap or equivalent document that is created; or once for the entire system if this use case is performed on the system's ArcMap or equivalent document template.

ESRI ArcMap documents, and perhaps equivalent documents, must be configured to interface with the simulation engine 100 before any simulation, validation, or critical analysis can be performed. Preferably, if the global ArcMap or equivalent document template is configured to display a simulation engine command, then any newly created ArcMap or equivalent document will inherit that configuration.

Once the simulation engine 100 has been made available to the user by adding it to the toolbar, or by taking other appropriate steps, it is ready for use. The simulation engine 100 is presented to the user in the form of a participant controller GUI 180. The participant controller GUI 180 preferably takes the form of an ESRI "dockable" window, which means that it can be free floating inside the map or it can be moved and resized as desired. The participant controller GUI 180 preferably offers at least five different functions. A "recorder" function may be used to run new simulations, save simulations, and playback saved simulations. A "monitor" function allows the user to select features to track during the course of the simulation. A "validate" function may be used to perform validation of the provider/subscriber rules created by the SME and/or simulation user as well as to validate the geometric rules. A "critical" function may be used to perform a Critical Analysis on the database. This analysis identifies and ranks all of the instances in the database from most critical to least critical.

Recording a Simulation

Continuing the flow of FIG. 11, it is assumed that once a button for the simulation engine 100 has been added to the toolbar or otherwise incorporated into the visualization application 20, the next sub-process 3000 carried out by the simulation user is to record a new simulation. The preconditions to this sub-process 3000 are that the particular configuration, established as described hereinabove, that corresponds to the ArcMap document to be used has been activated, and that the agent environment is running.

Figure 13A:
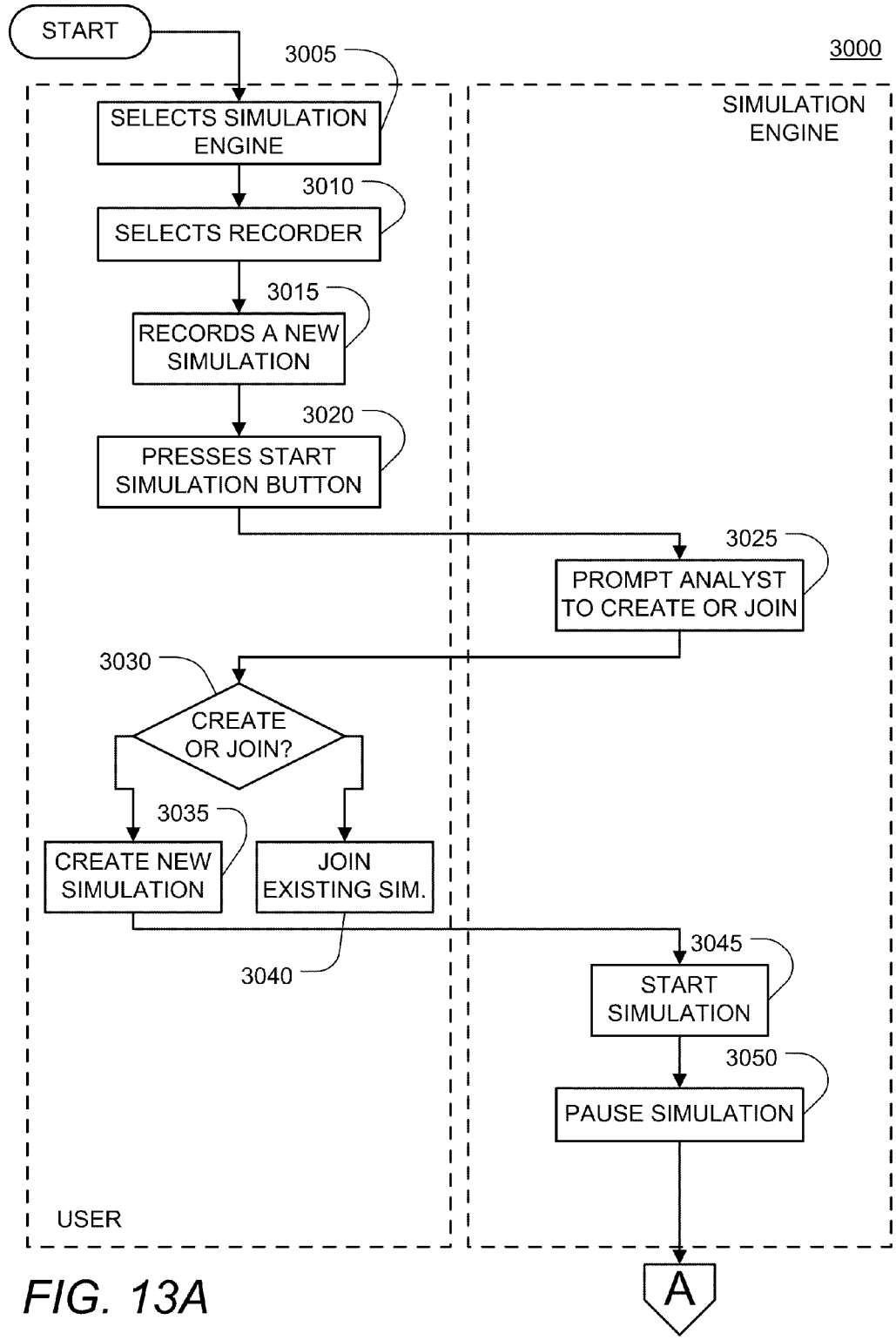
FIGS. 13A and 13B, collectively, are a flowchart illustrating the operation of the sub-process of recording a simulation.
Figure 13B:
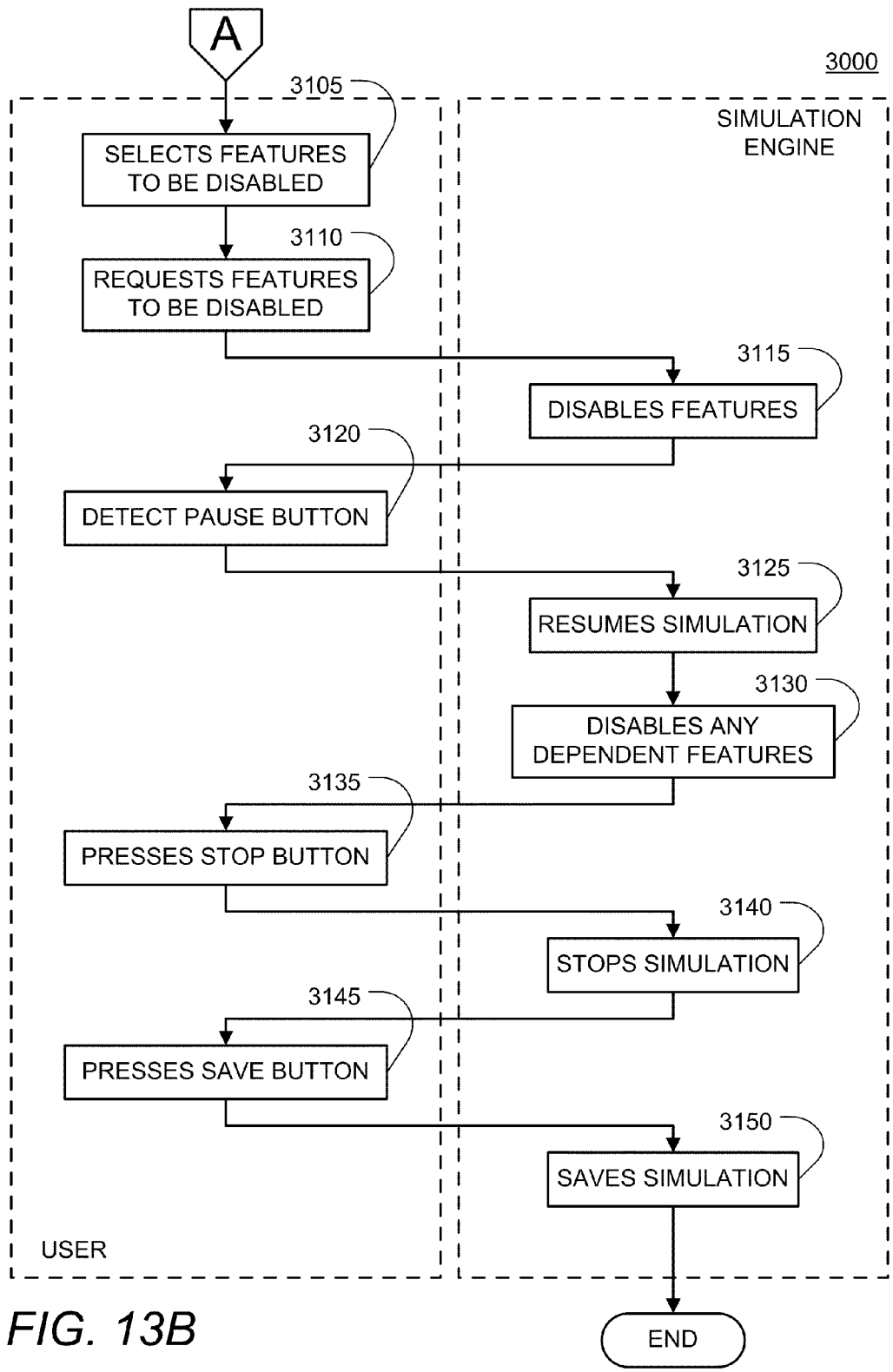

As shown in FIGS. 13A and 13B, the third sub-process 3000 is normally carried out as follows. First, the ArcMap or equivalent document is opened. Next, at step 3005, the simulation engine 100 may be selected, thereby displaying a menu of sub-functions for the simulation engine 100. Next, at step 3010 the recorder may be selected by selecting the recorder function and selecting the "record new simulation" sub-function. This causes recording of a new simulation to begin at step 3015. Next, at step 3020, the user selects the "start simulation" sub-function. At step 3025, the user is prompted to create or join. Assuming the user is creating a new simulation, then at steps 3030 and 3035, he selects "create" and enters a session name. The simulation is then begun at step 3045, but may be paused and restarted at steps 3045 and 3050.

The user may wish to enable or disable various features. Turning to FIG. 13B, the ArcMap or other visualization application 20 may provide a selection tool that can be used to select features at step 3105, and at step 3110 the user selects the "Schedule" sub-function to submit the selected features for disablement, recognized at step 3115 by the simulation engine 100. At step 3120, the user may then select a "pause" button in order to resume the simulation at step 3125. The user may choose to observe the simulation until the status bar displays "Simulation Idle". At this point the user should select a "Stop" sub-function at step 3135, thereby stopping the simulation at step 3140. The user may then select the "Save" sub-function at step 3145 and provide the name of the file to which the recorded simulation will be saved. The save process is then carried out at step 3150.

The third sub-process is described in greater detail hereinbelow. As stated previously, the user begins by selecting the "recorder" function, which is the function that enables users to perform their simulations. The first step in creating a simulation is to select a "record a new simulation" sub-function. This sub-function preferably enables several other sub-functions, including a "close simulation recording" sub-function, a "save simulation" sub-function, a "start new simulation" sub-function, a "play a recorded simulation" sub-function and a "display the provider/subscriber relationship for the selected change property op" sub-function.

If the user chooses to start a new simulation, a window is preferably opened that allows the user the option to create a new simulation session, which is the default option, or to join an already created simulation session. The user should join a session whenever they want to see simulation effects across multiple domains. In order to join a simulation, the user must know the name of the session that has already been started and type it in correctly into the Name field. Another function of the window is that it gives the user the ability to set the day and time for the simulation to begin. This can be done manually by typing in the date and time, or by otherwise selecting the date and time. Once the user has entered the parameters for the simulation, he may continue. At this point, the feature classes in the ArcMap or equivalent document are registered with the simulation controller 102.

The next step is to select the features to be disabled for the simulation. This may be accomplished using the conventional GIS visualization tool, which in the proposed commercial product is the ESRI tool.

Preferably, selected features are distinguished by color or by other readily recognizable means, thus allowing the user to identify which feature(s) have been selected and to change his selection. Once the proper feature(s) have been selected, the next step is to schedule them for disablement. To do this the user selects a "schedule [the selected features for disablement]" sub-function. Before the user does this, he first has the option of selecting the time in the scenario where the event will occur. This is accomplished by changing the simulation clock. Once the "schedule" sub-function has been selected, the event shows up in the simulation log as a Disable Object. The user can schedule as many disablement events as necessary to run the simulation.

Once all of the disablement events have been entered, the next step is to start the simulation. As events are disabled they will be written to a simulation log. If the ArcMap author has set the symbology to show disabled events they will appear as they are disabled. For example, all disabled lines may preferably be changed from the color green to the color red. This helps to highlight the disabled features from the non-disabled features.

The time stamps are determined by the latency rules that were created in the meta-knowledge editor 150. All events that are written under one time stamp occurred within that time stamp. The user may be provided with the option to view more details about what occurred at that time stamp. If the user selects any of the individual event entries they can obtain more information about why the feature was disabled.

Once the simulation has ended, a simulation status indicator preferably changes from running to idle. If the user wishes to end a simulation before it has run to completion, they can press the "pause" button, followed by a stop simulation button. Once the "stop" button 210 has been pushed, the user may resign from the simulation, after which the GUI 180 will go back to the state it was at after the user selected the "new simulation" sub-function. To save a simulation recording, the user may select the "save simulation recording" sub-function. The user may then navigate to the proper folder for the simulation to be saved and, type in an appropriate file name, and then press Save once completed. The user may then close the open simulation, which will clear the Simulation Participant GUI event log and remove any disablement symbology from the map. This will also return the GUI 180 to its original state.

Figure 14:
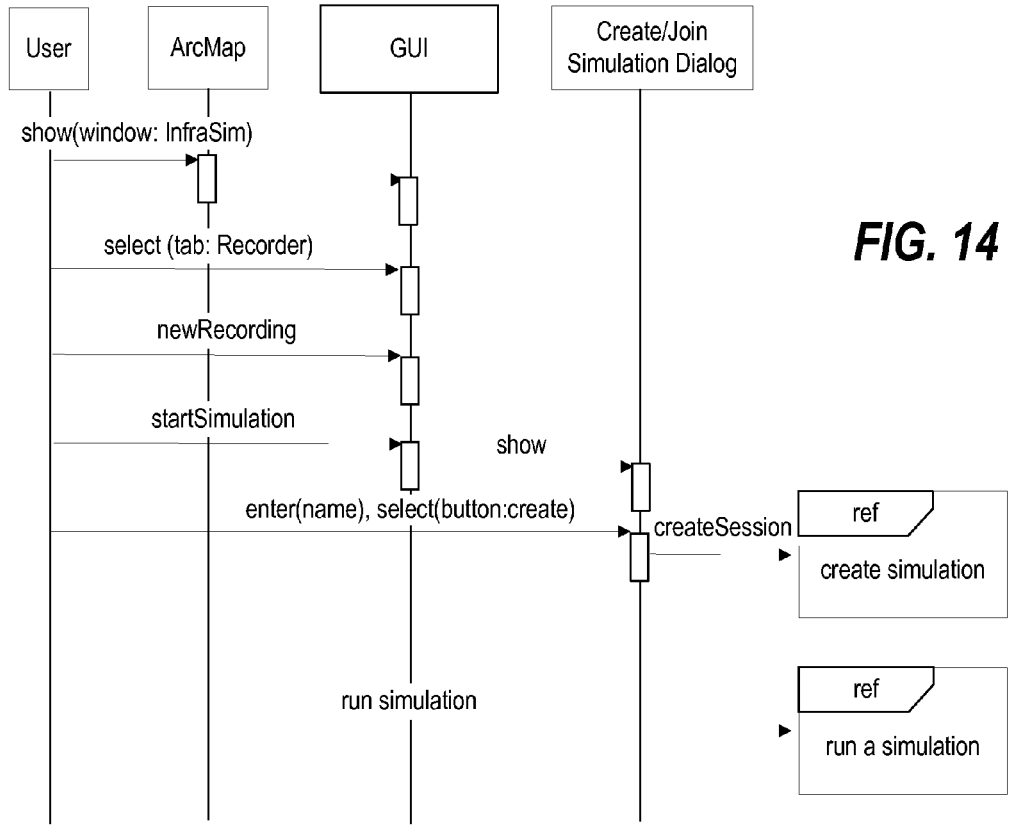
FIGS. 14-16 are sequence diagrams illustrating and modeling the system interaction for performing the record simulation sub-process of FIGS. 13A and 13B.
Figure 15:
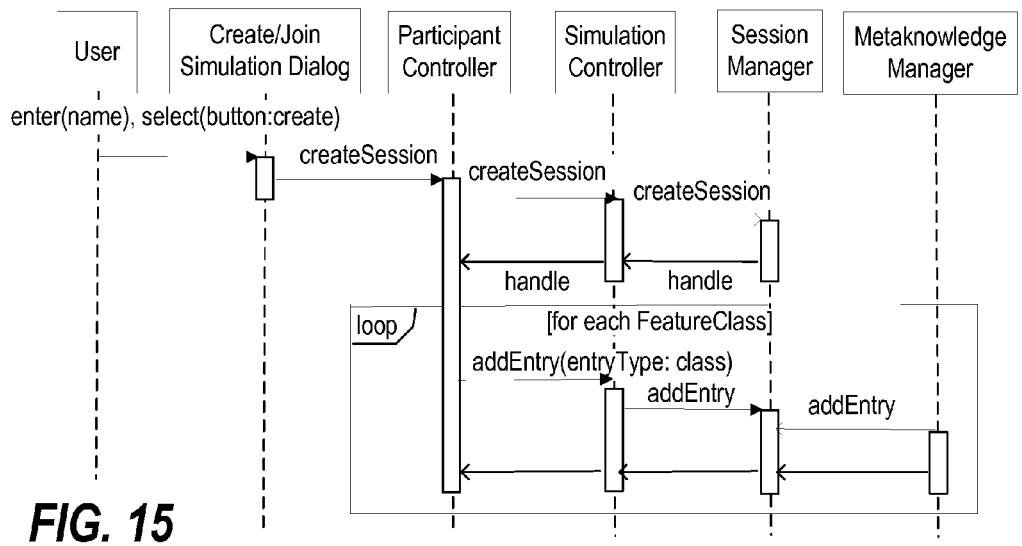
Figure 16:
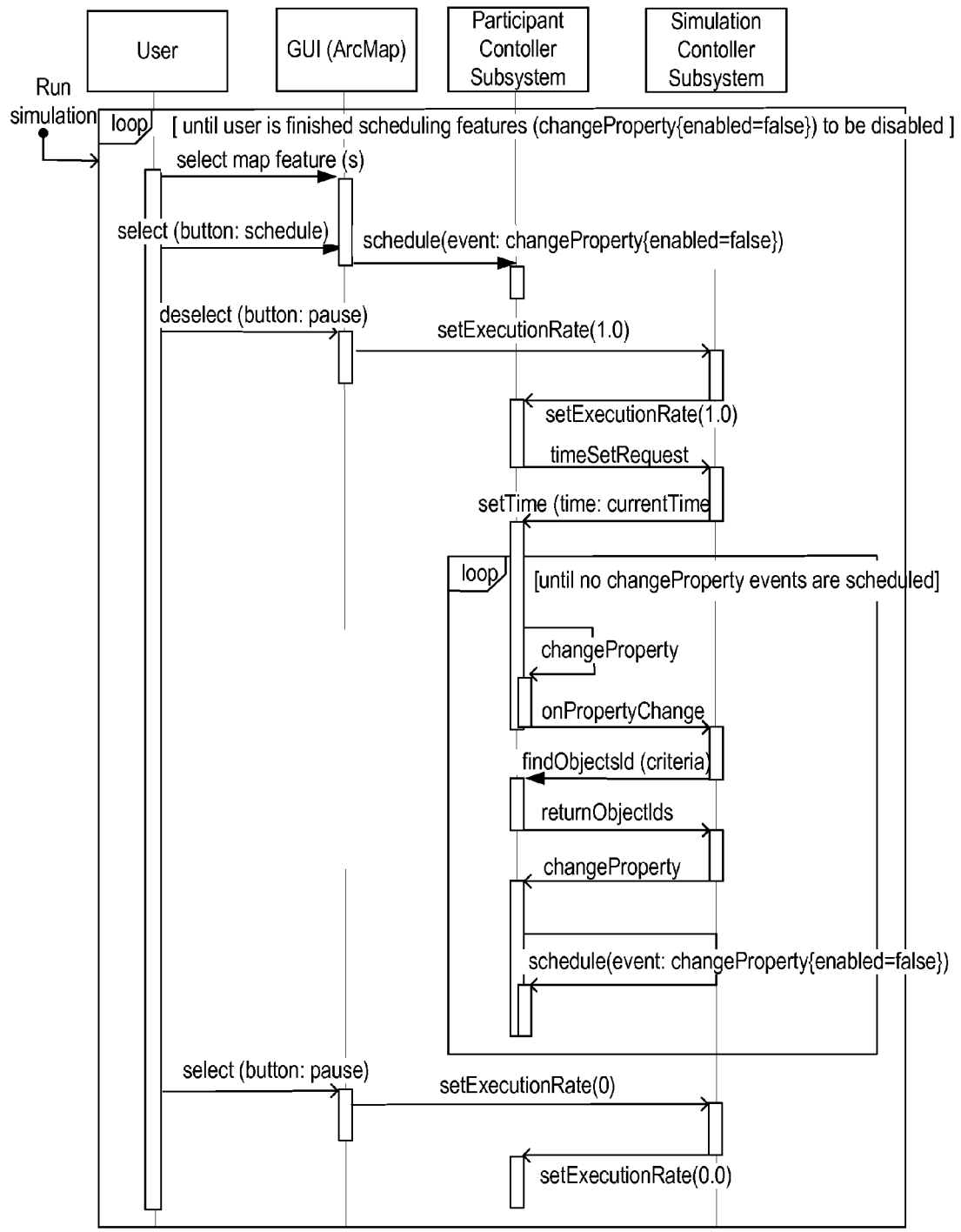

FIGS. 14-16 are sequence diagrams illustrating and modeling the system interaction for performing the record simulation sub-process 3000. The two principle sub-activities that must be completed (create simulation and run simulation) are shown in FIG. 14. FIG. 15 illustrates system interactions that enable the user to create a simulation, while FIG. 16 models the system interactions that run the simulation.

Playing Back a Simulation

Once a simulation has been recorded, the user may wish to play it back. This is described as sub-process 4000. The preconditions to this sub-process 4000 are that the configuration that corresponds to the ArcMap or equivalent document to be used has been activated, that the agent environment is running, and that a simulation recording, produced using the same configuration/ArcMap or equivalent document, is available.

Figure 17:
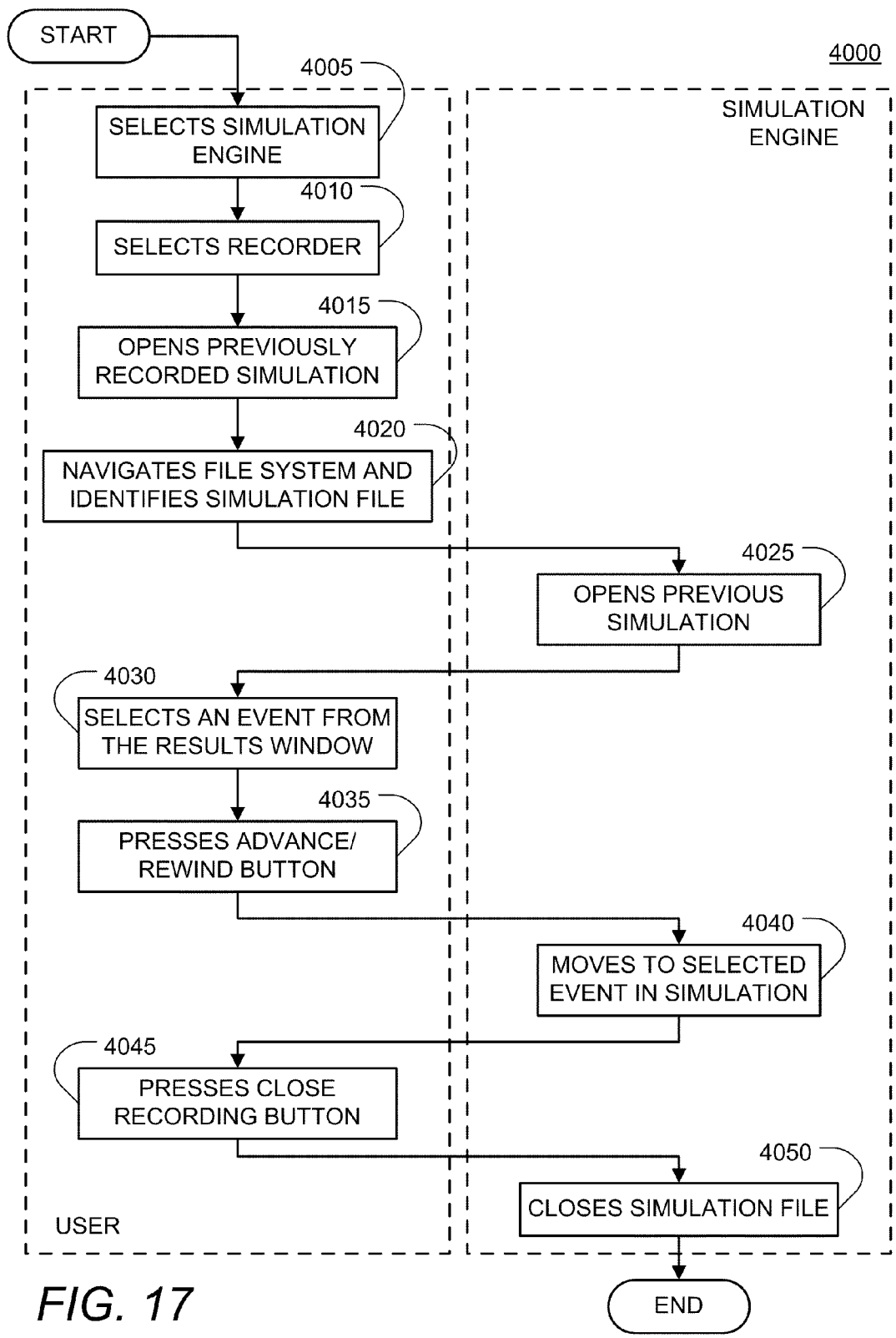
FIG. 17 is a flowchart illustrating the operation of the sub-process of playing back a simulation.

As shown in FIG. 17, the fourth sub-process 4000 is normally carried out as follows. First, the ArcMap or equivalent document is opened. Next, at step 4005, the user causes the simulation engine 100 to display the main page, and at step 4010 selects the recorder function. Next, at step 4015, the user selects the "open previously recorded simulation" sub-function, and at step 4020 chooses the desired simulation recording, thereby opening the simulation at step 4025. Once the simulation is open, the user may, at step 4030, select an event from the list in the recorder window, and at step 4035 may select the "advance/rewind" sub-function to cause the simulation at step 4040 to forward or rewind to the state of the simulation of the event selected. Of course, steps 4020, 4025 and 4030 may be repeated as often as desired in order to permit the user to sufficiently review the simulation. Finally, at step 4045 the user may select the "close recording" sub-function in order to cause the simulation engine 100 to close the simulation recording at step 4050.

The fourth sub-process 4000 is described and illustrated in greater detail hereinbelow. As stated previously, the user may open a saved simulation by selecting an "open a previously recorded simulation" sub-function. From there, the user is able to navigate to the location of the saved simulation. Once the user has selected the "open" sub-function, the saved events will be loaded into the simulation participation GUI event window and the simulation engine 100 will be placed in the state where it is able to run the saved simulation.

In order to play back a saved simulation, the user may select a "play saved simulation" sub-function. To run the saved simulation recording, the user may select the first event in the event log after the disable event message and then select any event after the first event, thereby causing the simulation to shift to the second event. This gives the user significant flexibility in looking at the simulation to determine what effects happen when and what caused them. Once the simulation recording has started, the user has the same capability as if he started a new simulation.

One of the other functions offered in Playback mode is the ability to see the provider/subscriber relationship drawn. To see the provider/subscriber relationship the user needs to select one of the Change Property events in the event log. This will result in the corresponding arrows being drawn on a map.

Figure 18:
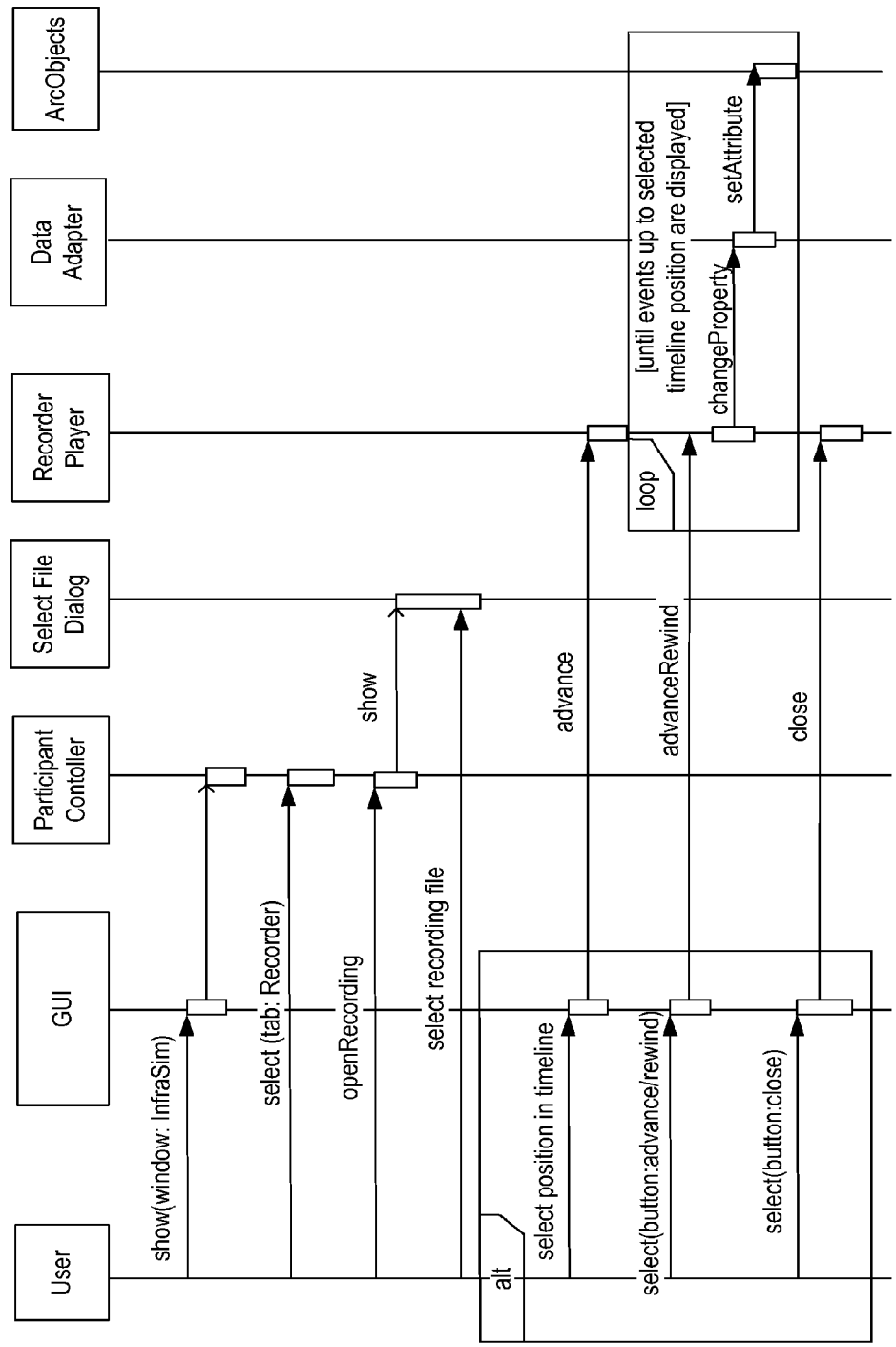
FIG. 18 is a sequence diagram illustrating and modeling the system interaction for performing the playback simulation sub-process.

FIG. 18 is a sequence diagram illustrating and modeling the system interaction for performing the playback simulation sub-process 4000.

Monitoring a Simulation

The general sub-process 5000 for monitoring the simulation is next described. When recording a simulation or playing back a simulation, the user can select features of interest that he wishes to monitor on the ArcMap or equivalent display for changes. If the feature is disabled during the simulation the user is alerted. This allows early termination of simulations once the feature of interest is affected.

Figure 19:
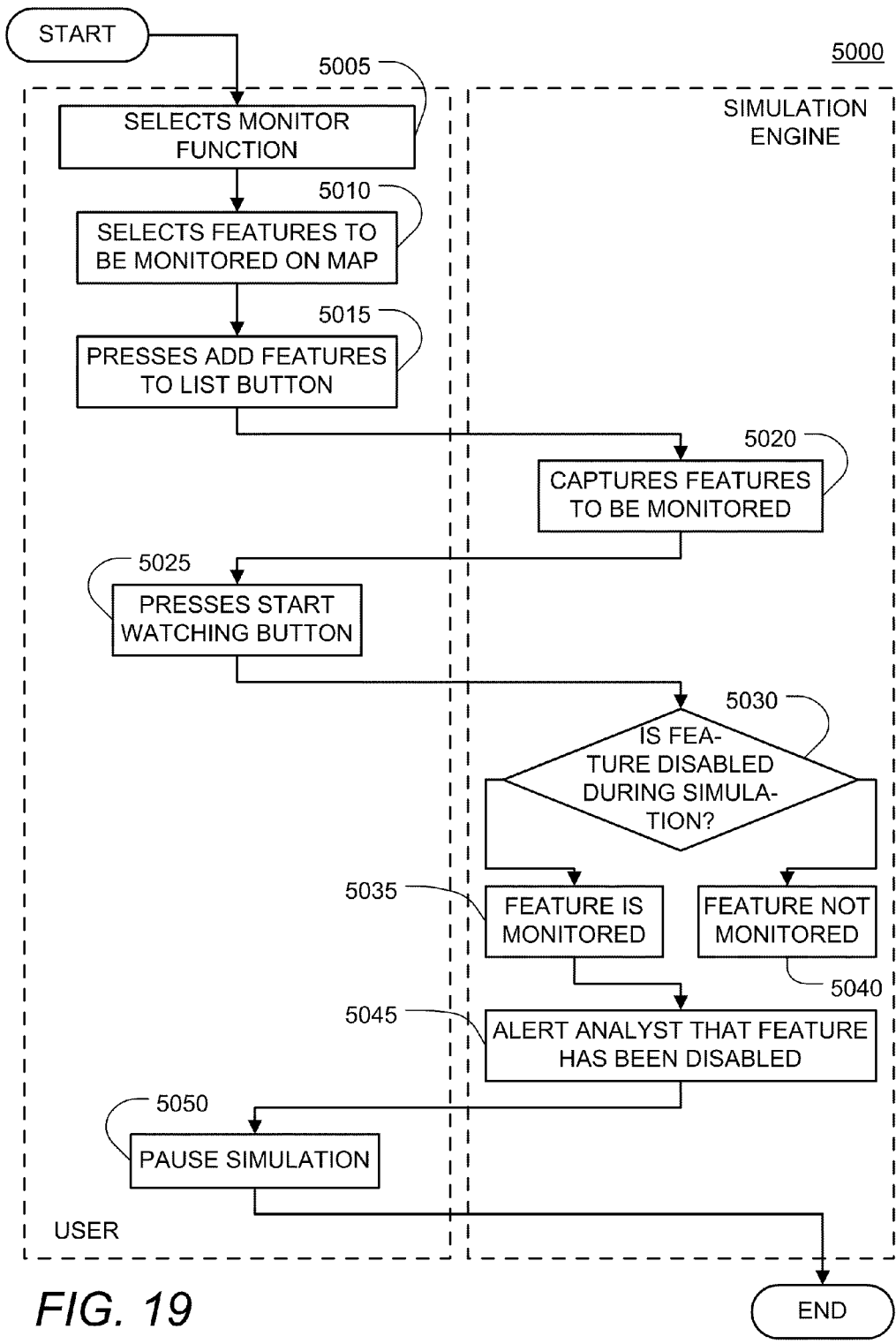
FIG. 19 is a flowchart illustrating the operation of the sub-process of monitoring a simulation.

As shown in FIG. 19, the fifth sub-process 5000 is normally carried out as follows. First, the monitor function is selected at step 5005. At step 5010, the user selects the features to be monitored on the map. When the user selects the "add features to list" sub-function at step 5015, these features are added to the list to be monitored at step 5020. The user then selects the "start watching" sub-function at step 5025 to begin display of the simulation.

Alternatively, the user may select the monitor function, and from the list of monitored features, select the monitoring that is no longer desired. Each selected feature may be removed from the list of monitored features by selecting the "remove features from list" sub-function.

This fifth sub-process 5000 is described and illustrated in greater detail hereinbelow. As stated previously, the monitor function allows the user to monitor selected features to see if they are affected by a scenario and to see what events caused their disablement. After selecting the monitor function, the user may choose to watch for changes to monitored objects, thereby starting a monitor. The next step is to select the feature(s) to be monitored by using ESRI's selected features tool. Once the correct feature has been selected, the feature may be added to the list by selecting the "add" sub-function.

Once the user has added all of the features to the monitor list, the next step is to run a simulation to see if those features were affected in the simulation. If one or more of the features is disabled in the simulation then the monitor provides a description of what happened and when. This is illustrated at steps 5030-5045. To remove a feature from the monitor list, the user may pause the simulation at step 5050, select the feature to be disabled and select a "remove feature" sub-function (not shown).

Figure 20:
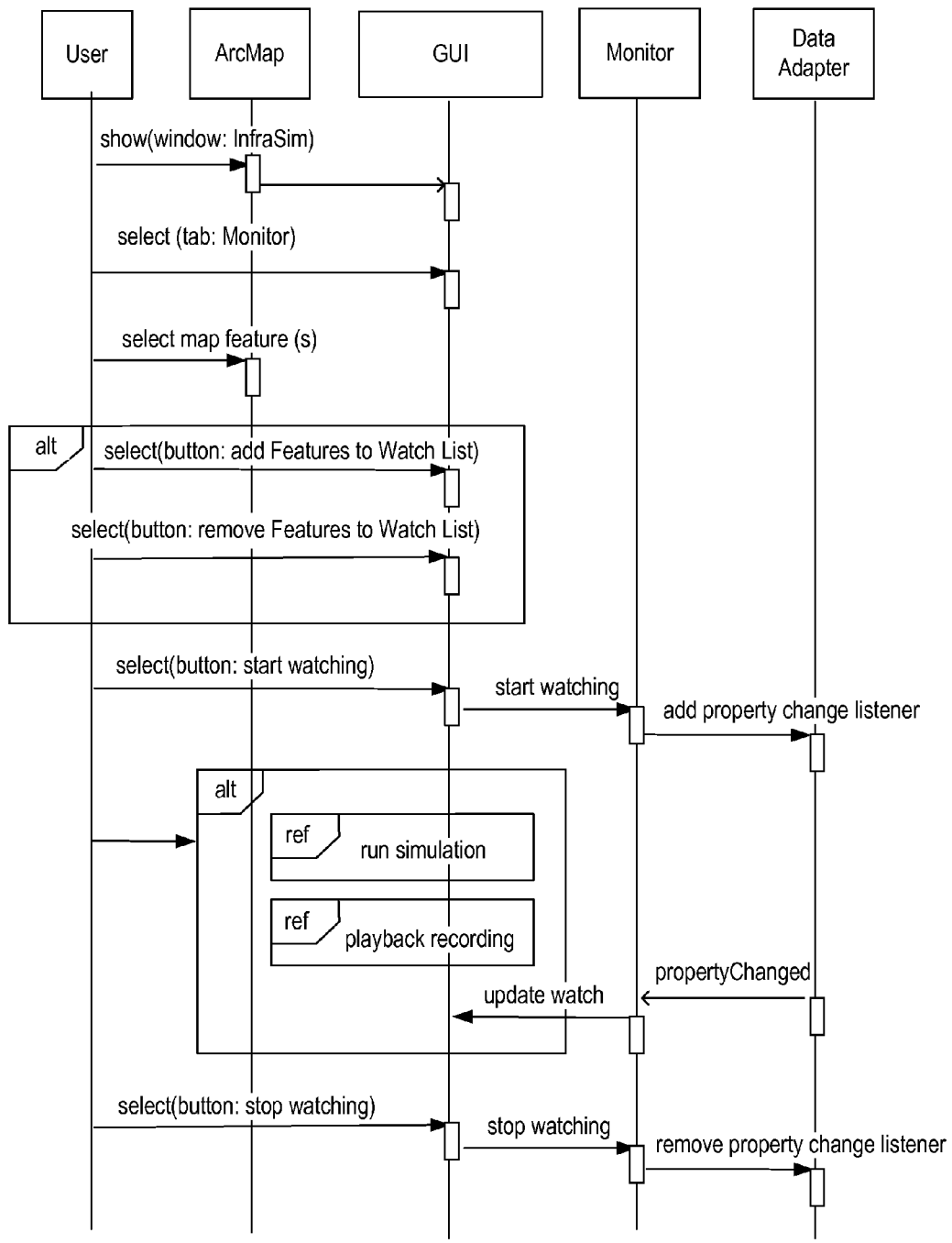
FIG. 20 is a sequence diagram illustrating and modeling the system interaction for performing the monitor simulation sub-process.

FIG. 20 is a sequence diagram illustrating and modeling the system interaction for performing the monitor simulation sub-process 5000.

Validating that Subscribers have Providers

Figure 21:
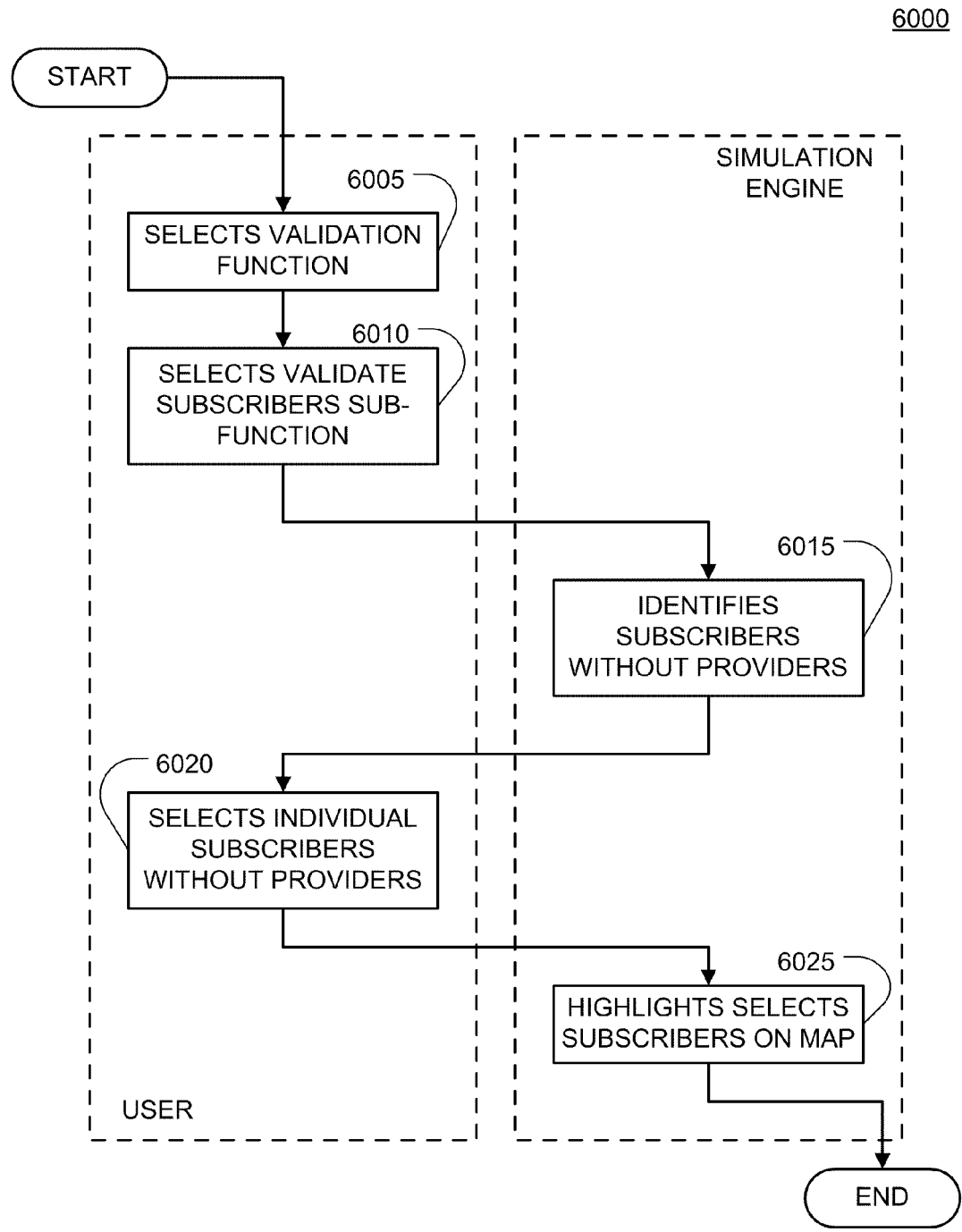
FIG. 21 is a flowchart illustrating the operation of the sub-process of validating that subscribers have providers.

Yet another sub-process 6000 may be useful for ensuring or validating, prior to running a simulation, that for the current set of provider-subscriber rules, all subscribers have providers. If not, the user may need to determine if the rules need adjusting or if the data is flawed. As shown in FIG. 21, this sub-process 6000 is normally carried out as follows. First, the user selects the "validate" function at step 6005 and selects the "validate subscribers" sub-function at step 6010. The results are displayed at step 6015 in a two-level list with service providers at level one and service subscribers at level two. From this, at step 6020, the user may select one of the subscriber items in order to highlight on the map, at step 6025, the individual subscribers that do not have service.

This sixth sub-process 6000 is described and illustrated in greater detail hereinbelow. As stated previously, the validate function is used to validate the provider/subscriber rules as well as the networks connectivity. Preferably, at least two validation tools are provided, of which a tool for validating that all subscribers have providers is the first. The first sub-function in the validate function is a "provider subscriber validation" sub-function. When the user selects this sub-function, the simulation controller 102 queries the rules knowledge base and builds a provider/subscriber tree.

Once the list has been built and loaded into the participant controller GUI, the user can discover more information about each of the provider/subscriber rules by selecting the feature of interest. This may be used to show the services that that feature subscribes to. By selecting a particular service, the user can determine how many of those features do not have access to the service. This information will provide to the user an understanding as to effectiveness of the rules that were built and to be used in the simulation.

Figure 22:
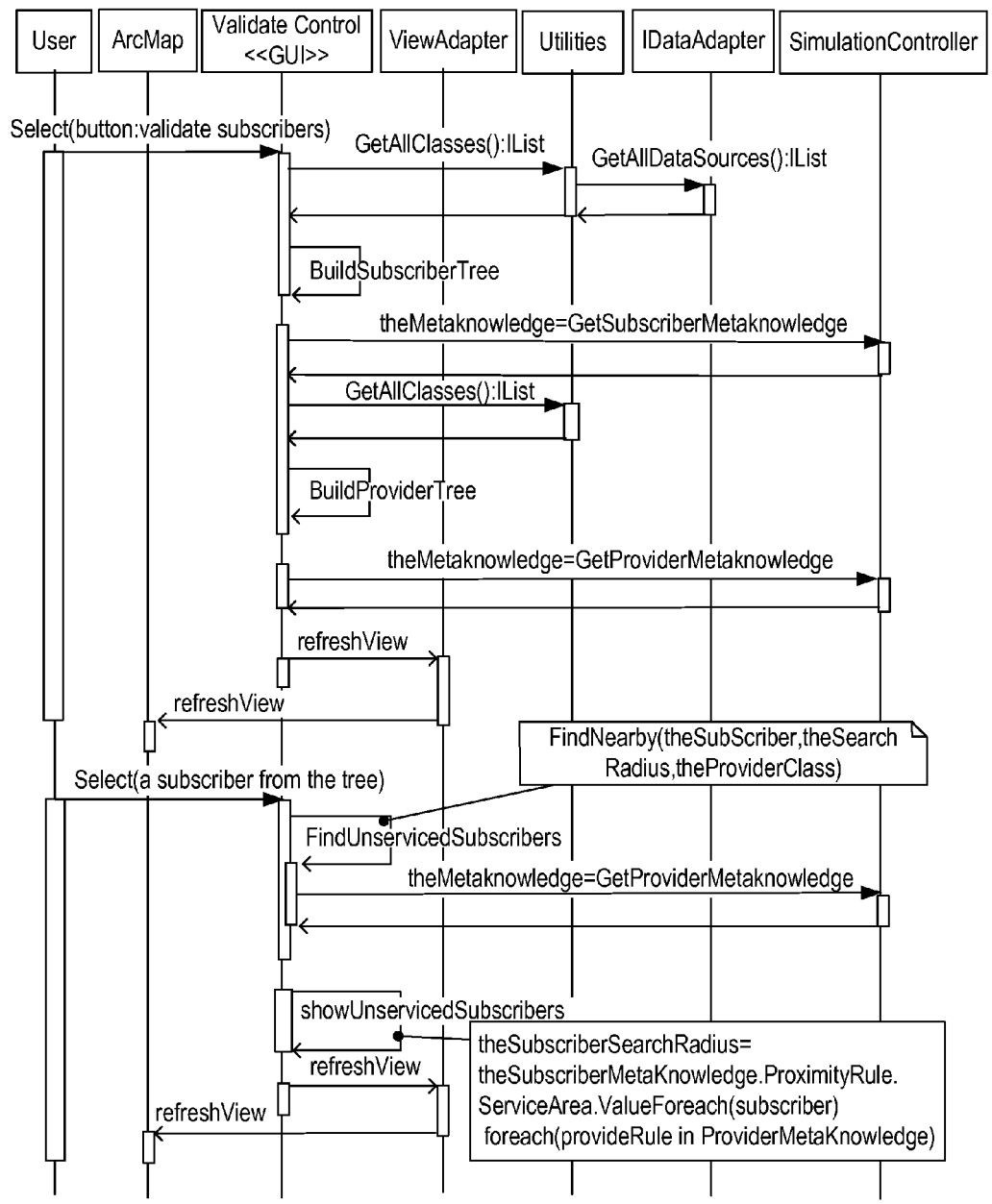
FIG. 22 is a sequence diagram illustrating and modeling the system interaction for performing the validate subscribers sub-process.

FIG. 22 is a sequence diagram illustrating and modeling the system interaction for performing the validate subscribers sub-process 6000.

Validating Geometric Network against Network Connectivity Rules

Figure 23:
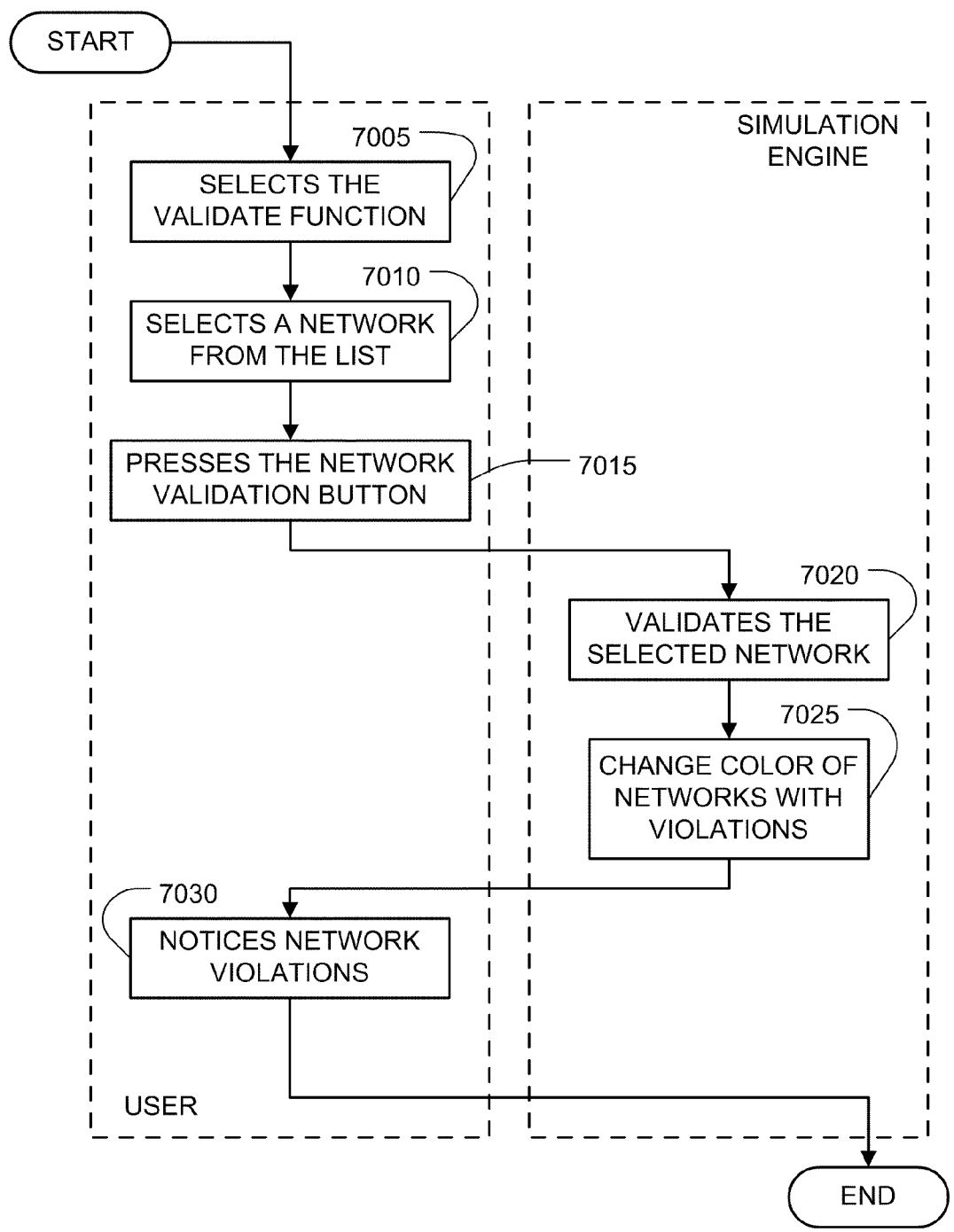
FIG. 23 is a flowchart illustrating the operation of the sub-process of validating geometric network against network connectivity rules.

Yet another sub-process 7000 may be useful for verifying that the geometric networks obey the rules used to determine the valid connections within the networks. As shown in FIG. 23, this sub-process 7000 is normally carried out as follows. First, at step 7005, the user selects the "validate" function. At step 7010, the user chooses a network, and at step 7015 the user selects the "network validation" sub-function to initiate the operation. The simulation engine 100 then validates the selected network at step 7020 and reports the results at step 7025. In the proposed commercial embodiment, this may be accomplished by changing the color of each network with a violation, where the colors preferably distinguish three types of violations of the connectivity rules. For example, the color red could be used to show disconnected nodes, i.e., nodes that should be connected to the network but in fact have no connections; green could be used to show incorrect connections for edges, i.e., edges (or lines) that are connected to a node or an edge that is not defined in the rules as being part of the network; and the color blue could be used to show incorrect terminations for edges, i.e., edges that terminate incorrectly. However, other color schemes, schemes indicative of other conditions, and other schemes altogether may likewise be utilized. Whatever the system used, the user may then review the results (i.e., may review any color changes) at step 7030.

The ability to check each network's connectivity is the second validation tool that is preferably provided. In summary, the user select which network to validate.

Figure 24:
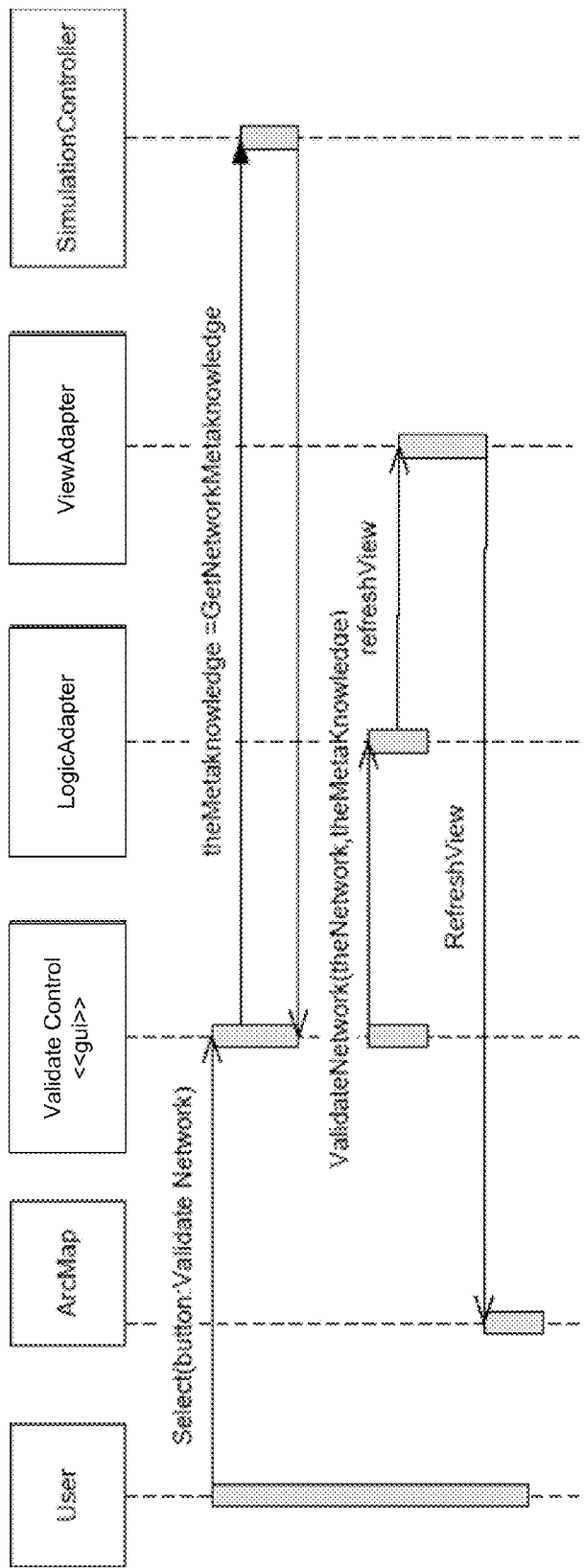
FIG. 24 is a sequence diagram illustrating and modeling the system interaction for performing the validate geometric network against network connectivity sub-process.

FIG. 24 is a sequence diagram illustrating and modeling the system interaction for performing the validate geometric network against network connectivity sub-process 7000.

Performing Criticality Analysis

Figure 25:
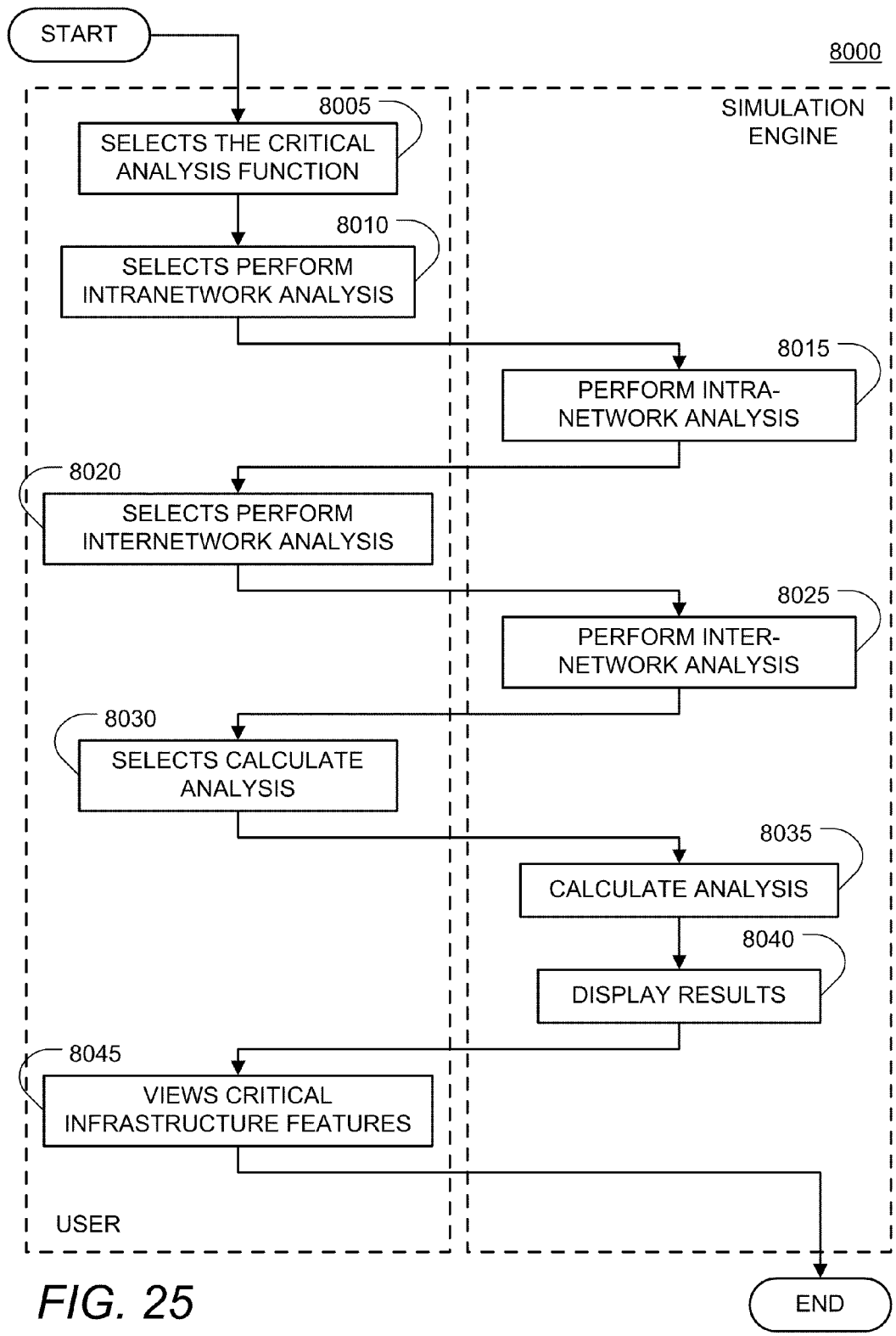
FIG. 25 is a flowchart illustrating the operation of the sub-process of performing criticality analysis.

Yet another sub-process 8000 may be useful for performing criticality analysis, wherein the user wishes to rank the impact of the disablement of each node in the data set. For this sub-process, it is assumed that the FeatureWeight.XML file is filled in with any user-defined weights/costs for each node type. As shown in FIG. 25, this sub-process 8000 is normally carried out as follows. First, at step 8005, the user may select the "criticality" sub-function, and at step 8010 selects the IntraNetwork analysis sub-function, thereby causing intranetwork analysis to be performed at step 8015. As shown at step 8020, the user may also select the InterNetwork analysis sub-function, thereby causing internetwork analysis to be performed at step 8025. As shown at step 8030, the user may also select the "Calculate Analysis" sub-function, thereby causing calculate analysis to be performed at step 8035. The user may then select a node or a group of nodes in a list box with the results being displayed at step 8040. The corresponding nodes are highlighted in the map display for review by the user at step 8045.

This eighth sub-process 8000 is described and illustrated in greater detail hereinbelow. As stated previously, the "critical" function gives the user the ability to determine what is the most critical feature in the geometric network based upon the rules defined and the weights applied to each feature. In this situation, "criticality" is defined as the feature that when disabled results in the greatest effect across all infrastructures.

The first step in creating the critical analysis is to perform the IntraNetwork analysis by selecting the IntraNetwork analysis sub-function. In this step the simulation controller 102 determines the effect a single disablement of a node or arc within that network. The controller 102 does this for every node and arc in the network. The second step is to perform the InterNetwork Analysis by selecting the InterNetwork Analysis sub-function. In this step the simulation controller 102 determines the effect across all networks when a single node or arc is disabled. The controller again performs this analysis for every single node and arc within the database. This analysis may take considerable time when dealing with a database 50 MB or more in size.

Once the first two analyses have been run, the user may determine the overall infrastructure vulnerability by running the Calculate Analysis sub-function. This sub-function combines the results of the IntraNetwork and InterNetwork Analysis into a combined total. This total is then displayed to the user. Each feature arc and node is preferably given a rank and listed in order from most to least critical. Features may be combined into groups of ten for display purposes. This allows the user to quickly and easily go to any set of values in the database. In order to easily identify which features the user is looking at, the selected features inside a grouping may be colored red or otherwise highlighted in a map.

Each feature may also be given a cost value. This cost value may be determined by the weights that the user defines for the networks. This value is given so the user can determine just how much more critical rank 1 is than rank 2 and so forth. The user can change the weights by going to the Controller folder in the home directory for the simulation engine 100 and editing a FeatureWeights.properties table. To clear the selected features from the map, the user may select a "clear drawing" sub-function.

Figure 26:
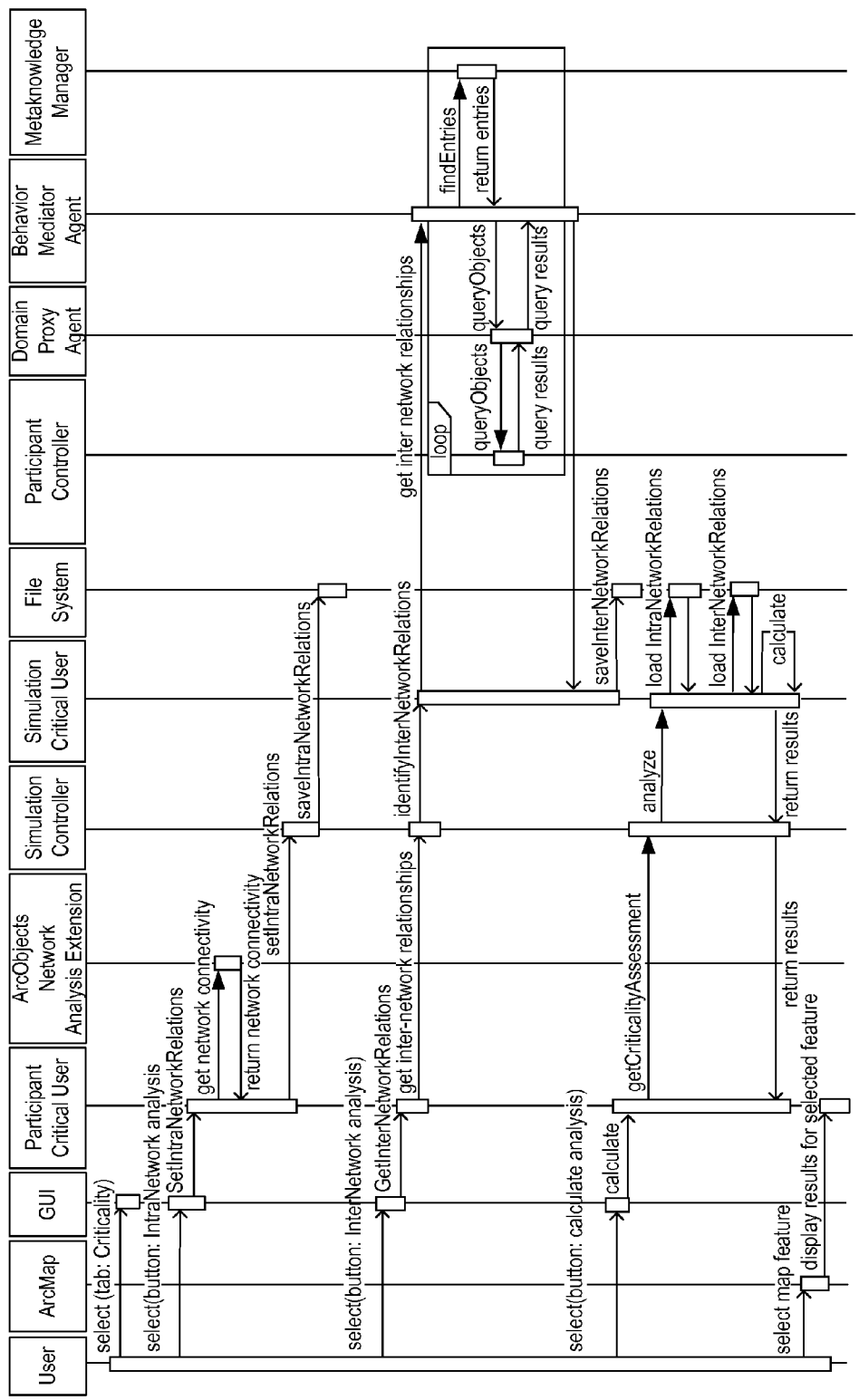
FIG. 26 is a sequence diagram illustrating and modeling the system interaction for performing the criticality analysis sub-process.

FIG. 26 is a sequence diagram illustrating and modeling the system interaction for performing the criticality analysis sub-process 8000. As shown therein, the Participant Critical User component determines all of the intra-network connectivity relationships and saves the information to a file, which is sent to the Simulation Critical User component that stores the information to a file for subsequent analysis. The Simulation Critical User component then determines all of the inter-network connectivity relationships and saves the information to a file for subsequent analysis. The Simulation Critical User component uses the information stored in files from the first two steps. The Participant Critical User component requests the Simulation Critical User component to perform the criticality analysis as follows. For each feature in each geodatabase traverse the path "downstream" (disallowing recursion) of all dependent features and calculate and store a weighted cost for the path by adding the weight for each feature (assigned by feature type). Then, the cost of the path fore each feature is returned by the Simulation Critical User component to the Participant Critical User.

Graphical User Interface

Visual aspects of one or more of the features described herein may be presented to a user using a graphical user interface (GUI) in a variety of ways. Generally, the GUI preferably displays physical, relational, and behavioral infrastructures, singly or together, for a single geographic region. Different symbols and colors can be used to indicate the type and state of each infrastructure feature. As the state of an infrastructure feature changes, the symbol and color used to represent the feature could also change.

In the GUI, different views of the infrastructures could be provided. For example, one view may display "cause and effect" relationships to reflect cascading disabling events within and among the infrastructures. Another view could dimensionally separate infrastructures in a two and a half dimensional display to allow easier navigation among the infrastructures and to highlight cross infrastructure relationships more effectively. Still another view may visually align infrastructures from adjacent regions or infrastructures that span multiple regions.

Furthermore, in the GUI, multiple views could be used simultaneously to facilitate user understanding of infrastructures when simulations involve the simultaneous participation of physical, relational, and behavioral infrastructures. A correct geospatial registering of these infrastructures is critical to the multi-view approach.

Suitable Implementation Components

As described previously, in the proposed commercial embodiment, implemented according to the preferred embodiments of the present invention, the simulation engine 100 is hosted by two commercially-available software technologies. In particular, the simulation engine 100 is hosted by ESRI ArcGIS 9.x and its underlying ArcObjects 9.x software library, which the simulation engine 100 extends, and Cougaar 11.2, which is the agent environment for the simulation engine 100. The former is available from ESRI of Redlands, Calif., while the latter is open source software, information about which is currently available at http://www.cougaar.org.

Significantly, the design of the simulation engine 100 itself preferably has no direct dependencies on a particular operating system. It is only bound currently by the support of the visualization application 20 such as the ESRI ArcGIS 9.x suite of software products to a Windows hosting environment. However, the proposed commercial implementation does utilize Microsoft IIS Web Server 5.1+ as a web service host. This was an implementation of convenience related to ArcGIS 9.x's dependence on Windows. As ArcGIS evolves to support other operating systems, this implementation can be changed to suit that flexibility. Other supported commercial software components may include ESRI ArcObjects 9.x, ESRI MapObjects—Java Edition 1.0.1, ESRI ArcMap 9.x with .NET support, ESRI ArcScene 9.x (if 2½ dimensional visualization is desired), Cougaar Agent Architecture 11.2, Apache Axis1.1, JDOM 1.0, and the like.

The simulation engine 100 has no direct dependencies on the underlying hardware type other than those required by the chosen software technologies (such as the ESRI and agent platform software technologies described above). ArcGIS 9.x, being bound to Windows, requires that the hardware must be Windows compatible. This hardware is typically Intel Pentiums, AMD, and Cyrix-based processors. Other preferred hardware characteristics include a Pentium 4 or equivalent processor, at least 1 GB ram memory, a TCP/IP network, and 200 MB of free space on a hard drive for full installation on one machine.

The software technologies chosen for hosting the simulation engine 100 may have additional software dependencies, depending on the particular software technologies chosen. For example, the ESRI and agent platform software technologies described above may require or utilize the following additional software technologies: SOAP 1.1, Web Services compatible with SOAP 1.1, .NET 1.1.x, Microsoft Windows 2000 or Windows XP as required by ESRI ArcDesktop 9.x, Java.1.4.2, and Microsoft IIS Web Server 5.1+.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A system for simulating interdependencies between multiple critical physical infrastructure models, comprising:
 a first infrastructure data model that models a first critical physical infrastructure;
 a second infrastructure data model that models a second critical physical infrastructure, wherein the second critical physical infrastructure is a different critical physical infrastructure from the first critical physical infrastructure;
 a simulation engine including a visualization application and adapted to automatically produce a change in the second infrastructure data model in response to a change in the first infrastructure data model; and
 a user interface permitting a user to interact with the simulation engine.

2. The system of claim 1, wherein the change in the first infrastructure data model represents an event occurring in the first infrastructure, and wherein the change in the second infrastructure data model represents the simulated effect of the event in the first infrastructure on the second infrastructure.

3. The system of claim 1, further comprising:
- a first application program interface enabling the simulation engine to interface with the first infrastructure data model; and
- a second application program interface enabling the simulation engine to interface with the second infrastructure data model.

4. The system of claim 1, wherein at least a portion of the data of the first infrastructure data model has a geospatial relationship and at least a portion of the data of the second infrastructure data model has a geospatial relationship.

5. The system of claim 4, wherein the simulation engine incorporates the geospatial relationship of the data of the first infrastructure data model and the geospatial relationship of the data of the second infrastructure data model in producing the change in the second infrastructure data model.

6. The system of claim 4, wherein the visualization application provides a visual representation connecting the geospatial relationship of the first infrastructure data model and the geospatial relationship of the data of the second infrastructure data model.

7. The system of claim 1, wherein the simulation engine includes a society of software agents.

8. The system of claim 1, wherein the simulation engine utilizes inter-infrastructure meta-knowledge contained in a database.

9. The system of claim 8, wherein the user interface includes an editor for editing the inter-infrastructure meta-knowledge.

10. The system of claim 1, wherein the user interface includes controls for causing the simulation engine to execute a pre-defined configuration.

11. The system of claim 10, wherein the user interface further includes an editor for establishing the pre-defined configuration.

12. A critical infrastructure modeling and simulation system comprising:
- an infrastructure data model that models a critical physical infrastructure;
- a simulation engine including a society of software agents and a visualization application and adapted to automatically produce, in response to a first change in the infrastructure data model, a second change in the infrastructure data model; and
- a user interface permitting a user to interact with the simulation engine.

13. The system of claim 12, wherein the first change in the infrastructure data model represents an event occurring in one portion of the critical physical infrastructure, and wherein the second change in the infrastructure data model represents the simulated effect of the event on other portions of the critical physical infrastructure.

14. The system of claim 12, wherein at least a portion of the data of the infrastructure data model has a geospatial relationship.

15. The system of claim 14, wherein the simulation engine incorporates the geospatial relationship of the data of the infrastructure data model in producing the second change.

16. The system of claim 15, wherein the visualization application provides a visual representation connecting the first and second changes to the geospatial relationship of the data of the infrastructure data model.

17. The system of claim 12, wherein the society of software agents utilizes inter-infrastructure meta-knowledge contained in a database.

18. The system of claim 17, wherein the user interface includes an editor for editing the inter-infrastructure meta-knowledge.

19. The system of claim 12, wherein the user interface includes controls for causing the simulation engine to execute a pre-defined configuration.

20. The system of claim 19, wherein the user interface further includes an editor for establishing the pre-defined configuration.

21. The system of claim 12, wherein each software agent in the society of software agents is an autonomous software program or program component that is situated within, is aware of, and acts upon its environment in pursuit of its own objectives so as to affect its future environment.

22. A system for simulating interdependencies between multiple critical physical infrastructure models, comprising:
- a first infrastructure data model that models a first critical physical infrastructure, wherein at least a portion of the data of the first infrastructure data model has a geospatial relationship;
- a second infrastructure data model that models a second critical physical infrastructure, wherein the second critical physical infrastructure is a different critical physical infrastructure from the first critical physical infrastructure and wherein at least a portion of the data of the second infrastructure data model has a geospatial relationship;
- a simulation engine adapted to automatically produce a change in the second infrastructure data model in response to a change in the first infrastructure data model, wherein the simulation engine incorporates the geospatial relationship of the data of the first infrastructure data model and the geospatial relationship of the data of the second infrastructure data model in producing the change in the second infrastructure data model; and
- a user interface permitting a user to interact with the simulation engine.

* * * * *